(12) United States Patent
Kawashima

(10) Patent No.: US 7,845,063 B2
(45) Date of Patent: Dec. 7, 2010

(54) QUARTZ CRYSTAL UNIT AND METHOD FOR MANUFACTURING A QUARTZ CRYSTAL UNIT AND ELECTRONIC APPARATUS

(75) Inventor: Hirofumi Kawashima, Tokyo (JP)

(73) Assignee: Piedek Technical Laboratory (JP)

( * ) Notice: Subject to any disclaimer, the term of this patent is extended or adjusted under 35 U.S.C. 154(b) by 5 days.

(21) Appl. No.: 12/070,329

(22) Filed: Feb. 14, 2008

(65) Prior Publication Data

US 2008/0179998 A1 Jul. 31, 2008

Related U.S. Application Data

(63) Continuation-in-part of application No. 11/511,679, filed on Aug. 29, 2006, now Pat. No. 7,528,682, which is a continuation-in-part of application No. 11/301,530, filed on Dec. 13, 2005, now Pat. No. 7,412,764, which is a continuation-in-part of application No. 10/749,182, filed on Dec. 30, 2003, now Pat. No. 7,071,794, which is a continuation-in-part of application No. 10/378,719, filed on Mar. 4, 2003, now abandoned.

(30) Foreign Application Priority Data

Mar. 6, 2002 (JP) .............................. 2002-060827

(51) Int. Cl.
*H04R 31/00* (2006.01)

(52) U.S. Cl. .......................... 29/594; 29/609.1; 29/831; 29/834; 29/835; 216/13; 216/80; 216/97; 310/319; 310/370; 331/158; 331/176

(58) Field of Classification Search ................ 29/25.35, 29/594, 595, 609.1, 831, 834, 835; 310/319, 310/370; 216/13, 80, 97; 331/158, 176
See application file for complete search history.

(56) References Cited

U.S. PATENT DOCUMENTS 6,898,832 B2 * 5/2005 Kawashima ................ 29/25.35
6,915,548 B2 * 7/2005 Kawashima ................ 29/25.35
6,959,472 B2 * 11/2005 Kawashima ................ 29/25.35

* cited by examiner

*Primary Examiner*—Paul D Kim
(74) *Attorney, Agent, or Firm*—Adams & Wilks

(57) ABSTRACT

A method for manufacturing a quartz crystal unit comprises forming a quartz crystal tuning fork resonator that is capable of vibrating in a flexural mode of an inverse phase and that has a quartz crystal tuning fork base, and first and second quartz crystal tuning fork tines connected to the quartz crystal tuning fork base. An electrode is disposed on each of two of side surfaces of each of the first and second quartz crystal tuning fork tines so that the electrodes of the first quartz crystal tuning fork tine have an electrical polarity opposite to an electrical polarity of the electrodes of the second quartz crystal tuning fork tine, a motional capacitance $C_1$ of a fundamental mode of vibration of the quartz crystal tuning fork resonator being greater than a motional capacitance $C_2$ of a second overtone mode of vibration thereof.

35 Claims, 29 Drawing Sheets

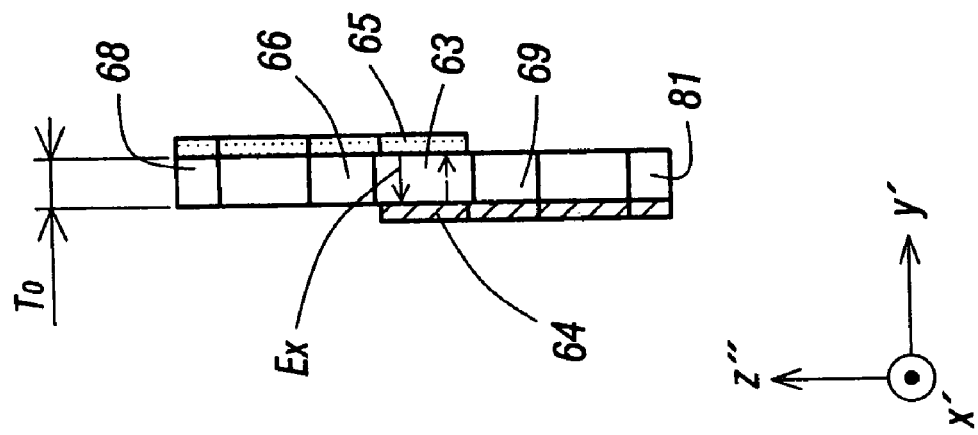
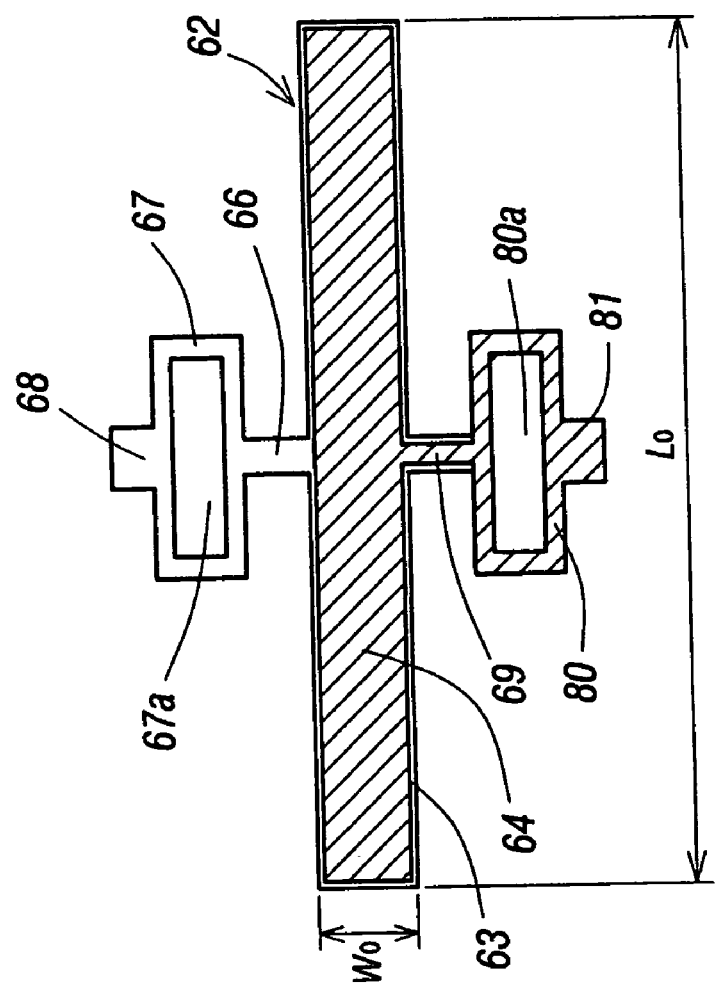

FIG. 19
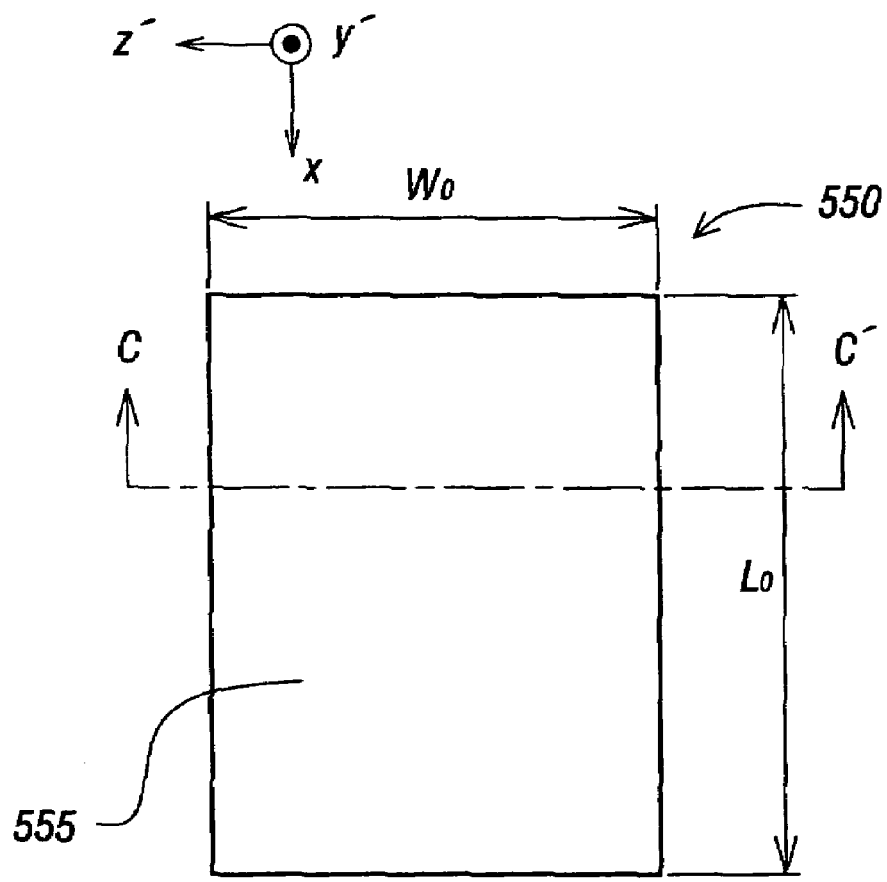
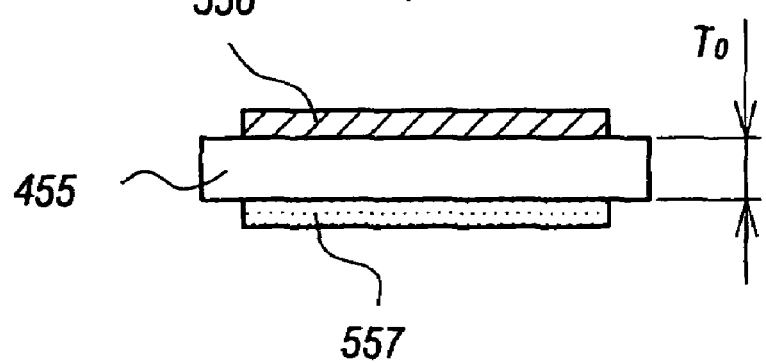

QUARTZ CRYSTAL UNIT AND METHOD FOR MANUFACTURING A QUARTZ CRYSTAL UNIT AND ELECTRONIC APPARATUS

CROSS REFERENCE TO RELATED APPLICATIONS

This application is a continuation-in-part of application Ser. No. 11/511,679 filed Aug. 29, 2006 and now U.S. Pat. No. 7,528,682, which is a continuation-in-part of application Ser. No. 11/301,530 filed Dec 13, 2005 and now U.S. Pat. No. 7,412,764, which is a continuation-in-part of application Ser. No. 10/749,182 filed Dec. 30, 2003 and now U.S. Pat. No. 7,071,794, which is a continuation-in-part of application Ser. No. 10/378,719 filed Mar. 4, 2003 and now abandoned.

BACKGROUND OF THE INVENTION

1. Field of the Invention

The present invention relates to a resonator, especially, a quartz crystal resonator, a quartz crystal unit having the quartz crystal resonator, a quartz crystal oscillator having the quartz crystal unit, an electronic apparatus comprising a display portion and the quartz crystal oscillator at least, and their manufacturing methods.

2. Background Information

There are many electronic apparatus comprising a display portion and a quartz crystal oscillator at least. For example, cellular phones, wristwatches, facsimiles and pagers comprising a quartz crystal oscillator are well known. Recently, because of high stability for frequency, miniaturization and the light weight nature of these electronic apparatus, the need for an electronic apparatus comprising a smaller quartz crystal oscillator with a high frequency stability has arisen. For example, the quartz crystal oscillator with a quartz crystal tuning fork resonator, which is capable of vibrating in a flexural mode, is widely used as a time standard in an electronic apparatus such as the cellular phones, the wristwatches, the facsimiles and the pagers. Similar to this, the same need has also arisen for an electronic apparatus comprising a length-extensional mode quartz crystal resonator with a frequency of 1 MHz to 10 MHz to decrease an electric current consumption of the electronic apparatus.

Heretofore, however, it has been impossible to obtain an electronic apparatus comprising a smaller quartz crystal oscillator with a conventional miniaturized quartz crystal tuning fork resonator, capable of vibrating in a flexural mode, and having a high frequency stability, a small series resistance and a high quality factor. When miniaturized, the conventional quartz crystal tuning fork resonator, capable of vibrating in a flexural mode, as shown in FIG. 12 (which has electrodes on the obverse faces 203, 207, reverse faces 204, 208 and the four sides 205, 206, 209, 210 of each tuning fork tine, as also shown in FIG. 13—a cross-sectional view of tuning fork tines of FIG. 12), it has a smaller electromechanical transformation efficiency because the resonator shape and the electrode construction provide a small electric field (i.e. Ex becomes small), as a result of which the resonator has a low frequency stability, a large series resistance and a reduced quality factor. In FIG. 12, a conventional tuning fork resonator 200 is shown with tines 201, 202 and a base 230.

Moreover, for example, Japanese Patent Nos. P56-65517 and P2000-223992A and International Patent No. WO 00/44092 were published and teach grooves and electrodes constructed at tuning fork tines of a flexural mode, tuning fork, quartz crystal resonator. However, they teach nothing about a quartz crystal oscillator of the present invention having novel shape, novel electrode construction and figure of merit M for a quartz crystal tuning fork resonator, capable of vibrating in a flexural mode and about a relationship of an amplification circuit and a feedback circuit which construct a quartz crystal oscillating circuit.

Additionally, for example, there has been a big problem in the conventional oscillator with the conventional quartz crystal tuning fork resonator, such that a fundamental mode vibration of the resonator jumps to a second overtone mode vibration by shock or vibration.

Similarly, however, it has been impossible to obtain an electronic apparatus comprising a smaller quartz crystal oscillator with a conventional length-extensional mode quartz crystal resonator, capable of vibrating in a length-extensional mode, and having a frequency of 1 MHz to 10 MHz, a small series resistance and a high quality factor. As an example of a length-extensional mode quartz crystal resonator of the prior art, the length-extensional mode resonator comprising a vibrational portion, connecting portions and supporting portions, which is formed from a Z plate perpendicular to z axis, is well known, and this resonator is formed integrally by a chemical etching process. Also, electrodes are disposed opposite each other on sides of the vibrational portion formed by the chemical etching process so that the electrodes disposed opposite each other are of opposite electrical polarity.

Also, a cutting angle of the conventional length-extensional mode quartz crystal resonator is generally within a range of ZYw(0° to +5°), according to an IEEE notation. In detail, the connecting portions are connected opposite each other at both end portions of a width of the vibrational portion and at a central portion of the length direction thereof. Namely, the direction of the connecting portions constructed opposite each other corresponds to the direction of the electric field.

When an alternating current (AC) voltage is applied between the electrodes, an electric field occurs alternately in the width direction, as a result, the resonator is capable of vibrating in the length direction, but the electric field of between the electrodes becomes very small because quartz crystal is an anisotropic material and the sides of the vibrational portion have a complicated shape formed by the chemical etching process. Namely, the resonator has small electromechanical transformation efficiency because the resonator's shape and the electrode construction provide a small electric field, consequently, the resonator has a low frequency stability, a large series resistance and a reduced quality factor when it has the frequency of 1 MHz to 10 MHz.

It is, therefore, a general object of the present invention to provide embodiments of an electronic apparatus and a quartz crystal oscillator, which constructs an electronic apparatus of the present invention, comprising a quartz crystal oscillating circuit with a flexural mode, quartz crystal tuning fork resonator, capable of vibrating in a fundamental mode, and having a high frequency stability, a small series resistance and a high quality factor, or embodiments of a quartz crystal oscillator, which also constructs an electronic apparatus of the present invention, comprising a quartz crystal oscillating circuit with a length-extensional mode quartz crystal resonator having a frequency of 1 MHz to 10 MHz, a small series resistance and a high quality factor, which overcome or at least mitigate one or more of the above problems.

SUMMARY OF THE INVENTION

The present invention relates to a resonator, especially, a quartz crystal resonator, a quartz crystal unit having the quartz crystal resonator, a quartz crystal oscillator having the quartz crystal unit, and an electronic apparatus comprising a display portion and the quartz crystal oscillator at least, and their manufacturing methods, and more especially relates to the quartz crystal resonator which is a quartz crystal tuning fork resonator capable of vibrating in a flexural mode of an inverse phase, and having a groove and/or a through-hole at tuning fork tines, the quartz crystal unit having the quartz crystal tuning fork resonator, and the quartz crystal oscillator having the quartz crystal unit. In detail, the quartz crystal oscillator comprises a quartz crystal oscillating circuit having an amplification circuit and a feedback circuit, and in particular, relates to a quartz crystal oscillator having a flexural mode, quartz crystal tuning fork resonator capable of vibrating in a fundamental mode and having an output signal of a high frequency stability for the fundamental mode vibration of the resonator, and also to a quartz crystal oscillator having a suppressed second overtone mode vibration of the flexural mode, quartz crystal tuning fork resonator, in addition, relates to a quartz crystal oscillator comprising a length-extensional mode quartz crystal resonator. The quartz crystal oscillators are, therefore, available for the electronic apparatus requiring miniaturized and low priced quartz crystal oscillators with high time accuracy and shock proof.

It is an object of the present invention to provide an electronic apparatus comprising a quartz crystal oscillator with a miniature quartz crystal tuning fork resonator, capable of vibrating in a flexural mode, and having a high frequency stability, a small series resistance $R_1$ and a high quality factor $Q_1$, whose nominal frequency for a fundamental mode vibration is within a range of 10 kHz to 200 kHz.

It is an another object of the present invention to provide an electronic apparatus comprising a quartz crystal oscillator with a flexural mode, quartz crystal tuning fork resonator, capable of vibrating in a fundamental mode, and having a high frequency stability which gives a high time accuracy.

It is a further object of the present invention to provide an electronic apparatus comprising a quartz crystal oscillator with a length-extensional mode quartz crystal resonator.

According to one aspect of the present invention, there is provided an electronic apparatus comprising a display portion and a quartz crystal oscillator at least, and said electronic apparatus having one quartz crystal oscillator, said one quartz crystal oscillator comprising: a quartz crystal oscillating circuit comprising; an amplification circuit comprising an amplifier at least and a feedback circuit comprising a quartz crystal resonator and capacitors at least, said quartz crystal resonator being a quartz crystal tuning fork resonator, capable of vibrating in a flexural mode, and said quartz crystal tuning fork resonator comprising: tuning fork tines each of which has a length, a width and a thickness and the length greater than the width and the thickness; and a tuning fork base; said tuning fork tines and said tuning fork base that are formed integrally; and electrodes disposed facing each other on sides of said tuning fork tines so that the electrodes disposed facing each other are of opposite electrical polarity and said tuning fork tines are capable of vibrating in inverse phase, According to a second aspect of the present invention there is provided an electronic apparatus comprising a display portion and a quartz crystal oscillator at least, and said electronic apparatus comprises at least one quartz crystal oscillator comprising: an oscillating circuit comprising; an amplification circuit comprising an amplifier at least, and a feedback circuit comprising a length-extensional mode quartz crystal resonator which is one of a contour mode quartz crystal resonator.

According to a third aspect of the present invention, there is provided a method for manufacturing an electronic apparatus comprising a display portion and a quartz crystal oscillator at least, and said electronic apparatus comprising at least one quartz crystal oscillator, said at least one oscillator comprising: a quartz crystal oscillating circuit comprising; an amplification circuit comprising an amplifier at least, and a feedback circuit comprising a quartz crystal resonator and capacitors at least, said quartz crystal resonator being a quartz crystal tuning fork resonator, capable of vibrating in a flexural mode, said quartz crystal tuning fork resonator comprising the steps of: forming integrally tuning fork tines each of which has a length, a width and a thickness and the length greater than the width and the thickness and a tuning fork base; disposing electrodes facing each other on sides of said tuning fork tines so that the electrodes disposed facing each other are of opposite electrical polarity and said tuning fork tines vibrate an in inverse phase; and adjusting resonance frequency of said quartz crystal tuning fork resonator after mounting it at a mounting portion by conductive adhesives or solder so that a frequency deviation is within a range of −100 PPM to +100 PPM.

According to a fourth aspect of the present invention, there are provided a quartz crystal resonator, a quartz crystal unit and a quartz crystal oscillator, each of which has a piezoelectric constant $e_{12}$ that is within a range of 0.095 C/m$^2$ to 0.19 C/m$^2$.

Preferably, said tuning fork resonator is constructed so that figure of merit $M_1$ of a fundamental mode vibration is larger than figure of merit $M_2$ of a second overtone mode vibration.

Preferably, the quartz crystal oscillator with said tuning fork resonator is constructed so that a ratio of an amplification rate $\alpha_1$ of the fundamental mode vibration and an amplification rate $\alpha_2$ of the second overtone mode vibration of said amplification circuit is larger than that of a feedback rate $\beta_2$ of the second overtone mode vibration and a feedback rate $\beta_1$ of the fundamental mode vibration of said feedback circuit, and a product of the amplification rate $\alpha_1$ and the feedback rate $\beta_1$ of the fundamental mode vibration is larger than 1.

Preferably, the quartz crystal oscillator with said tuning fork resonator is constructed so that a ratio of an absolute value of negative resistance, $|-RL_1|$ of the fundamental mode vibration of said amplification circuit and series resistance $R_1$ of the fundamental mode vibration is larger than that of an absolute value of negative resistance, $|-RL_2|$ of the second overtone mode vibration of said amplification circuit and series resistance $R_2$ of the second overtone mode vibration.

Preferably, the length-extensional mode quartz crystal resonator comprises a vibrational portion, connecting portions and supporting portions, which are formed integrally by a particle method.

The present invention will be more fully understood by referring to the following detailed specification and claims taken in connection with the appended drawings.

BRIEF DESCRIPTION OF THE DRAWINGS

FIG. 8a and FIG. 8b show a top view and a side view of a length-extensional mode quartz crystal resonator constructing a quartz crystal oscillator, which constructs an electronic apparatus of the third embodiment of the present invention;

FIG. 19 shows a top view (a) and a C-C' cross-sectional view (b) of a vibrational portion of a thickness shear mode quartz crystal resonator constructing a quartz crystal unit, and which constructs an electronic apparatus of the present invention.

DETAILED DESCRIPTION OF THE PREFERRED EMBODIMENTS

Figure 1:
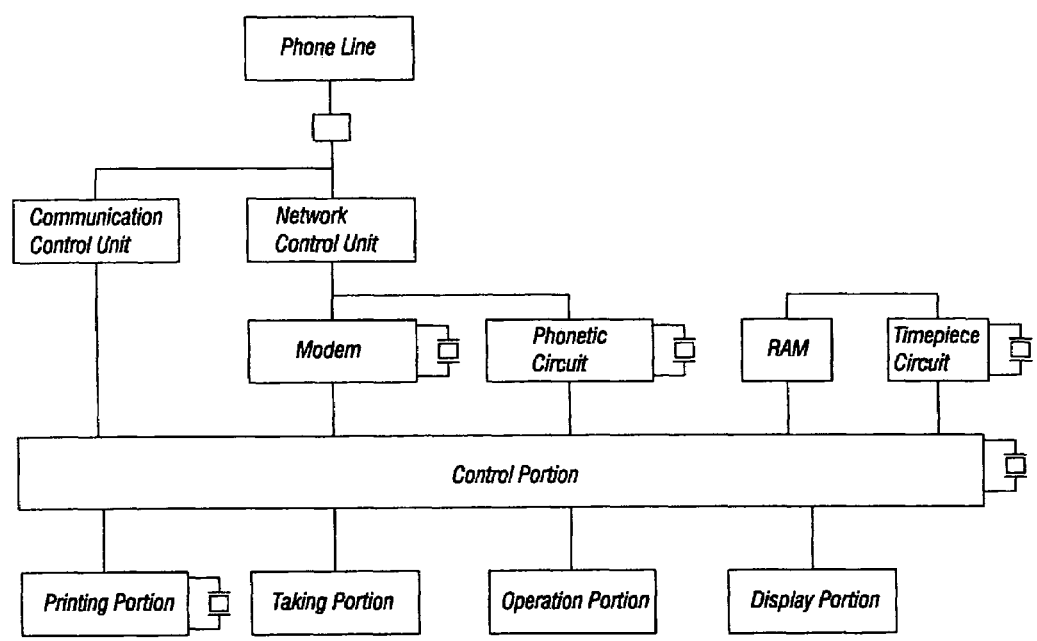
FIG. 1 shows a block diagram of an embodiment of an electronic apparatus of the present invention, and illustrating the diagram of a facsimile apparatus.

Referring now to the drawings, the embodiments of the present invention will be described in more detail.

FIG. 1 shows a block diagram of an embodiment of an electronic apparatus of the present invention, and illustrating the diagram of a facsimile apparatus. As is shown in FIG. 1, the apparatus generally comprises a modem, a phonetic circuit, a timepiece circuit, a printing portion, a taking portion, an operation portion and a display portion. In this principle, perception and scanning of reflection light of light projected on manuscript in the taking portion are performed by CCD (Charge Coupled Device), in addition, light and shade of the reflection light are transformed into a digital signal, and the signal is modulated by the modem and is sent to a phone line(Communication line). Also, in a receiving side, a received signal is demodulated by the modem and is printed on a paper in the print portion by synchronizing the received signal with a signal of a sending side. In addition, the display portion comprises at least one of a liquid crystal display (LCD) portion, a plasma display panel (PDP) portion, a surface-conduction electron-emitter display (SED) portion and an organic electroluminescence display (OED) portion.

As shown in FIG. 1, a resonator, for example, a quartz crystal resonator which is one of piezoelectric resonators made of piezoelectric materials is used as a CPU clock of the control portion and the printing portion, as a clock of the phonetic circuit and the modem, and as a time standard of the timepiece. Namely, the quartz crystal resonator is used to construct a quartz crystal oscillator comprising a quartz crystal oscillating circuit having the quartz crystal resonator and an output signal of the quartz crystal oscillator is used. For example, it is used as a signal, namely, as a clock signal to display time at the display portion. In this case, to get the signal a resonator capable of vibrating in a flexural mode, e.g. a quartz crystal tuning fork resonator, capable of vibrating in a flexural mode is used, and e.g. as the CPU clock, a contour mode quartz crystal resonator such as a length-extensional mode quartz crystal resonator or a thickness shear mode quartz crystal resonator is used. In order to get the facsimile apparatus of this embodiment which operates normally, an accuracy output signal of the oscillator is required for the facsimile apparatus, which is one of the electronic apparatus of the present invention. Also, a digital display and an analogue display are included in the display of the present invention. In this embodiment, two quartz crystal resonators each of which vibrates in a different mode are used in the electronic apparatus of the present invention. But, the present invention is not limited to this, two quartz crystal resonators each of which vibrates in the same mode may be used in the electronic apparatus of the present invention. In other words, each of two resonators vibrates in a thickness shear mode or in a flexural mode, for example, when each of the two resonators is made of quartz crystal, each of the two quartz crystal resonators vibrates in a thickness shear mode or in a flexural mode. Namely, one of the two quartz crystal resonators is used as a signal for use in operation of the electronic apparatus to display time information at the display portion of the electronic apparatus. One of the two quartz crystal resonators used as the signal for use in operation of the electronic apparatus to display time information at the display portion has a frequency of oscillation of a fundamental mode of vibration. In more detail, a resonator has a fundamental mode of vibration and an overtone mode of vibration. It is needless to say that the fundamental mode of vibration and the overtone mode of vibration thereof are defined as the same mode of vibration. For example, when a thickness shear mode quartz crystal resonator has a fundamental mode of vibration and a third overtone mode of vibration, the fundamental mode of vibration of the thickness shear mode quartz crystal resonator is the same mode of vibration as the third overtone mode of vibration thereof. In stead of the quartz crystal, such a piezoelectric material may be used as $LiTaO_3$, $LiNbO_3$, $GaPO_4$, and so on. Namely, though the quartz crystal is used as a material of the resonators in this embodiment, it is needless to say that the resonators of this invention may be made of any material. Therefore, a resonator capable of vibrating in a flexural mode, made of a material may be used as at least one of the CPU clock and the time standard of the timepiece of the facsimile apparatus in this embodiment. As is shown in FIG. 1, a plurality of resonators comprising first, second, third, fourth and fifth resonators each of which is used to construct an oscillator having an oscillating circuit, are used for the facsimile in this embodiment of the electronic apparatus of the present invention. In addition, if need arises, an oscillation frequency of an output signal output from the oscillating circuit through a buffer circuit changes to at least one desired oscillation frequency by using a divider (a dividing circuit) or by using a PLL (Phase Locked Loop) circuit, and the at least one desired oscillation frequency is used as a signal, namely, as a clock signal for use in operation of the electronic apparatus of the present invention. For example, the signal is used to operate the CPU of the electronic apparatus or the signal is used to display time information at the display portion of the electronic apparatus. In addition, the at least one desired oscillation frequency comprises a plurality of different oscillation frequencies to get a small-sized oscillator of a low cost, e.g. three different oscillation frequencies, one of which comprises a first oscillation frequency of a first output signal output from the oscillating circuit through the buffer circuit, the first oscillation frequency is the same as the oscillation frequency of the oscillating circuit, one of which comprises a second oscillation frequency of a second output signal output from the oscillating circuit through the buffer circuit and the dividing circuit, and one of which comprises a third oscillation frequency of a third output signal output from the oscillating circuit through the buffer circuit and the PLL circuit.

In this embodiment, though the facsimile apparatus is shown as an example of an electronic apparatus, the present invention is not limited to this, namely, the present invention includes all electronic apparatus, each of which comprises an oscillator, e.g. a quartz crystal oscillator and a display portion at least, for example, cellar phones, telephones, a TV set, cameras, a video set, video cameras, pagers, personal computers, printers, CD players, MD players, electronic musical instruments, car navigators, car electronics, timepieces, IC cards and so forth. In other words, this invention includes electronic apparatuses comprising two of the cellar phones, the telephones, the TV set, the cameras, the video set, the video cameras, the pagers, the personal computers, the printers, the CD players, the MD players, the electronic musical instruments, the car navigators, the car electronics, the timepieces, the IC cards and so forth, and the two is connected electrically each other. For example, one of the personal computer, the camera and the video camera is electrically connected to the printer, and an output signal of the corresponding one of the personal computer, the camera and the video camera is a clock signal for use in operation of the printer. In addition, the electronic apparatus of the present invention may comprise a battery (cell), e.g. a lithium battery or a fuel cell which is housed in the electronic apparatus of the present invention. In particular, the fuel cell may be used to charge a battery housed in the electronic apparatus of the present invention through a connecting terminal.

Figure 2:
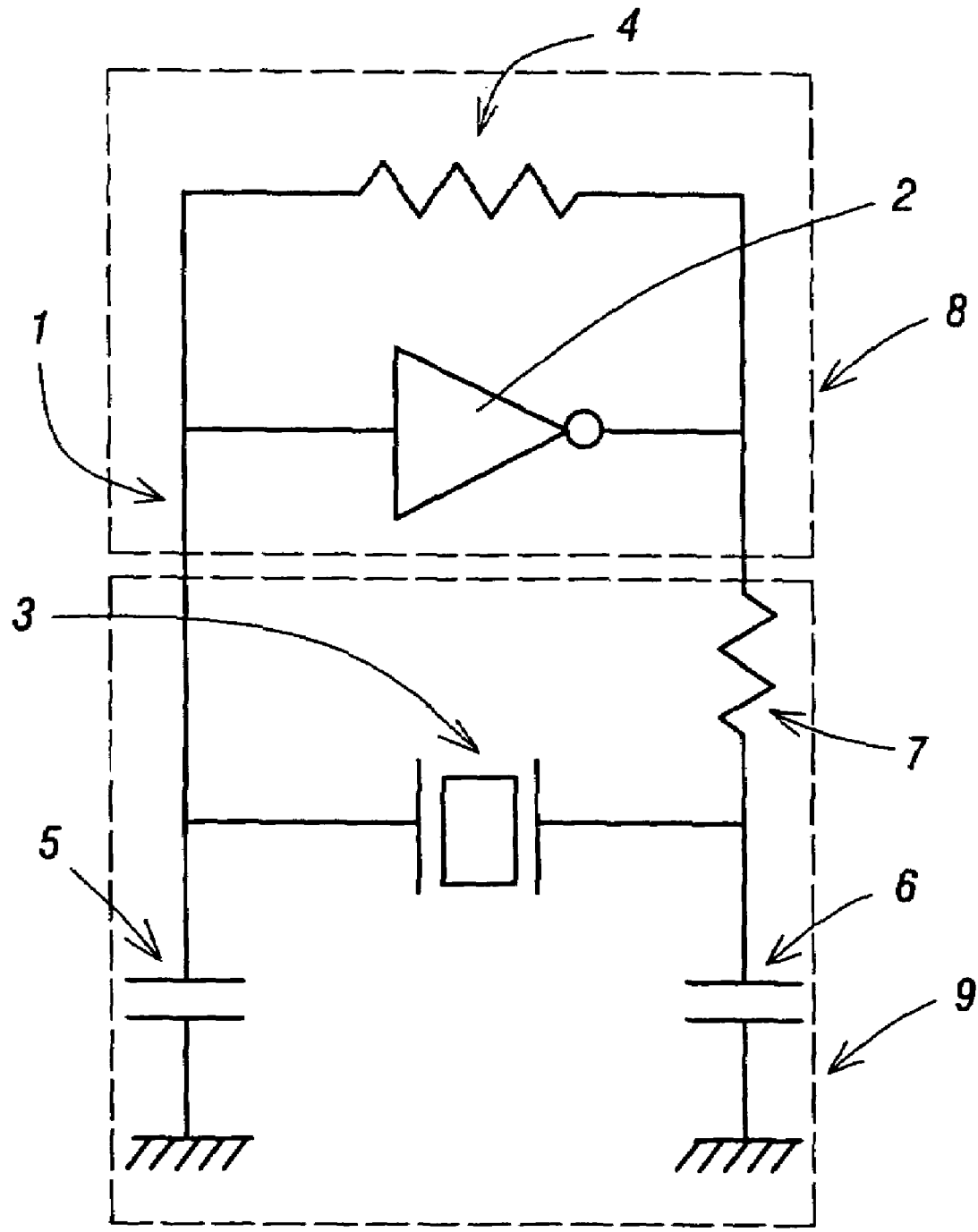
FIG. 2 shows a diagram of an embodiment of a quartz crystal oscillating circuit constructing a quartz crystal oscillator, which constructs an electronic apparatus of the present invention.

FIG. 2 shows a diagram of an embodiment of a quartz crystal oscillating circuit constructing a quartz crystal oscillator, which constructs an electronic apparatus of the present invention. The quartz crystal oscillating circuit 1 comprises an amplifier (CMOS Inverter) 2, a feedback resistor 4, a drain resistor 7, capacitors 5, 6 and a flexural mode, quartz crystal tuning fork resonator 3. Namely, the oscillating circuit 1 comprises an amplification circuit 8 having the amplifier 2 and the feedback resistor 4, and a feedback circuit 9 having the drain resistor 7, the capacitors 5, 6 and the quartz crystal tuning fork resonator 3. In addition, an output signal of the oscillating circuit 1 comprising the quartz crystal tuning fork resonator 3, capable of vibrating in a fundamental mode, is outputted through a buffer circuit (not shown in FIG. 2).

In detail, an oscillation frequency of the fundamental mode vibration is outputted through a buffer circuit as an output signal. According to the present invention, a nominal frequency of the fundamental mode vibration of the resonator is within a range of 10 kHz to 200 kHz. Especially, 32.768 kHz is an important frequency. In general, the output signal has an oscillation frequency which is within a range of −100 PPM to +100 PPM to the nominal frequency, e.g. 32.768 kHz. In more detail, the quartz crystal oscillator in this embodiment comprises a quartz crystal oscillating circuit and a buffer circuit, namely, the quartz crystal oscillating circuit comprises an amplification circuit and a feedback circuit, and the amplification circuit comprises an amplifier and a feedback resistor, and the feedback circuit comprises a flexural mode, quartz crystal tuning fork resonator, a drain resistor and capacitors. Also, flexural mode, quartz crystal tuning fork resonators which are used in a quartz crystal oscillator will be described in FIG. 4-FIG. 7 in detail. Instead of the flexural mode, quartz crystal tuning fork resonator, a contour mode resonator such as a length-extensional mode quartz crystal resonator, a width-extensional mode quartz crystal resonator and a Lame mode quartz crystal resonator or a thickness shear mode quartz crystal resonator or a flexural mode resonator capable of vibrating in a flexural mode may be used.

Figure 3:
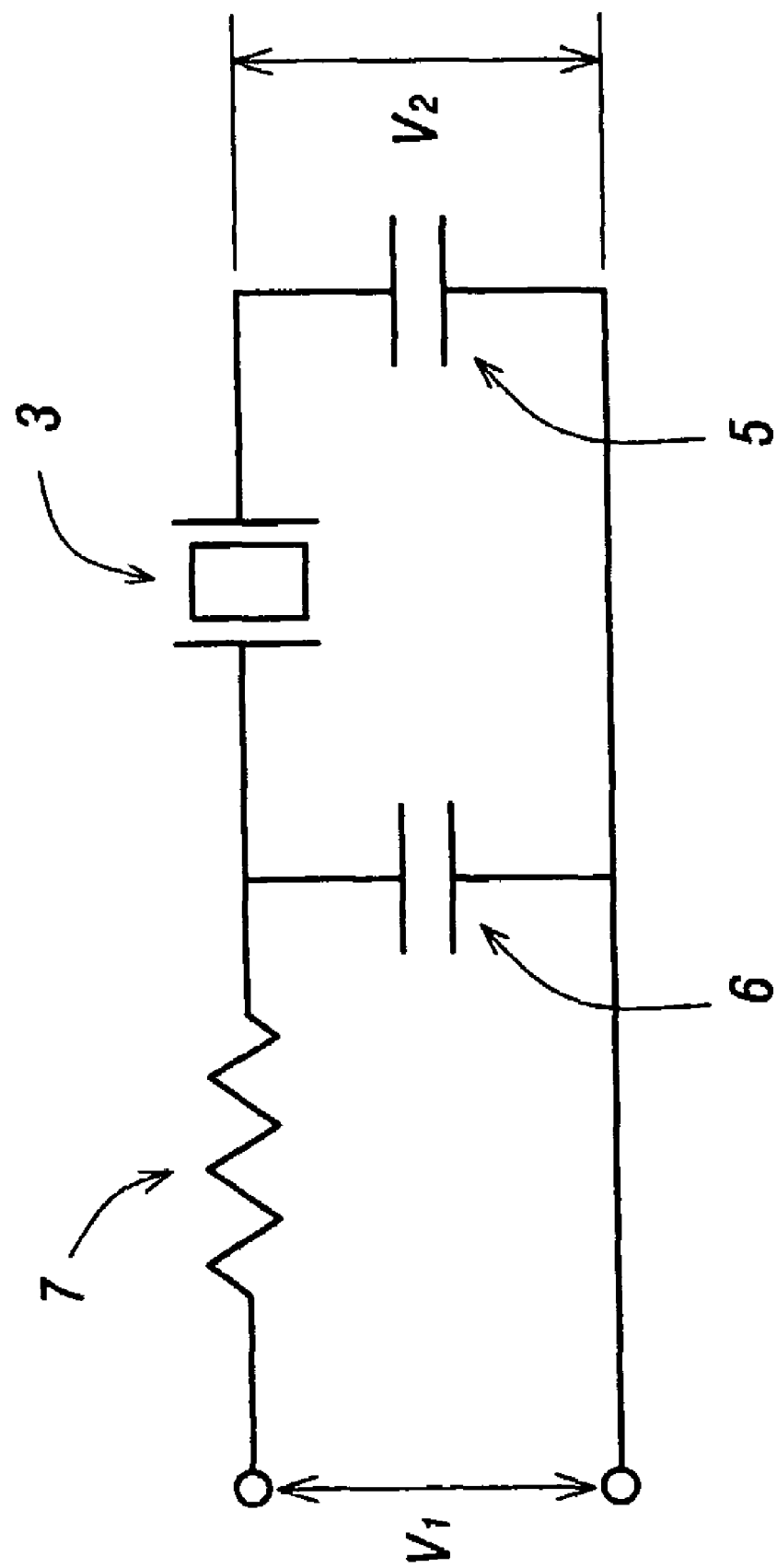
FIG. 3 shows a diagram of the feedback circuit of FIG. 2.

FIG. 3 shows a diagram of the feedback circuit of FIG. 2. Now, when angular frequency $\omega_i$ of the flexural mode, quartz crystal tuning fork resonator 3, capable of vibrating in a flexural mode, a resistance $R_d$ of the drain resistor 7, capacitance $C_g$, $C_d$ of the capacitors 5, 6, crystal impedance $R_{ei}$ of the quartz crystal resonator 3, an input voltage $V_1$, and an output voltage $V_2$ are taken, a feedback rate $\beta_i$ is defined by $\beta_i=|V_2|_i/|V_1|_i$, where i shows vibration order, for example, when i=1 and 2, they are for a fundamental mode vibration and a second overtone mode vibration.

In addition, load capacitance $C_L$ is given by $C_L=C_g C_d/(C_g+C_d)$, and when $C_g=C_d=C_{gd}$ and $Rd>>R_{ei}$, the feedback rate $\beta_i$ is given by $\beta_i=1/(1+kC_L^2)$, where k is expressed by a function of $\omega_i$, $R_d$ and $R_{ei}$. Also, $R_{ei}$ is approximately equal to series resistance $R_i$.

Thus, it is easily understood from a relationship of the feedback rate $\beta_i$ and load capacitance $C_L$ that the feedback rate of resonance frequency for a fundamental mode vibration and an overtone mode vibration becomes large, respectively, according to decrease of load capacitance $C_L$. Therefore, when $C_L$ has a small value, an oscillation of the overtone mode occurs very easily, instead of that of the fundamental mode. This is the reason why the maximum amplitude of the overtone mode vibration becomes smaller than that of the fundamental mode vibration, and the oscillation of the overtone mode satisfies an amplitude condition and a phase condition simultaneously which are the continuous condition of an oscillation in an oscillating circuit.

As it is also one object of the present invention to provide a quartz crystal oscillator having a flexural mode, quartz crystal tuning fork resonator, capable of vibrating in a fundamental mode and having a high frequency stability (high time accuracy) of an output signal, and having reduced electric current consumption, in this embodiment, load capacitance $C_L$ is less than 25 pF to reduce electric current consumption. To get much reduced electric current consumption, $C_L$ is preferably less than 15 pF because electric current consumption is proportional to $C_L$.

In addition, in order to suppress a second overtone mode vibration and to obtain a quartz crystal oscillator having an output signal of an oscillation frequency of a fundamental mode vibration, the quartz crystal oscillator in this embodiment is constructed so that it satisfies a relationship of $\alpha_1/\alpha_2>\beta_2/\beta_1$ and $\alpha_1\beta_1>1$, where $\alpha_1$ and $\alpha_2$ are, respectively, an amplification rate of the fundamental mode vibration and the second overtone mode vibration of an amplification circuit, and $\beta_1$ and $\beta_2$ are, respectively, a feedback rate of the fundamental mode vibration and the second overtone mode vibration of a feedback circuit.

In other words, the quartz crystal oscillator is constructed so that a ratio of the amplification rate $\alpha_1$ of the fundamental mode vibration and the amplification rate $\alpha_2$ of the second overtone mode vibration of the amplification circuit is larger than that of the feedback rate $\beta_2$ of the second overtone mode vibration and the feedback rate $\beta_1$ of the fundamental mode vibration of the feedback circuit, and also a product of the amplification rate $\alpha_1$ and the feedback rate $\beta_1$ of the fundamental mode vibration is larger than 1. A description of the high frequency stability will be performed later.

Also, characteristics of the amplifier of the amplification circuit constructing the quartz crystal oscillating circuit of this embodiment can be expressed by negative resistance $-RL_i$. For example, when i=1, negative resistance $-RL_1$ is for a fundamental mode vibration and when i=2, negative resistance $-RL_2$ is for a second overtone mode vibration. In this embodiment, the quartz crystal oscillating circuit is constructed so that a ratio of an absolute value of negative resistance, $|-RL_1|$ of the fundamental mode vibration of the amplification circuit and series resistance $R_1$ of the fundamental mode vibration is larger than that of an absolute value of negative resistance, $|-RL_2|$ of the second overtone mode vibration of the amplification circuit and series resistance $R_2$ of the second overtone mode vibration. That is to say, the oscillating circuit is constructed so that it satisfies a relationship of $|-RL_1|/R_1>|-RL_2|/R_2$. By constructing the oscillating circuit like this, an oscillation of the second overtone mode can be suppressed, as a result of which an output signal of a frequency of the fundamental mode vibration can be provided because an oscillation of the fundamental mode generates easily in the oscillating circuit.

Figure 4:
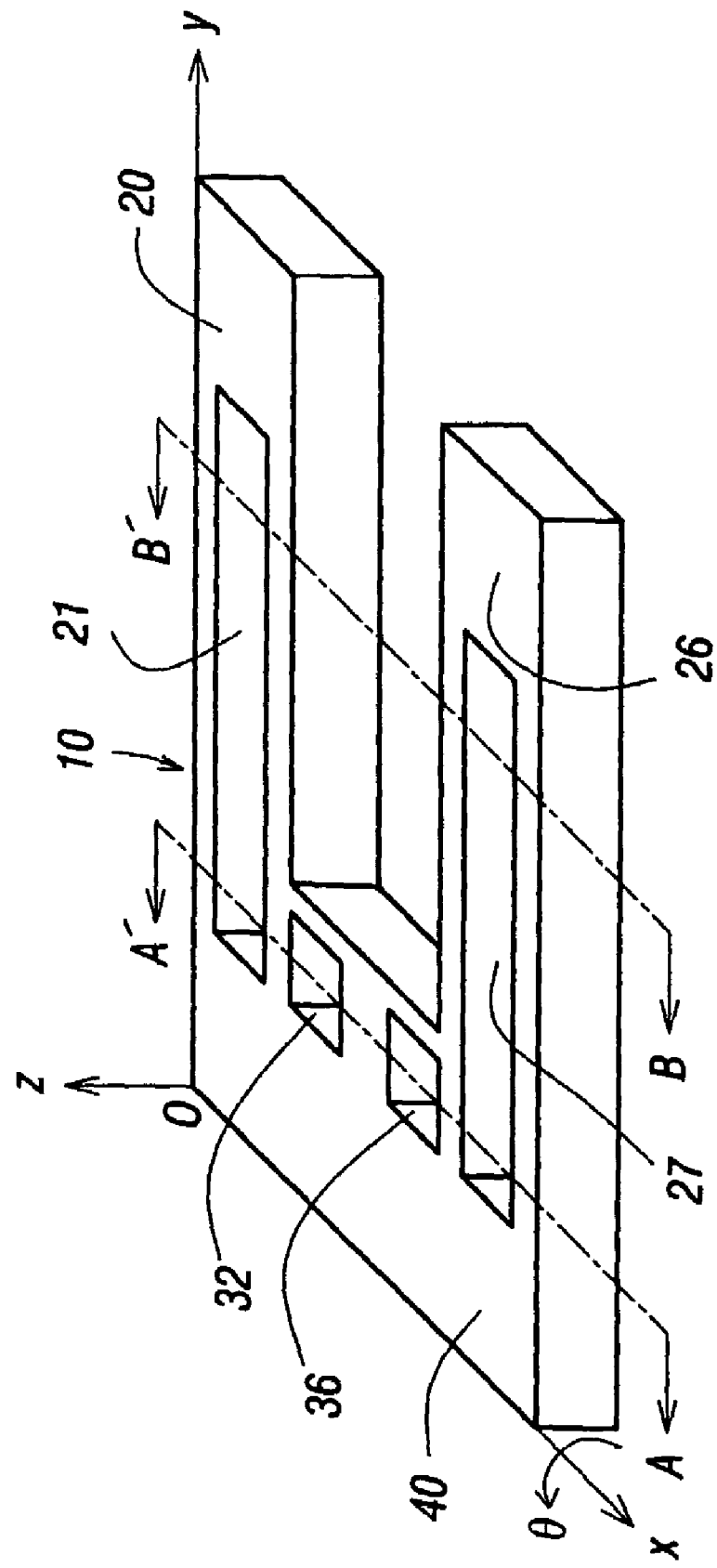
FIG. 4 shows a general view of a flexural mode, quartz crystal tuning fork resonator constructing a quartz crystal oscillator, which constructs an electronic apparatus of the first embodiment of the present invention.

FIG. 4 shows a general view of a flexural mode, quartz crystal tuning fork resonator 10 which is one of a contour mode resonator, constructing a quartz crystal oscillator, which constructs an electronic apparatus of the first embodiment of the present invention and its coordinate system o-xyz. A cut angle θ which has a typical value of 0° to 10° is rotated from a Z-plate perpendicular to the z axis about the x axis. Namely, the flexural mode, quartz crystal tuning fork resonator has the cut angle of ZYw(0° to 10°) according to an expression of the IEEE notation. The resonator 10 comprises two tuning fork tines (vibrating tines) 20 and 26 and a tuning fork base (a base) 40. The tines 20 and 26 have grooves 21 and 27 respectively, with the grooves 21 and 27 extending into the base 40. Also, the base 40 has the additional grooves 32 and 36. In addition, the tines 20 and 26 vibrate in a flexural mode of a fundamental mode and an inverse phase. As is shown in FIG. 4, each of the grooves 21 and 27 has a first stepped portion and a second stepped portion opposite the first stepped portion in the width direction, and a third stepped portion connecting the first stepped portion to the second stepped portion.

Figure 5:
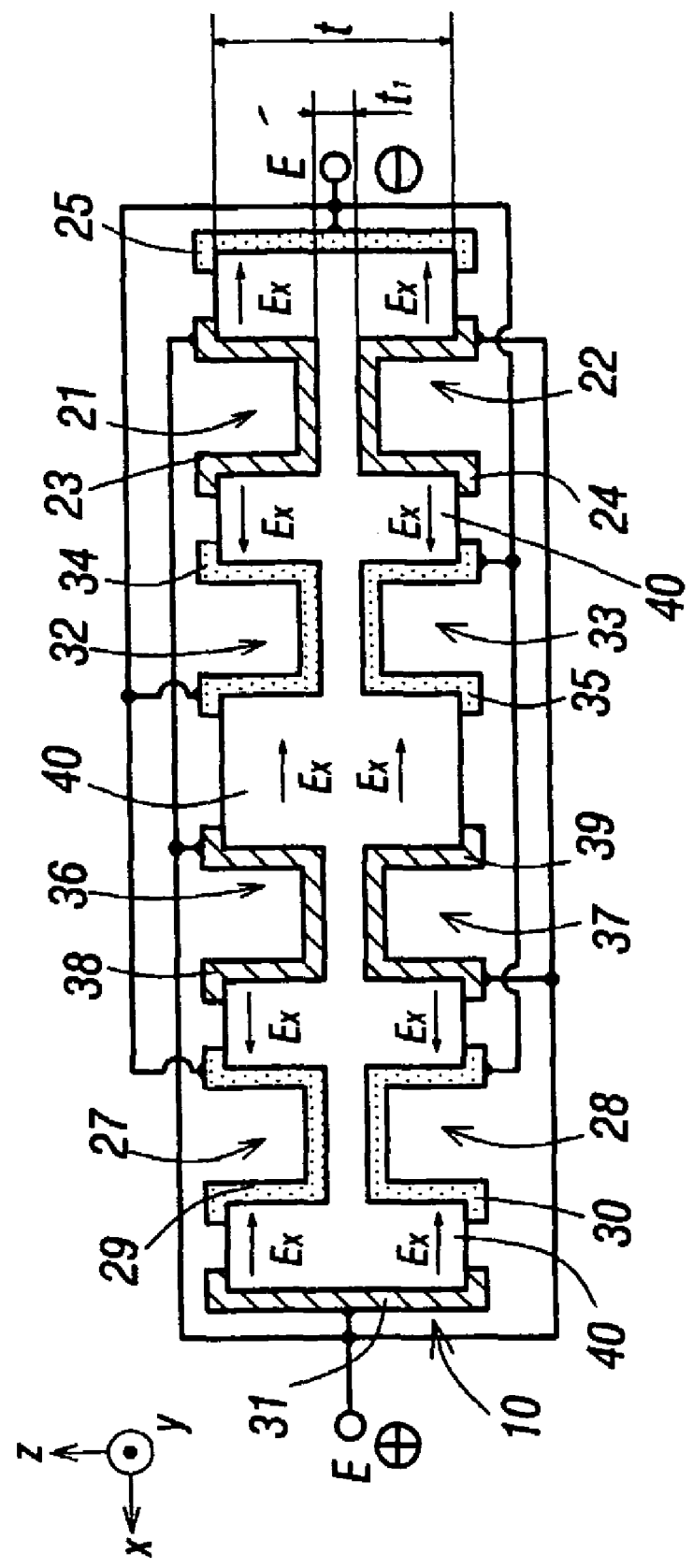
FIG. 5 shows a A-A' cross-sectional view of the tuning fork base of FIG. 4, and illustrating electrode construction.

FIG. 5 shows an A-A' cross-sectional view of the tuning fork base 40 of the quartz crystal resonator 10 in FIG. 4. In FIG. 5, the shape of the electrode construction within the base 40 for the quartz crystal resonator of FIG. 4 is described in detail. The section of the base 40 which couples to the tine 20 has the grooves 21 and 22 cut into the obverse and reverse faces of the base 40. Also, the section of the base 40 which couples to the tine 26 has the grooves 27 and 28 cut into the obverse and reverse faces of the base 40. In addition to these grooves, the base 40 has the grooves 32 and 36 cut between the grooves 21 and 27, and also, the base 40 has the grooves 33 and 37 cut between the grooves 22 and 28. Similar to the grooves 21, 27, it is needless to say that each of the grooves 22, 28 also has a first stepped portion and a second stepped portion opposite the first stepped portion in the width direction, and a third stepped portion connecting the first stepped portion to the second stepped portion.

Furthermore, the grooves 21 and 22 have the first electrodes 23 and 24 both of the same electrical polarity, the grooves 32 and 33 have the second electrodes 34 and 35 both of the same electrical polarity, the grooves 36 and 37 have the third electrodes 38 and 39 both of the same electrical polarity, the grooves 27 and 28 have the fourth electrodes 29 and 30 both of same electrical polarity and the sides of the base 40 have the fifth and sixth electrodes 25 and 31, each of opposite electrical polarity. In more detail, the fifth, fourth, and second electrodes 25, 29, 30, 34 and 35 have the same electrical polarity, while the first, sixth and third electrodes 23, 24, 31, 38 and 39 have the opposite electrical polarity to the others.

Two electrode terminals E and E' are constructed. That is, the electrodes disposed inside the grooves constructed opposite each other in the thickness (z axis) direction have the same electrical polarity. Also, the electrodes disposed opposite each other across adjoining grooves have opposite electrical polarity.

Figure 14:
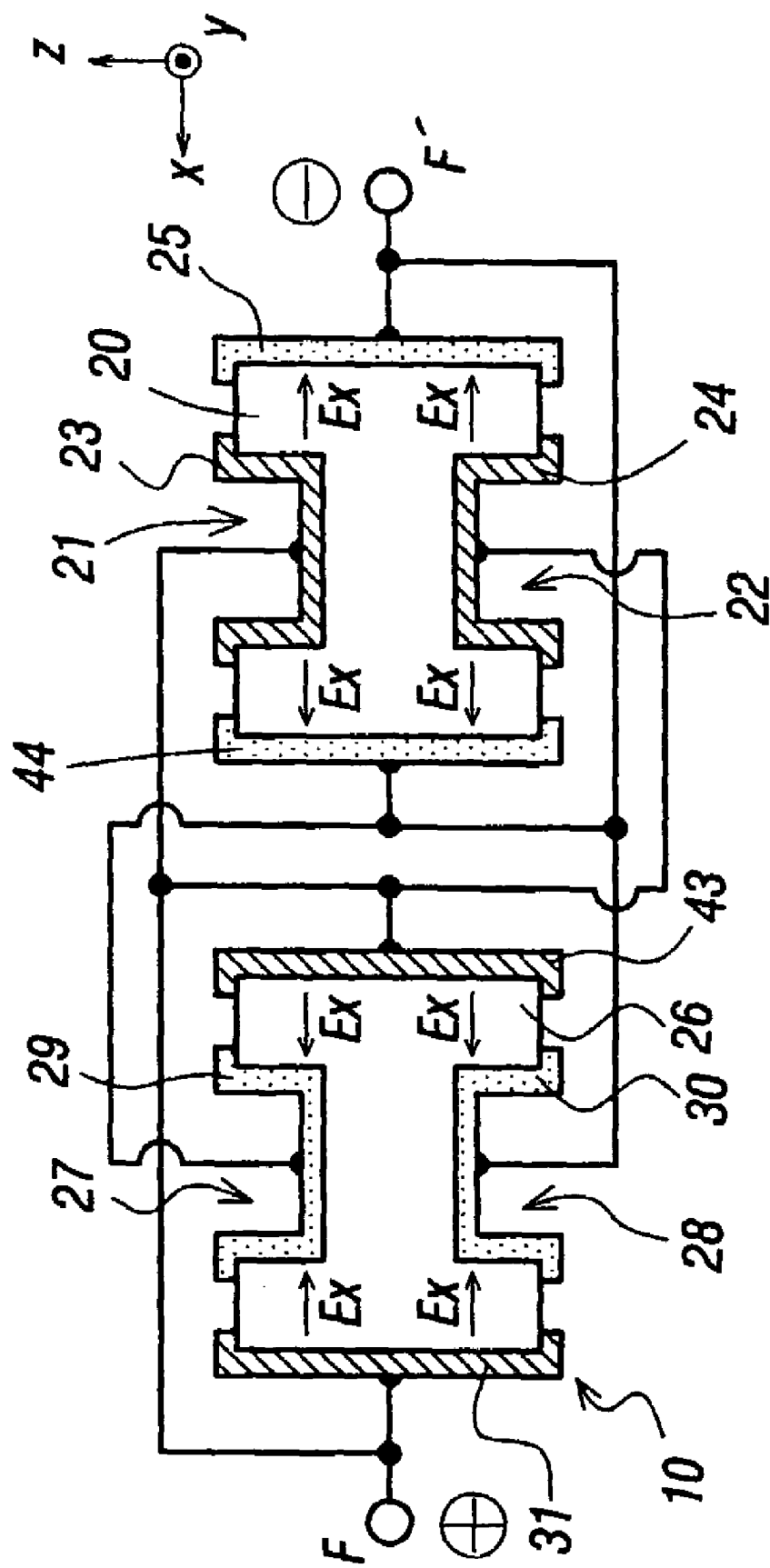
FIG. 14 shows a B-B' cross-sectional view of the tuning fork tines of FIG. 4.

In addition, the resonator has a thickness t of the tines or the tines and the base, and a groove thickness to. It is needless to say that the electrodes are disposed inside the grooves and on the sides of the tines. In this embodiment, the first electrodes 23 and 24 are disposed at the tine and the base, and also, the fourth electrodes 29 and 30 are disposed at the tine and the base. In addition, the electrodes are disposed on the sides of the tines opposite each other to the electrodes disposed inside the grooves. Namely, the electrodes are disposed opposite each other inside the grooves and on the sides of the tines so that the electrodes disposed opposite each other are of opposite electrical polarity. Additionally, electrodes are disposed facing each other on the sides of the tines so that the electrodes disposed facing each other are of opposite electrical polarity, and the tines are capable of vibrating in inverse phase. In more detail, a first tuning fork tine and a second tuning fork tine, and a tuning fork base are formed integrally, an electrode is disposed on both sides of the first tine and the second tine so that the electrodes disposed (facing each other) on inner sides of the first and second tines are of opposite electrical polarity. Therefore, the disposition of the electrodes disposed inside the grooves and on the sides of the tuning fork tines, described above is the same as that of the electrodes shown in FIG. 14 which shows a B-B' cross-sectional view of the tuning fork tines 20, 26 of the quartz crystal resonator 10 in FIG. 4, namely, the electrodes 23, 24 are connected to the electrodes 31, 43 to define an electrode terminal F, while the electrodes 29, 30 are connected to the electrodes 25, 44 to define an electrode terminal F'. It is needless to say that the electrode terminal F is electrically connected to the electrode terminal E and the electrode terminal F' is electrically connected to the electrode terminal E'.

When a direct current voltage is applied between the electrode terminals E and E' (E terminal: plus, E' terminal: minus), an electric field $E_x$ occurs in the arrow direction as shown in FIG. 5. As the electric field $E_x$ occurs perpendicular to the electrodes disposed on the base, the electric field $E_x$ has a very large value and a large distortion occurs at the base, so that the quartz crystal tuning fork resonator is obtained with a small series resistance $R_1$ and a high quality factor $Q_1$, even if it is miniaturized.

Figure 6:
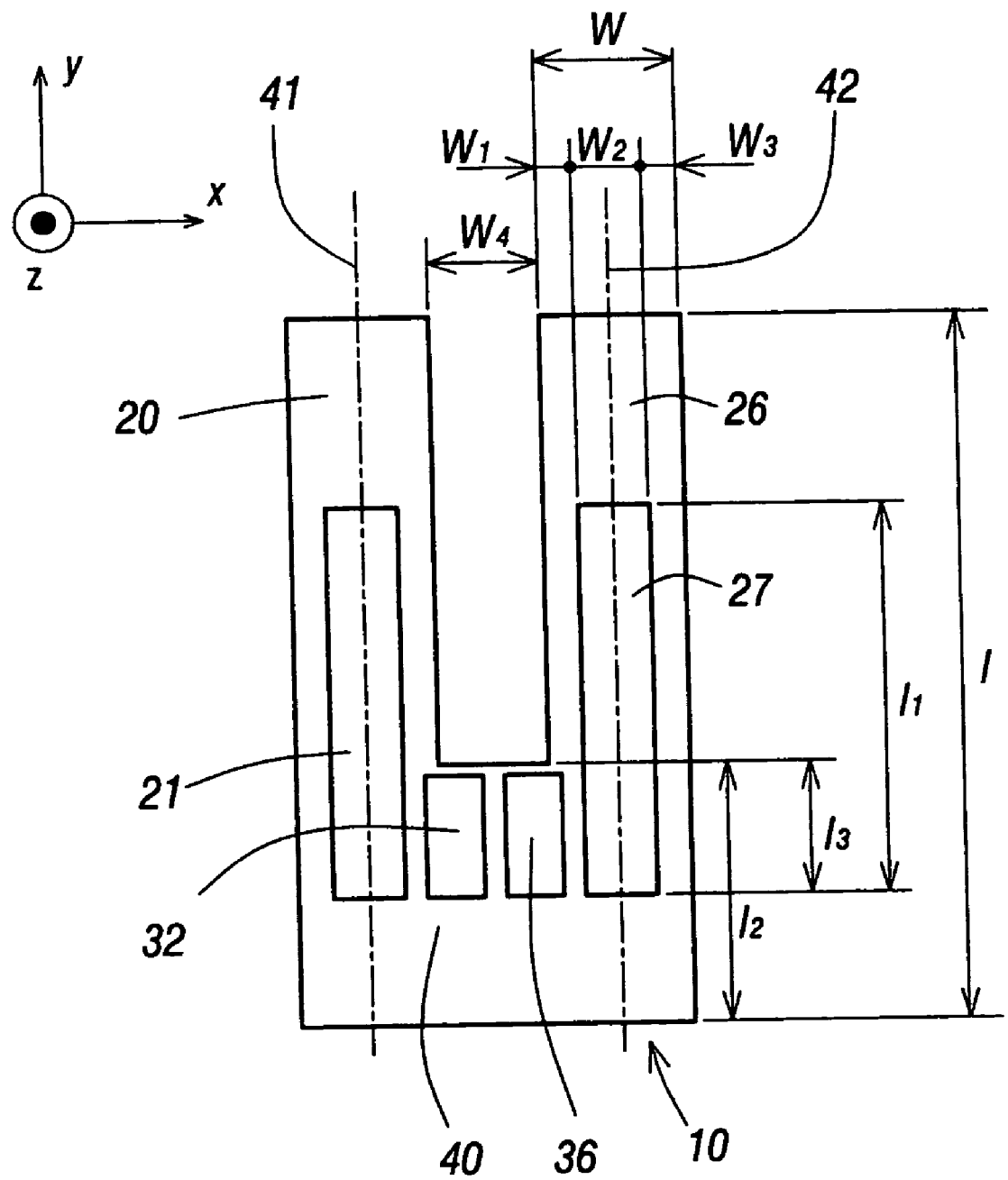
FIG. 6 shows a plan view of a quartz crystal tuning fork resonator of FIG. 4.

FIG. 6 shows a plan view of the resonator 10 of FIG. 4. In FIG. 6, the construction and the dimension of grooves 21, 27, 32 and 36 are described in detail. The groove 21 is constructed to include a portion of the central line 41 of the tine 20, and the groove 27 is similarly constructed to include a portion of the central line 42 of the tine 26. The width $W_2$ of the grooves 21 and 27 (groove width $W_2$) which include a portion of the central lines 41 and 42 respectively, is preferable because moment of inertia of the tines 20 and 26 becomes large and the tines can vibrate in a flexural mode easily. As a result, the quartz crystal tuning fork resonator capable of vibrating in a fundamental mode can be obtained with a small series resistance $R_1$ and a high quality factor $Q_1$.

In more detail, when part widths $W_1$, $W_3$ and a groove width $W_2$ are taken, the tine width W of the tines 20 and 26 has a relationship of $W=W_1+W_2+W_3$, and the part widths $W_1$, $W_3$ are constructed so that $W_1 \geq W_3$ or $W_1 < W_3$. In addition, the groove width $W_2$ is constructed so that $W_2 \geq W_1$, $W_3$. In this embodiment, also, the grooves are constructed at the tines so that a ratio ($W_2/W$) of the groove width $W_2$ and the tine width W is larger than 0.35 and less than 1, preferably larger than 0.35 and less than 0.85, and a ratio ($t_1/t$) of the groove thickness $t_1$ and the thickness t of the tines (tine thickness t) is less than 0.79, preferably, larger than 0.05 and less than 0.79, more preferably, larger than 0.1 and less than 0.6 to obtain very large moment of inertia of the tines and a small motional inductance $L_1$ of the fundamental mode of vibration. In more detail, when each of the grooves 21 and 27 formed in the obverse faces of the tines 20 and 26 has a depth $t_1$ and each of the grooves 22 and 28 formed in the reverse faces of the tines 20 and 26 has a depth $t_2$, the thickness t is given by $t=t_1+t_2+t_3$, and $t_1$ and $t_2$ are larger than 0.021 mm, preferably, larger than 0.025 mm and less than 0.075 mm, more preferably, larger than 0.03 mm and less than 0.055 mm. That is, the flexural mode, quartz crystal tuning fork resonator, capable of vibrating in the fundamental mode, and having a good frequency stability can be provided with a small series resistance $R_1$, a high quality factor $Q_1$ and a small capacitance ratio $r_1$ because electromechanical transformation efficiency of the resonator becomes large markedly.

Likewise, a length $l_1$ of the grooves 21, 27 provided at the tines 20, 26 extends into the base 40 in this embodiment (which has a dimension of the length $l_2$ and the length $l_3$ of the grooves). Therefore, a groove length and a length of the tines are given by ($l_1-l_3$) and ($l-l_2$), respectively, and a ratio of ($l_1-l_3$) and ($l-l_2$) is within a range of 0.3 to 0.8, preferably, 0.4 to 0.8 to get a flexural mode tuning fork resonator with series resistance $R_1$ of a fundamental mode vibration smaller than series resistance $R_2$ of a second overtone mode vibration. In other words, a groove length is within a range of 30% to 80%, preferably, 40% to 80% of a length of each of the tines, so that a flexural mode tuning fork resonator with a reduced series resistance $R_1$ and a small motional inductance $L_1$ of a fundamental mode vibration and having shock proof can be obtained when the flexural mode tuning fork resonator is miniaturized. Also, a length $l_2$ of the base is less than 0.5 mm, preferably, within a range of 0.29 mm to 0.48 mm or within a range of 0.12 mm to 0.255 mm or within a range of 0.264 mm to 0.277 mm, so that a miniaturized flexural mode tuning fork resonator can be obtained with reduced energy losses which are caused by vibration when it is mounted on a mounting portion of a case. As be well known, the resonator can be expressed by an electrical equivalent circuit comprising motional capacitance $C_1$, motional inductance $L_1$, series resistance $R_1$ connected in series, and shunt capacitance $C_0$ connected to $C_1$, $L_1$ and $R_1$ in parallel.

Furthermore, the total length l is determined by the frequency requirement and the size of the housing case. Simultaneously, to get a flexural mode, quartz crystal tuning fork resonator, capable of vibrating in a fundamental mode with suppression of the second overtone mode vibration which is an unwanted mode vibration, there is a close relationship between the groove length $l_1$ and the total length l. Namely, a ratio ($l_1/l$) of the groove length $l_1$ and the total length l is within a range of 0.2 to 0.78 because the quantity of charges which generate within the grooves and on the sides of the tines or the tines and the base can be controlled by the ratio, as a result, the second overtone mode vibration which is an unwanted mode vibration, can be suppressed, and simultaneously, a frequency stability of the fundamental mode vibration gets high. Therefore, the flexural mode, quartz crystal tuning fork resonator, capable of vibrating easily in a fundamental mode and having high frequency stability can be provided. Also, the total length l is less than 2.18 mm, preferably, within a range of 1.2 mm to 2 mm, more preferably, 0.8 mm to 1.2 mm, and groove length $l_1$ is less than 1.29 mm, preferably, within a range of 0.32 mm to 1.1 mm, more preferably, within a range of 0.32 mm to 0.85 mm, to get a smaller-sized tuning fork resonator with about 32.768 kHz and a small motional inductance $L_1$ which vibrates in a flexural mode and a fundamental mode.

In more detail, series resistance $R_1$ of the fundamental mode vibration becomes smaller than series resistance $R_2$ of the second overtone mode vibration. Namely, $R_1 < R_2$, preferably, $R_1 < 0.86R_2$, therefore, a quartz crystal oscillator comprising an amplifier (CMOS inverter), capacitors, resistors and a quartz crystal unit with the quartz crystal tuning fork resonator of this embodiment can be obtained, which is capable of vibrating in the fundamental mode easily. In addition, in this embodiment the grooves 21 and 27 of the tines 20 and 26 extend into the base 40 in series, but embodiment of the present invention includes a plurality of grooves divided into the length direction of the tines. In addition, the grooves may be constructed only at the tines ($l_3=0$). From the relationship of $l_3=0$, each of the grooves 21, 22, 27 and 28 has a first stepped portion and a second stepped portion opposite the first stepped portion in the width direction, and a third stepped portion and a fourth stepped portion opposite the third stepped portion in the length direction.

In this embodiment, the groove length l corresponds to electrode length disposed inside the grooves, though the electrode is not shown in FIG. 6, but, when the electrode length is less than the groove length, the length $l_1$ is of the electrode length. Namely, the ratio ($l_1/l$) in this case is expressed by a ratio of electrode length l of the grooves and the total length l. In order to achieve the above-mentioned object, it may be satisfied with at least one groove with the ratio constructed at the obverse and reverse faces of each tine. As a result, the flexural mode, quartz crystal tuning fork resonator, capable of vibrating very easily in the fundamental mode and having the high frequency stability can be realized. Also, a fork portion of this embodiment has a rectangular shape, but this invention is not limited to this, for example, the fork portion may have a U shape.

Figure 20:
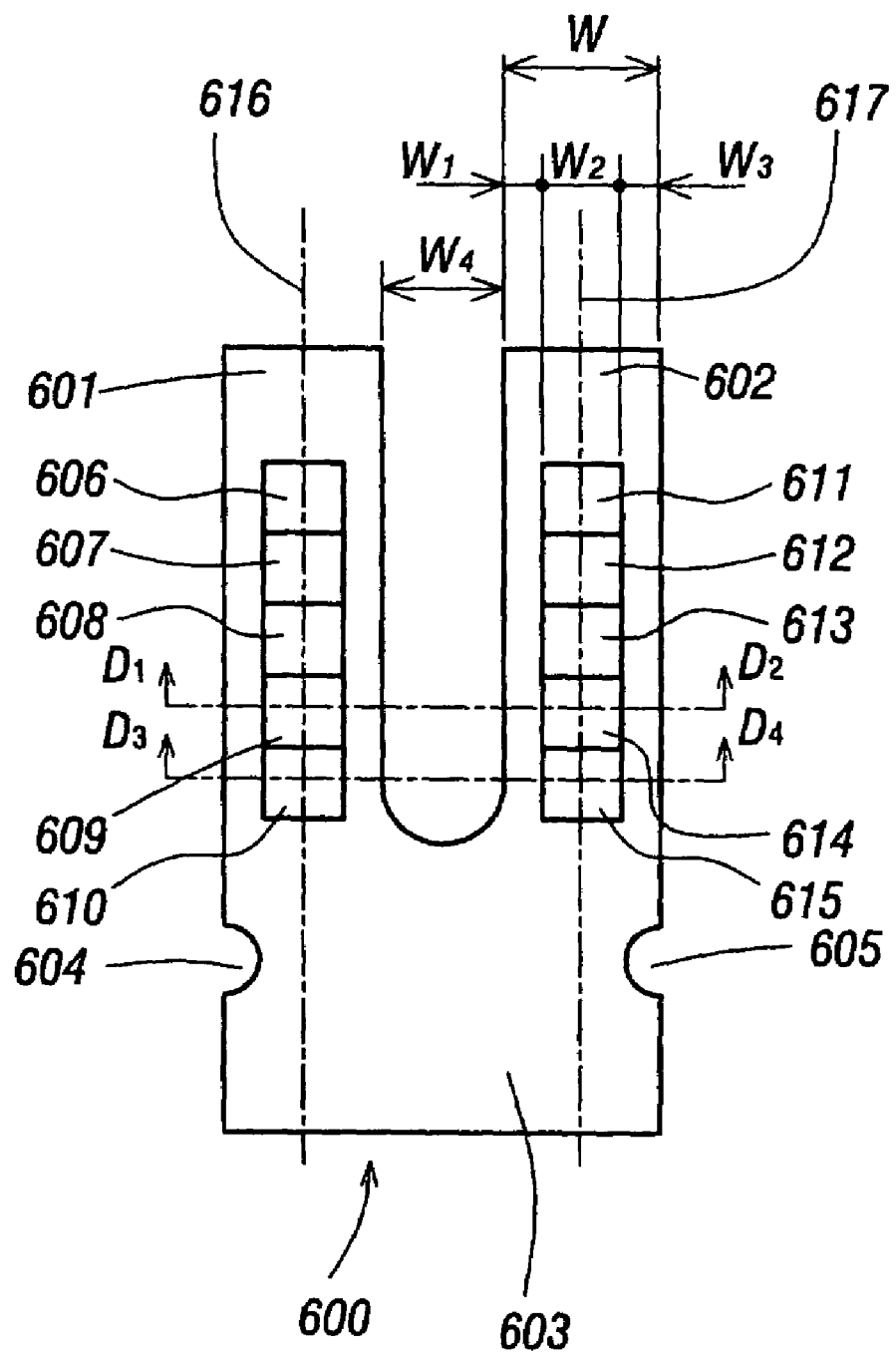
FIG. 20 shows a plan view of a flexural mode, quartz crystal tuning fork resonator of the present invention, and constructing a quartz crystal unit, a quartz crystal oscillator and an electronic apparatus of the present invention.
Figure 21:
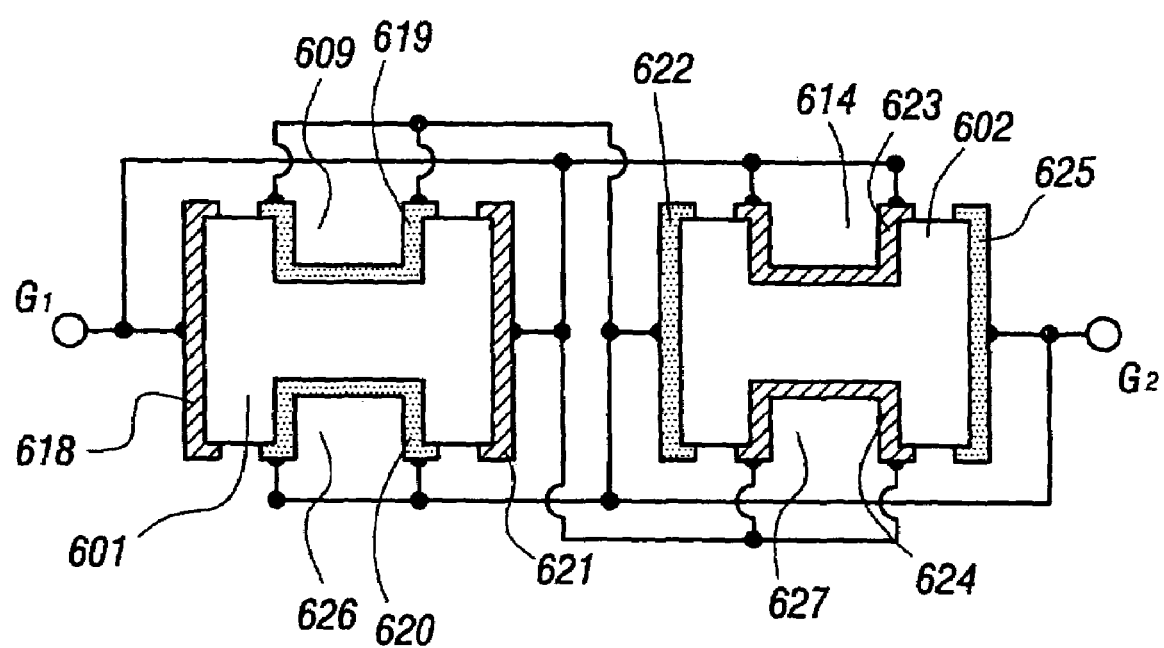
FIG. 21 shows a $D_1$-$D_2$ cross-sectional view of the tuning fork tines of FIG. 20.
Figure 22:
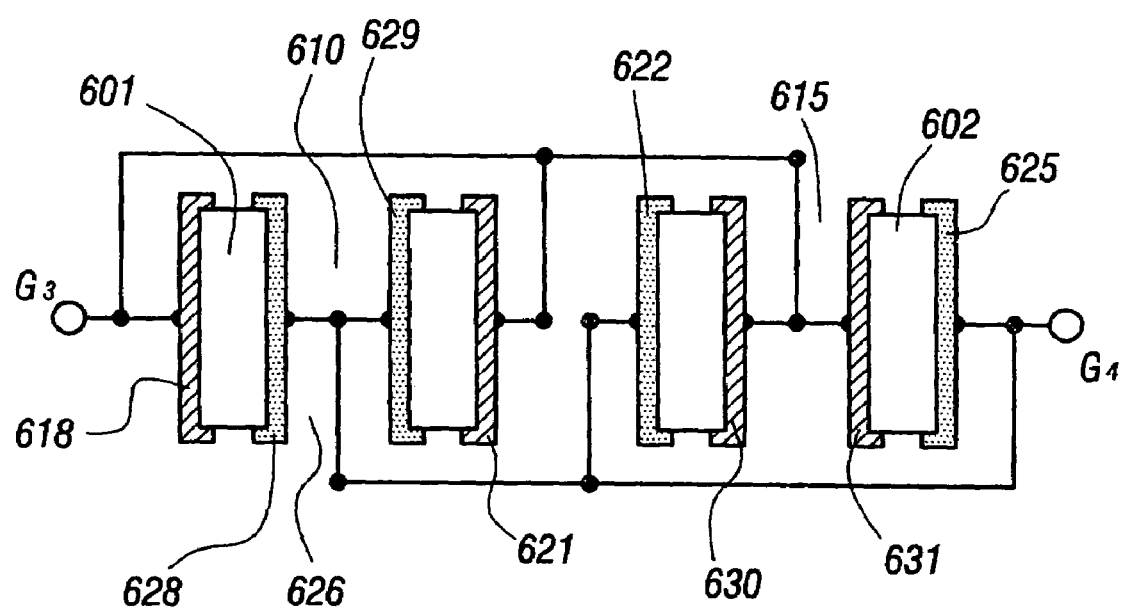
FIG. 22 shows a $D_3$-$D_4$ cross-sectional view of the tuning fork tines of FIG. 20.
Figure 23:
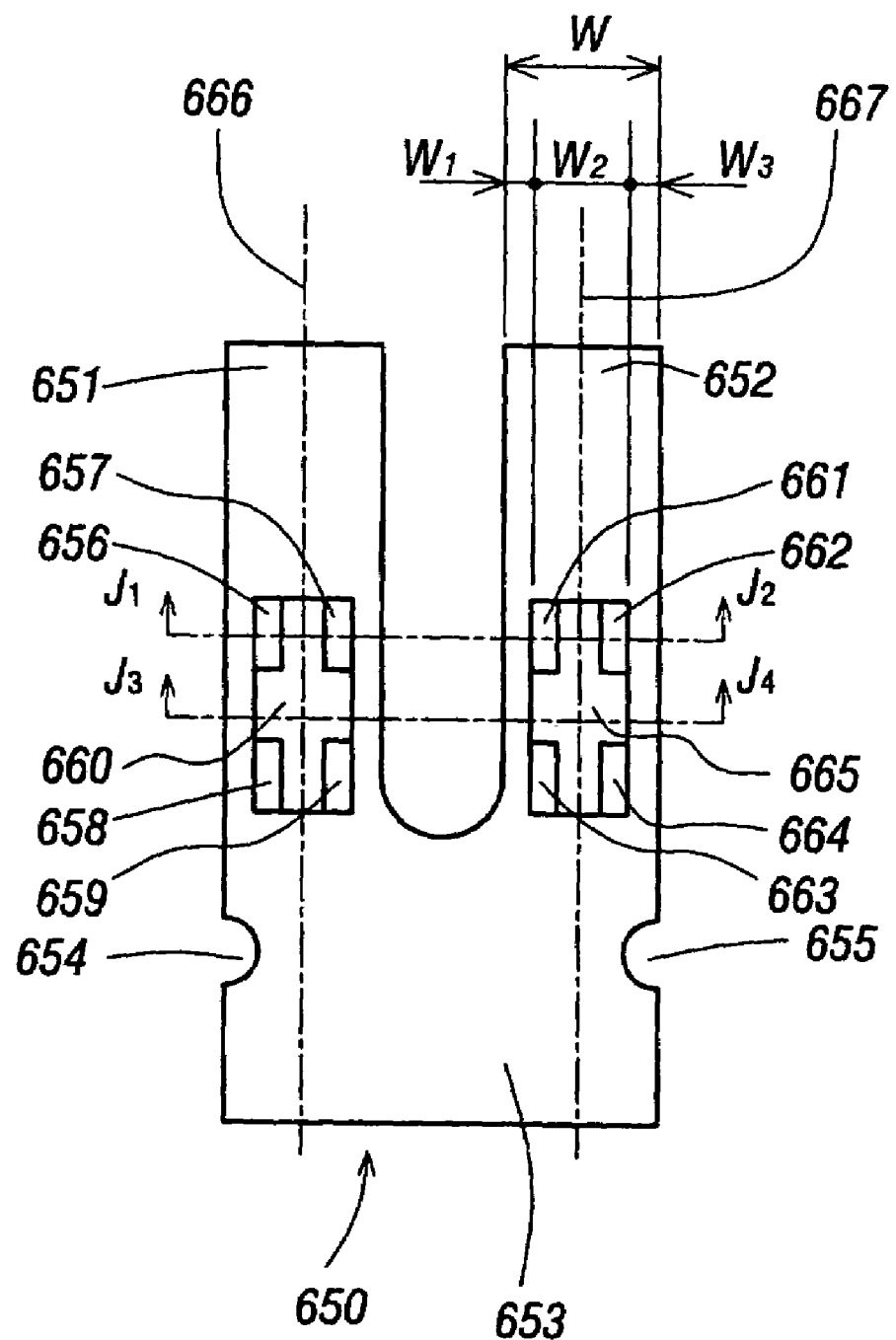
FIG. 23 shows a plan view of a flexural mode, quartz crystal tuning fork resonator of the present invention, and constructing a quartz crystal unit, a quartz crystal oscillator and an electronic apparatus of the present invention.
Figure 24:
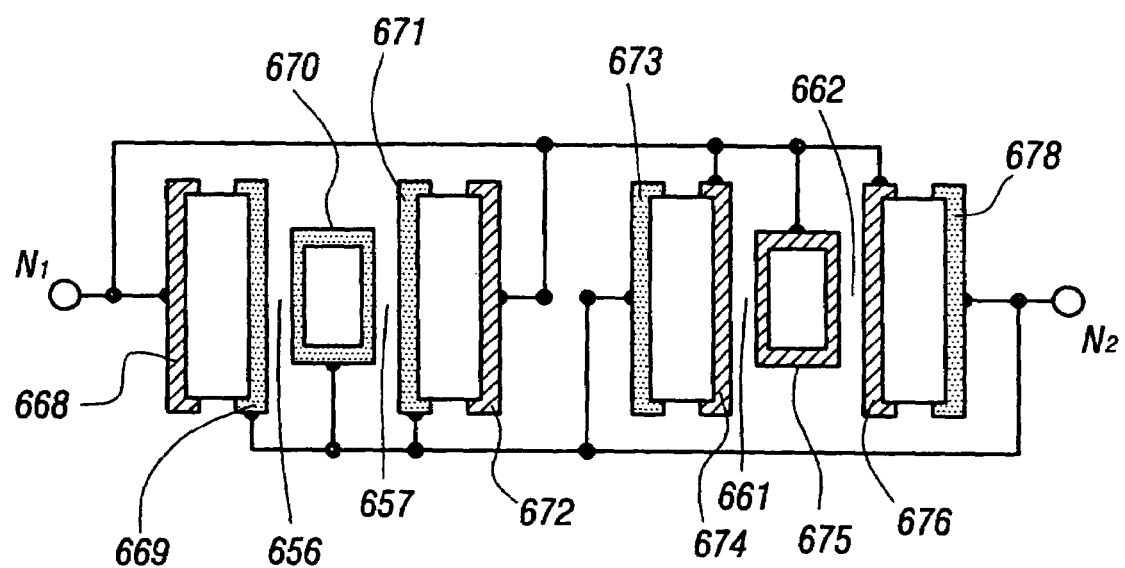
FIG. 24 shows a $J_1$-$J_2$ cross-sectional view of the tuning fork tines of FIG. 23.
Figure 25:
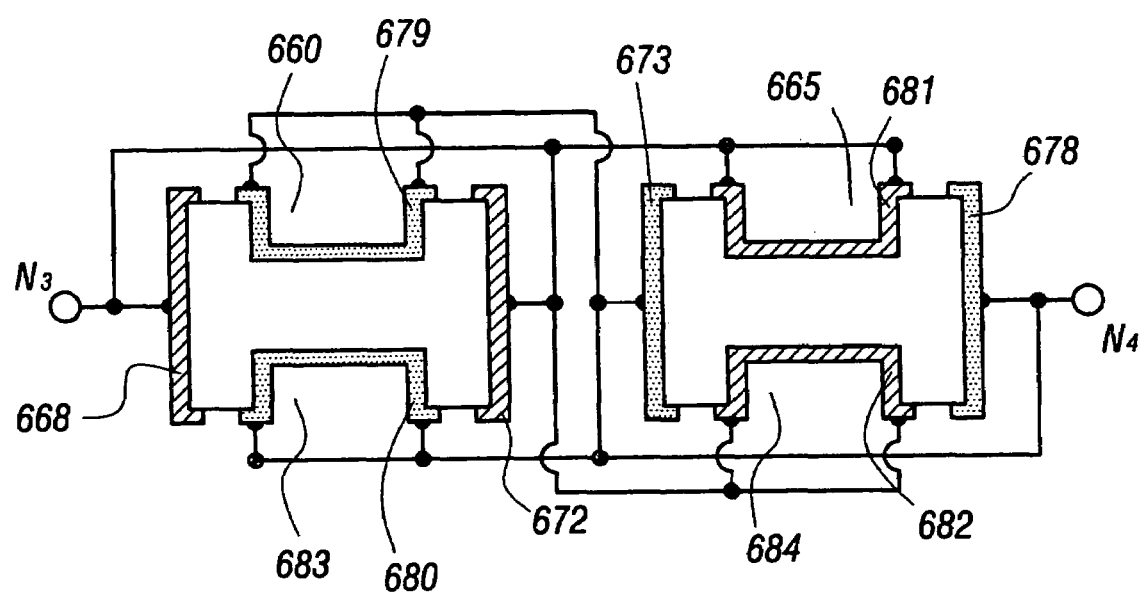
FIG. 25 shows a $J_3$-$J_4$ cross-sectional view of the tuning fork tines of FIG. 23.

In addition, a spaced-apart distance between the tines is given by $W_4$, and in this embodiment, the space $W_4$ and the groove width $W_2$ are constructed so that $W_4 \geqq W_2$, and more, the space $W_4$ is within a range of 0.05 mm to 0.35 mm and the groove width $W_2$ is within a range of 0.03 mm to 0.12 mm because it is easy to form a tuning fork shape and grooves of the tuning fork tines separately by a photo-lithographic process and an etching process, consequently, a frequency stability for a fundamental mode vibration gets higher than that for a second overtone mode vibration. In this embodiment, a quartz wafer with the thickness t of 0.05 mm to 0.18 mm is used. In order to get a smaller-sized quartz crystal tuning fork resonator, capable of vibrating in a flexural mode, and a small motional inductance $L_1$, it is necessary that groove width $W_2$ is less than 0.07 mm, preferably, larger than 0.015 mm and less than 0.04 mm and tine width W is less than 0.18 mm, and preferably, the W is larger than 0.05 mm and less than 0.1 mm, more preferably, larger than 0.03 mm and less than 0.075 mm. Also, a groove thickness $t_1$ is within a range of 0.01 mm to 0.085 mm approximately, and part widths $W_1$, $W_3$ are less than 0.021 mm, preferably, less than 0.015 mm. In more detail, a dimension of the part widths $W_1$, $W_3$ is very dependent on a manufacturing technology. Therefore, when the technology is taken into account, $W_1$ and $W_3$ have a value of larger than 0.004 mm, preferably, larger than 0.008 mm and less than 0.015 mm, more preferably, larger than 0.01 mm and less than 0.014 mm to get a small motional inductance $L_1$. In addition, the groove provided on at least one of the obverse face and the reverse face of the tuning fork tines of the present invention may be a through hole, namely, the groove thickness $t_1=0$. Moreover, another example of the tuning fork tines having $t_1=0$ is shown in FIG. 20 and which shows a plan view of a flexural mode, quartz crystal tuning fork resonator 600. In detail, the resonator 600 comprises tuning fork tines 601, 602 and tuning fork base 603, the base 603 has cut portions 604, 605, and the tines 601, 602 have central linear portions 616, 617, respectively. The tine 601 has through holes 606, 608, 610 and grooves 607, 609 and the tine 602 has through holes 611, 613, 615 and grooves 612, 614. Each of the tines 601, 602 has a width W, and the through holes and the grooves have a width $W_2$ larger than or equal to part widths $W_1$, $W_3$, where W is given by $W=W_1+W_2+W_3$. Namely, the tuning fork tines have a first tuning fork tine 601 and a second tuning fork tine 602, and three through holes are formed at each of the first and second tuning fork tines so that a width $W_2$ of the through holes is greater than the part widths $W_1$ and/or $W_3$. For example, the width $W_2$ of the through holes has a value lager than 0.02 mm and less than 0.04 mm and the part widths $W_1$ and $W_3$ have a value larger than 0.008 mm and less than 0.014 mm. In this embodiment, the through holes are dived into the length direction of the first and second tuning fork tines. When the first tuning fork tine 601 has three through holes comprising first, second and third through holes 610, 608, 606 divided in the length direction, the groove 609 is formed between the first through 610 and second through hole 608 and the groove 606 is formed between the second through hole 608 and the third through hole 606. Similar to this, when the second tuning fork tine 602 has three through holes comprising first, second and third through holes 615, 613, 611 divided in the length direction, the groove 614 is formed between the first through 615 and second through hole 613 and the groove 612 is formed between the second through hole 613 and the third through hole 611. In other words, each of the first and second tuning fork tines has three through holes divided in the length direction and a groove is formed in at least one or each of the obverse and reverse faces between two through holes. In this embodiment, though a groove is formed between two through holes, but this invention is not limited to this, the groove may be not formed between the two through holes. Namely, a frame portion is formed between the two through holes. In addition, FIG. 21 shows a $D_1$-$D_2$ cross-sectional view of the tuning fork tines 601, 602. The tine 601 has electrodes 618, 621 disposed on side surfaces and electrodes 619, 620 disposed in grooves 609, 626, while the tine 602 has electrodes 622, 625 disposed on side surfaces and electrodes 623, 624 disposed in grooves 614, 627. The electrodes 618, 621, 623, 624 are connected electrically to form an electrode terminal $G_1$, while the electrodes 619, 620, 622, 625 are connected electrically to form an electrode terminal $G_2$. Moreover, FIG. 22 shows a $D_3$-$D_4$ cross-sectional view of the tuning fork tines 601, 602. The tine 601 has electrodes 618, 621 disposed on side surfaces and electrodes 628, 629 disposed in a through hole 610, while the tine 602 has electrodes 622, 625 disposed on side surfaces and electrodes 630, 631 disposed in a through hole 615. The electrodes 618, 621, 630, 631 are connected electrically to form an electrode terminal $G_3$, while the electrodes 628, 629, 622, 625 are connected electrically to form an electrode terminal $G_4$. The electrode terminals $G_1$ and $G_3$ have the same electrical polarity, while the electrode terminals $G_2$ and $G_4$ have the same electrical polarity different from the electrical polarity of the electrode terminals $G_1$ and $G_3$. When an alternating current voltage is applied to the electrode terminals $G_1$, $G_3$ and the electrode terminals $G_2$, $G_4$, the tuning fork resonator vibrates in a flexural mode of an inverse phase. In this embodiment, frame portions are not shown at the tuning fork base 603, but the tuning fork base may have frame portions protruding from the tuning fork base. Moreover, when a length of the grooves and a length of the through holes are defined by $l_m$ and $l_a$, respectively, there are two relationships so that $l_m \geq l_a$ or $l_m < l_a$. In more detail, a length $l_a$ of the through holes in this embodiment is within a range of 0.03 mm to 0.45 mm, preferably, 0.05 mm to 0.3 mm and a length $l_m$ of the grooves is within a range of 0.01 mm to 0.5 mm, preferably, 0.025 mm to 0.35 mm. One of the two relationships is selected so that the tuning fork resonator has a small motional inductance $L_1$. It is needless to say that a relationship of the length $l_a$ and the length $l_m$ can be applied to a tuning fork resonator in FIG. 23. In addition, a further example of the tuning fork tines having $t_1=0$ is shown in FIG. 23 and which shows a plan view of a flexural mode, quartz crystal tuning fork resonator 650. In detail, the resonator 650 comprises tuning fork tines 651, 652 and tuning fork base 653, the base 653 has cut portions 654, 655, and the tines 651, 652 have central linear portions 666, 667, respectively. The tine 651 has through holes 656, 657, 658, 659 and a groove 660 and the tine 652 has through holes 661, 662, 663, 664 and a groove 665. Each of the tines 601, 602 has a width W, and the grooves have a width $W_2$ larger than or equal to part widths $W_1$, $W_3$, where W is given by $W=W_1+W_2+W_3$. Namely, when each of the first and second tuning fork tines has a first side surface and a second side surface opposite the first side surface, and obverse and reverse faces each of which has a central linear portion, a through hole is formed between the first side surface and the central linear portion and/or a through hole is formed between the second side surface and the central linear portion so that the central linear portion is not included in the through hole. Namely, a width of the through hole is less than a half of the tine width W. In this embodiment, the through holes are divided into the width and length directions of the corresponding one of the first and second tuning fork tines. The groove 660 is formed between the through holes 656, 657, between the through holes 658, 659, between 656, 658 and between the through holes 657, 659, while the groove 665 is formed between the through holes 661, 662, between the through holes 663, 664, between 661, 663 and between the through holes 662, 664. Namely, the through holes 656, 657, 658, 659 are formed in the groove 660 and the through holes 661, 662, 663, 664 are formed in the groove 665. In this embodiment, though a groove is formed between the through holes, this invention is not limited to this, but the groove may be not formed between the through holes. In addition, two through holes at each of left and right sides of the central linear portion are formed in the length direction in this embodiment, but the through holes more than two may be formed in the length direction. In addition, two through holes are formed symmetrically in the width direction to the central linear portion in this embodiment, but the two through holes may be formed asymmetrically in the width direction to the central linear portion. Moreover, FIG. 24 shows a $J_1$-$J_2$ cross-sectional view of the tuning fork tines 651, 652. The tine 651 has electrodes 668, 672 disposed on side surfaces and electrodes 669, 670, 671 disposed in through holes 656, 657, while the tine 652 has electrodes 673, 678 disposed on side surfaces and electrodes 674, 675, 676 disposed in through hole 661, 662. The electrodes 668, 672, 674, 675, 676 are connected electrically to form an electrode terminal $N_1$, while the electrodes 669, 670, 671, 673, 678 are connected electrically to form an electrode terminal $N_2$. In addition, FIG. 25 shows a $J_3$-$J_4$ cross-sectional view of the tuning fork tines 651, 652. The tine 651 has electrodes 668, 672 disposed on side surfaces and electrodes 679, 680 disposed in grooves 660, 683, while the tine 652 has electrodes 673, 678 disposed on side surfaces and electrodes 681, 682 disposed in grooves 665, 684. The electrodes 668, 672, 681, 682 are connected electrically to form an electrode terminal $N_3$, while the electrodes 679, 680, 673, 678 are connected electrically to form an electrode terminal $N_4$. The electrode terminals $N_1$ and $N_3$ have the same electrical polarity, while the electrode terminals $N_2$ and $N_4$ have the same electrical polarity different from the electrical polarity of the electrode terminals $N_1$ and $N_3$. When an alternating current voltage is applied to the electrode terminals $N_1$, $N_3$ and the electrode terminals $N_2$, $N_4$, the tuning fork resonator vibrates in a flexural mode of an inverse phase. In this embodiment, frame portions are not shown at the tuning fork base 653, but the tuning fork base may have frame portions protruding from the tuning fork base. Moreover, the through holes are formed at each of first and second tuning fork tines by etching simultaneously with the first and second tuning fork tines. But, at least one through hole may be formed at each of first and second tuning fork tines by etching in a step different from the step of forming the first and second tuning fork tines. In addition, each of the first and second tuning fork tines has a plurality of through holes in the length direction, an overall length of the through holes is within a range of 20% to 80%, preferably, 30% to 70%, of a length of each of the tuning fork tines. Moreover, when a width of the groove formed in the width direction between two through holes and a width of the through holes are defined by $w_m$ and $w_a$, respectively, the groove and the through holes are formed so that $w_m \geq w_a$ or $w_m < w_a$. Namely, they are formed so that the tuning fork resonator has a small motional inductance $L_1$. Also, a width of the through holes in this embodiment is within a range of 0.008 mm to 0.03 mm, preferably, 0.01 mm to 0.02 mm. As a result, the tuning fork resonator can be obtained with a small motional inductance $L_1$, so that an oscillating circuit with the tuning fork resonator can be provided with short rise-time of an output signal when an alternating current voltage is applied to the oscillating circuit. In addition, an another example of metal films disposed on opposite main surfaces and opposite side surface of each of tuning fork tines of a tuning fork resonator of the present invention is shown in detail. That is to say, the tuning fork resonator comprises a tuning fork base and the tuning fork tines connected to the tuning fork base. In detail, the tuning fork tines have a first tuning fork tine and a second tuning fork tine each of which has a first vibrational portion having a thickness $t_{11}$ connected to the tuning fork base, a second vibrational portion having a thickness $t_{22}$ less or greater than or equal to the thickness $t_{11}$ connected to the first vibrational portion and a third vibrational portion having a thickness $t_{33}$ less or greater than or equal to the thickness $t_{22}$ connected to the second vibrational portion in the length direction (not shown here), for example, $t_{22}$ is equal to $t_{11}$ and less than $t_{33}$ or $t_{22}$ is less than $t_{11}$ and equal to $t_{33}$ or $t_{22}$ is less than $t_{11}$ and $t_{33}$ is greater than $t_{11}$ or $t_{22}$ is greater than $t_{11}$ and equal to $t_{33}$ or $t_{22}$ is greater than $t_{11}$ and $t_{33}$ is greater than $t_{22}$. In particular, when the thickness $t_{22}$ is the same as the thickness $t_{11}$ so that $t_{22}$ is equal to $t_{11}$ and less than $t_{33}$, the first vibrational portion (thickness $t_{11}$) and the second vibrational portion (thickness $t_{22}$) are newly replaced with a first vibrational portion having a thickness $t_{12}=t_{11}=t_{22}$ and the third vibrational portion is newly replaced with a second vibrational portion having a thickness $t_{13}=t_{33}$. Similar to this, when the thickness $t_{22}$ is the same as the thickness $t_{33}$ so that $t_{22}$ is equal to $t_{33}$ and greater than $t_{11}$, the second vibrational portion (thickness $t_{22}$) and the third vibrational portion (thickness $t_{33}$) are newly replaced with a second vibrational portion having a thickness $t_{23}=t_{22}=t_{33}$. As above-described, each of the tuning fork tines comprises a plurality of different thicknesses, e.g. having a first thickness and a second thickness greater than the first thickness. In more detail, each of the first, second and third vibrational portions has a first end portion and a second end portion opposite the first end portion in the length direction. Also, the first vibrational portion has a first main surface and a second main surface opposite the first main surface, the second vibrational portion has a third main surface and a fourth main surface opposite the third main surface and the third vibrational portion has a fifth main surface and a sixth main surface opposite the fifth main surface. The first end portion of the first vibrational portion is connected to the tuning fork base and the second end portion of the first vibrational portion is connected to the first end portion of the second vibrational portion. In addition, the second end portion of the second vibrational portion is connected to the first end portion of the third vibrational portion and the second end portion of the third vibrational portion is free in vibration. Similar to this, the first vibrational portion has a first side surface and a second side surface opposite the first side surface, the second vibrational portion has a third side surface and a fourth side surface opposite the third side surface and the third vibrational portion has a fifth side surface and a sixth side surface opposite the fifth side surface. Namely, the second vibrational portion is located between the first and third vibrational portions. In addition, at least one metal film (at least one electrode) is disposed on each of the first and second main surfaces and the first and second side surfaces of the first vibrational portion of each of the first and second tuning fork tines. In detail, the at least one metal film comprises a first metal film, e.g. the first metal film comprises chromium, and an insulation material on the chromium or the at least one metal film comprises a plurality of metal films having a first metal film and a second metal film, e.g. the first metal film comprises chromium and the second metal film comprises gold formed on the chromium, and an insulation material formed on the gold. Also, the at least one metal film disposed on each of the first and second main surfaces of the first vibrational portion of the first tuning fork tine is electrically connected to the at least one metal film disposed on each of the first and second side surfaces of the first vibrational portion of the second tuning fork tine to define a first electrode terminal and the at least one metal film disposed on each of the first and second side surfaces of the first vibrational portion of the first tuning fork tine is electrically connected to the at least one metal film disposed on each of the first and second main surfaces of the first vibrational portion of the second tuning fork tine to define a second electrode terminal. In order to get the tuning fork resonator with a decreased series resistance $R_1$ and a small motional inductance $L_1$, a groove is formed in each of the first and second main surfaces of the first vibrational portion of each of the first and second tuning fork tines. In this case, the metal films disposed on the first and second main surfaces of the first vibrational portion are, therefore, disposed on surfaces of the grooves formed in the first and second main surfaces of the first vibrational portion. Namely, the at least one metal film is disposed on each of the first and second main surfaces of the first vibrational portion of each of the first and second tuning fork tines and each of the surfaces of the grooves formed in the first and second main surfaces of the first vibrational portion of each of the first and second tuning fork tines. In addition, at least two metal films are disposed on at least one of the third and fourth main surfaces of the second vibrational portion of each of the first and second tuning fork tines. In detail, the at least two metal films comprise a first metal film and a second metal film formed on the first metal film, e.g. the first metal film comprises chromium and the second metal film comprises gold (thickness $t_{g1}$) or the first metal film comprises chromium and the second metal film comprises silver (thickness $t_{s1}$). Also, a thickness of the first metal film is less or greater than that of the second metal film. Namely, two kinds of metal films made of different materials, respectively, are disposed on at least one of the third and fourth main surfaces of the second vibrational portion of each of the first and second tuning fork tines. Similar to this, a plurality of metal films are disposed on at least one of the fifth and sixth main surfaces of the third vibrational portion of each of the first and second tuning fork tines. In detail, the plurality of metal films comprise a first metal film and a second metal film formed on the first metal film, e.g. the first metal film comprises chromium and the second metal film comprises gold (thickness $t_{g2}$) or the first metal film comprises chromium and the second metal film comprises silver (thickness $t_{s2}$). In this embodiment, the thickness $t_{g2}$ of the gold or the thickness $t_{s2}$ of the silver is greater than the thickness of the second metal film disposed on the at least one of the third and fourth main surfaces of the second vibrational portion of each of the first and second tuning fork tines. In addition, as an another example, the plurality of metal films disposed on at least one of the fifth and sixth main surfaces of the third vibrational portion of each of the first and second tuning fork tines comprise a first metal film, a second metal film formed on the first metal film and a third metal film formed on the second metal film and the third metal film is formed in a step different from the step of forming the second metal film, e.g. the first metal film comprises chromium, the second metal film comprises gold (thickness $t_{g3}$) and the third metal film comprises gold (thickness $t_{g4}$) which is formed through a mask in a step different from the step of forming the second metal film with the thickness $t_{g3}$ of the gold or the first metal film comprises chromium, the second metal film comprises gold (thickness $t_{g3}$) and the third metal film comprises silver (thickness $t_{s3}$). In more detail, a thickness of the second metal film is less than that of the third metal film, the thickness $t_{g3}$ of the gold of the second metal film is substantially equal to the thickness of the second metal film disposed on the at least one of the third and fourth main surfaces of the second vibrational portion of each of the first and second tuning fork tines, and the thickness $t_{g3}$ of the gold of the second metal film is greater or less than the thickness $t_{g4}$ of the gold of the third metal film or the thickness $t_{s3}$ of the silver of the third metal film. Likewise, the thickness of the first metal film disposed on each of the first and second main surfaces of the first vibrational portion of each of the first and second tuning fork tines is less than the thickness of the third metal film disposed on the at least one of the fifth and sixth main surfaces of the third vibrational portion of each of the first and second tuning fork tines. Also, a material of the first metal film disposed on each of the first and second main surfaces and the first and second side surfaces of the first vibrational portion of each of the first and second tuning fork tines is the same as that of the first metal film disposed on the at least one of the third and fourth main surfaces of the second vibrational portion of each of the first and second tuning fork tines and/or the first metal film disposed on the at least one of the fifth and sixth main surfaces of the third vibrational portion of each of the first and second tuning fork tines, e.g. the material comprises chromium or tin or nickel or aluminium. Moreover, a thickness of the first metal film disposed on each of the first and second main surfaces and/or the first and second side surfaces of the first vibrational portion of each of the first and second tuning fork tines is substantially equal to that of the first metal film disposed on the at least one of the third and fourth main surfaces of the second vibrational portion of each of the first and second tuning fork tines and/or the first metal film disposed on the at least one of the fifth and sixth main surfaces of the third vibrational portion of each of the first and second tuning fork tines. In order to get an enough binding force which occurs between each of the main surfaces and the first metal film comprising the chromium or the tin or the nickel or the aluminium disposed on each of the main surfaces, the thickness of the first metal film is in the range of 350 A to 1500 A, where A represents a unit of angstrom. Next, an embodiment of a method for manufacturing the tuning fork resonator with the tuning fork base and the first and second tuning fork tines each having the metal films above-described is shown in detail. According to the present invention, after a tuning fork shape comprising the tuning fork base and the first and second tuning fork tines connected to the tuning fork base are formed by etching a quartz crystal wafer, the metal films disposed on the main surfaces of each of the first and second tuning fork tines are formed by a plurality of steps. Namely, the plurality of steps comprise the steps of forming the first metal film and the second metal film on the first metal film on each of the first and second main surfaces and each of the first and second side surfaces of each of the first and second tuning fork tines, forming the first and second metal films on at least one of the third and fourth main surfaces of each of the first and second tuning fork tines and forming the first, second and third metal films on at least one of the fifth and sixth main surfaces of each of the first and second tuning fork tines. In more detail, the method for manufacturing the tuning fork resonator in this embodiment comprises the plurality of steps of A.) forming the first metal film on each of the first, second, third, fourth, fifth and sixth main surfaces and the first, second, third, fourth, fifth and sixth side surfaces of each of the first and second tuning fork tines, B.) forming the second metal film on the first metal film on each of the first, second, third, fourth, fifth and sixth main surfaces and the first, second, third, fourth, fifth and sixth side surfaces of each of the first and second tuning fork tines, C.) forming a resist on the second metal film formed on the first metal film, D.) electrically connecting the first metal film or the second metal film on the first metal film disposed on each of the first and second main surfaces of the first vibrational portion of the first tuning fork tine to the first metal film or the second metal film on the first metal film disposed on each of the first and second side surfaces of the first vibrational portion of the second tuning fork tine to define a first electrode terminal and electrically connecting the first metal film or the second metal film on the first metal film disposed on each of the first and second side surfaces of the first vibrational portion of the first tuning fork tine to the first metal film or the second metal film on the first metal film disposed on each of the first and second main surfaces of the first vibrational portion of the second tuning fork tine to define a second electrode terminal, E.) forming the third metal film through a mask on at least one of the fifth and sixth main surfaces of each of the first and second tuning fork tines by an evaporation method or a sputtering method, F.) adjusting an oscillation frequency of the tuning fork resonator by trimming the third metal film disposed on the at least one of the fifth and sixth main surfaces of the third vibrational portion of each of the first and second tuning fork tines, and G.) eliminating the second metal film formed on the first metal film on each of the first and second main surfaces and the first and second side surfaces of the first vibrational portion of each of the first and second tuning fork tines by a chemical etching method. In this embodiment, e.g. the first metal film comprises a chromium film or a tin film or a nickel film or an aluminium film or a titanium film or a tungsten film, the second metal film comprises a gold film or a silver film or an aluminium film or a copper film or a tin film or a titanium film or a tungsten film and the third metal film comprises a gold film or a silver film. Also, the first, second and third metal films are formed by a sputtering method or an evaporation method, respectively. According to the present invention, e.g. the plurality of steps are performed in the order of A.), B.), C.), D.), E.), and F.). Also, the step of G.) is performed after the step of C.) or D.). In addition, a method for manufacturing the tuning fork resonator with the first and second tuning fork tines in an another embodiment of the present invention comprises the plurality of steps of A.) forming the first metal film on each of the first, second, third, fourth, fifth and sixth main surfaces and the first, second, third, fourth, fifth and sixth side surfaces of each of the first and second tuning fork tines, B.) forming the second metal film on the first metal film on each of the first, second, third, fourth, fifth and sixth main surfaces and the first, second, third, fourth, fifth and sixth side surfaces of each of the first and second tuning fork tines, C.) forming a resist on the second metal film formed on the first metal film, D.) eliminating the second metal film formed on the first metal film formed on each of the first and second main surfaces of the first vibrational portion of each of the first and second tuning fork tines and the first metal film formed on each of the first and second main surfaces of the first vibrational portion of each of the first and second tuning fork tines by a chemical etching method so that two electrical insulation portions are formed on each of the first and second main surfaces of the first vibrational portion of each of the first and second tuning fork tines, each of the two insulation portions has a width Wi in the range of 0.005 mm to 0.045 mm, preferably, 0.015 mm to 0.035 mm and a length Li in the range of 0.5 mm to 1.7 mm, and the first metal film and the second metal film on the first metal film disposed on each of the first and second main surfaces of the first vibrational portion of the first tuning fork tine are electrically connected to the first metal film and the second metal film on the first metal film disposed on each of the first and second side surfaces of the first vibrational portion of the second tuning fork tine to define a first electrode terminal and the first metal film and the second metal film on the first metal film disposed on each of the first and second side surfaces of the first vibrational portion of the first tuning fork tine are electrically connected to the first metal film and the second metal film on the first metal film disposed on each of the first and second main surfaces of the first vibrational portion of the second tuning fork tine to define a second electrode terminal, E.) forming the third metal film through a mask on at least one of the fifth and sixth main surfaces of each of the first and second tuning fork tines, and F.) adjusting an oscillation frequency of the tuning fork resonator by trimming the third metal film disposed on the at least one of the fifth and sixth main surfaces of the third vibrational portion of each of the first and second tuning fork tines. Preferably, the plurality of steps in this embodiment are performed in the order of A.), B.), C.), D.), E.), and F.). In addition, a method for manufacturing the tuning fork resonator in a further embodiment of the present invention comprises the plurality of steps of A.) forming the first metal film on each of the first, second, third, fourth, fifth and sixth main surfaces and the first, second, third, fourth, fifth and sixth side surfaces of each of the first and second tuning fork tines, B.) forming the second metal film on the first metal film on each of the first, second, third, fourth, fifth and sixth main surfaces and the first, second, third, fourth, fifth and sixth side surfaces of each of the first and second tuning fork tines, C.) forming a resist on the second metal film formed on the first metal film, D.) eliminating the second metal film formed on the first metal film formed on each of the first and second main surfaces of the first vibrational portion of each of the first and second tuning fork tines and the first metal film formed on each of the first and second main surfaces of the first portion of each of the first and second tuning fork tines by a chemical etching method so that two electrical insulation portions are formed on each of the first and second main surfaces of the first vibrational portion of each of the first and second tuning fork tines, each of the two insulation portions having a width Wi in the range of 0.005 mm to 0.045 mm, preferably, 0.015 mm to 0.035 mm and a length Li in the range of 0.5 mm to 1.7 mm, and eliminating the second metal film formed on the first metal film disposed on each of the first and second main surfaces and the first and second side surfaces of the first vibrational portion of each of the first and second tuning fork tines so that the first metal film disposed on each of the first and second main surfaces of the first vibrational portion of the first tuning fork tine is electrically connected to the first metal film disposed on each of the first and second side surfaces of the first vibrational portion of the second tuning fork tine to define a first electrode terminal and the first metal film disposed on each of the first and second side surfaces of the first vibrational portion of the first tuning fork tine is electrically connected to the first metal film disposed on each of the first and second main surfaces of the first vibrational portion of the second tuning fork tine to define a second electrode terminal, E.) forming the third metal film through a mask on at least one of the fifth and sixth main surfaces of each of the first and second tuning fork tines, and F.) adjusting an oscillation frequency of the tuning fork resonator by trimming the third metal film disposed on the at least one of the fifth and sixth main surfaces of the third vibrational portion of each of the first and second tuning fork tines. Preferably, the plurality of steps in this embodiment are performed in the order of A.), B.), C.), D.), E.), and F.). Also, insulation materials are formed on the first and second main surfaces of the first and second tuning fork tines after the step of D.) to prevent short-circuit which generates between the first and second electrode terminals, and at least one of the insulation materials comprises $S_iO_2$. In the embodiments above-described, the tuning fork resonator is shown with the first and second tuning fork tines. But, it is needless to say that the present invention includes a flexural mode resonator with a vibrational arm instead of the tuning fork resonator comprising the first and second tuning fork tines. In addition, a method for manufacturing the tuning fork resonator in a still further embodiment of the present invention comprises the plurality of steps of A.) forming the first metal film on each of the first, second, third, fourth, fifth and sixth main surfaces and the first, second, third, fourth, fifth and sixth side surfaces of each of the first and second tuning fork tines, B.) forming the second metal film on the first metal film on at least one of the third and fourth main surfaces and at least one of the fifth and sixth main surfaces of each of the first and second tuning fork tines, C.) forming a resist on the second metal film on the first metal film on at least one of the third and fourth main surfaces and at least one of the fifth and sixth main surfaces of each of the first and second tuning fork tines and the first metal film on each of the first and second main surfaces and the first and second side surfaces of each of the first and second tuning fork tines, D.) eliminating the first metal film formed on each of the first and second main surfaces of the first vibrational portion of each of the first and second tuning fork tines by a chemical etching method so that two electrical insulation portions are formed on each of the first and second main surfaces of the first vibrational portion of each of the first and second tuning fork tines and the first metal film disposed on each of the first and second main surfaces of the first vibrational portion of the first tuning fork tine is electrically connected to the first metal film disposed on each of the first and second side surfaces of the first vibrational portion of the second tuning fork tine to define a first electrode terminal and the first metal film disposed on each of the first and second side surfaces of the first vibrational portion of the first tuning fork tine is electrically connected to the first metal film disposed on each of the first and second main surfaces of the first vibrational portion of the second tuning fork tine to define a second electrode terminal, E.) forming the third metal film through a mask on at least one of the fifth and sixth main surfaces of each of the first and second tuning fork tines, and F.) adjusting an oscillation frequency of the tuning fork resonator by trimming the third metal film disposed on the at least one of the fifth and sixth main surfaces of the third vibrational portion of each of the first and second tuning fork tines. In general, the plurality of steps in this embodiment are performed in the order of A.), B.), C.), D.), E.), and F.). In addition, the third main surface comprises the first main surface and the fifth main surface comprises the third main surface, and the fourth main surface comprises the second main surface and the sixth main surface comprises the fourth main surface, namely, each of the third and fifth main surfaces comprises the first main surface and each of the fourth and sixth main surfaces comprises the second main surface. With respect to the side surfaces, the relationship of the side surfaces can be obtained by replacing "main" with "side".

In more detail, to obtain a flexural mode, quartz crystal tuning fork resonator with a high frequency stability which gives high time accuracy, it is necessary to obtain the resonator whose resonance frequency is not influenced by shunt capacitance because quartz crystal is a piezoelectric material and the frequency stability is very dependent on the shunt capacitance. In order to decrease the influence on the resonance frequency by the shunt capacitance, figure of merit $M_i$ (hereafter a merit value $M_i$) plays an important role. Namely, the merit value $M_i$ that expresses inductive characteristics, electromechanical transformation efficiency and a quality factor of a flexural mode, quartz crystal tuning fork resonator, is defined by a ratio $(Q_i/r_i)$ of a quality factor $Q_i$ and capacitance ratio $r_i$, namely, $M_i$ is given by $M_i=Q_i/r_i$, where i shows vibration order of the resonator, and for example, when i=1 and 2, the merit values $M_1$ and $M_2$ are a value for a fundamental mode vibration and a second overtone mode vibration of the flexural mode, quartz crystal tuning fork resonator, respectively.

Also, a frequency difference $\Delta f$ of resonance frequency $f_s$ of mechanical series independent on the shunt capacitance and resonance frequency $f_r$ dependent on the shunt capacitance is inversely proportional to the merit value $M_i$. The larger the value $M_i$ becomes, the smaller the difference $\Delta f$ becomes. Namely, the influence on the resonance frequency $f_r$ by the shunt capacitance decreases because it is close to the resonance frequency $f_s$. Accordingly, the larger the $M_i$ becomes, the higher the frequency stability of the flexural mode, quartz crystal tuning fork resonator becomes because the resonance frequency $f_r$ of the resonator is almost never dependent on the shunt capacitance. Namely, the quartz crystal tuning fork resonator can be provided with a high time accuracy.

In detail, the flexural mode, quartz crystal tuning fork resonator can be obtained with the merit value $M_1$ of the fundamental mode vibration larger than the merit value $M_2$ of the second overtone mode vibration by the above-described tuning fork shape, grooves and dimensions. That is to say, a relationship of $M_1 > M_2$ is obtained. As an example, when resonance frequency of a flexural mode, quartz crystal tuning fork resonator is about 32.768 kHz for a fundamental mode vibration and the resonator has a value of $W_2/W=0.5$, $t_1/t=0.34$ and $l_1/l=0.48$, though there is a distribution in production, the resonator has a value of $M_1>65$ and $M_2<30$, respectively.

Namely, the flexural mode, quartz crystal tuning fork resonator which vibrates in the fundamental mode can be provided with high inductive characteristics, good electromechanical transformation efficiency (small capacitance ratio $r_1$ and small series resistance $R_1$) and a high quality factor. As a result, a frequency stability of the fundamental mode vibration becomes higher than that of the second overtone mode vibration, and simultaneously, the second overtone mode vibration can be suppressed because capacitance ratio $r_2$ and series resistance $R_2$ of the second overtone mode vibration become larger than capacitance ratio $r_1$ and series resistance $R_1$ of the fundamental mode vibration, respectively. In particular, $r_2$ has a value larger than 1500 in this embodiment.

Therefore, the resonator capable of vibrating in the fundamental mode vibration can be provided with a high time accuracy because it has the high frequency stability. Consequently, a quartz crystal oscillator comprising the flexural mode, quartz crystal tuning fork resonator of this embodiment outputs an oscillation frequency of the fundamental mode vibration as an output signal, and the frequency of the output signal has a very high stability, namely, excellent time accuracy. In other words, the quartz crystal oscillator of this embodiment has a remarkable effect such that a frequency change by ageing becomes extremely small. Also, an oscillation frequency of the resonator of this embodiment is adjusted so that a frequency deviation is within a range of −100 PPM to +100 PPM to a nominal frequency, e.g. 32.768 kHz, after mounting it at a mounting portion of a case or a lid by conductive adhesives or solder.

In addition, the groove thickness $t_1$ of the present invention is the thinnest thickness of the grooves because quartz crystal is an anisotropic material and the groove thickness $t_1$ has a distribution when it is formed by a chemical etching method. In detail, a groove shape of the sectional view of tuning fork tines in FIG. 5 has a rectangular shape, but the groove shape has an about U shape or a complicated shape actually because an etching speed of a plus x-axis direction of quartz crystal in the chemical etching method is different from that of a minus x-axis direction thereof. It is, therefore, clear that the groove shape of the sectional view of the tuning fork tines in FIG. 5 changes by a condition of concentration and temperature of etching liquids and by chemical etching processes to form the groove. It is needless to say that the groove shape can be formed with the about U shape by optimizing the condition of concentration and temperature of the etching liquids and by devising the chemical etching processes. In the above-described embodiments, though the grooves are constructed at the tines, this invention is not limited to this, namely, a relationship of the merit values $M_1$ and $M_2$ can be applied to the conventional flexural mode, quartz crystal tuning fork resonator and a relationship of a quartz crystal oscillating circuit comprising an amplification circuit and a feedback circuit can be also applied to the conventional flexural mode, quartz crystal tuning fork resonator to suppress a second overtone mode vibration and to get a high frequency stability for a fundamental mode vibration of the tuning fork resonator.

Figure 7:
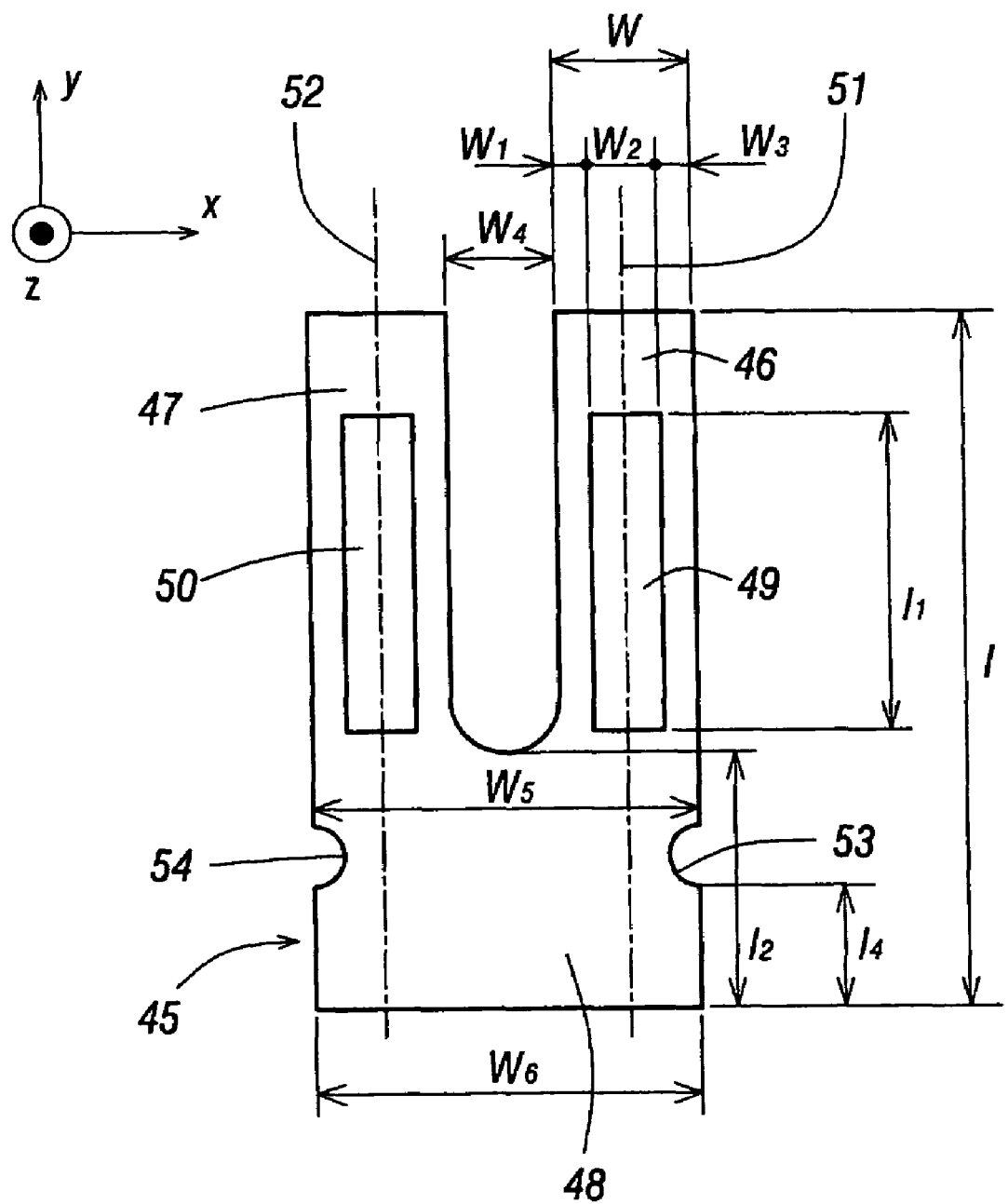
FIG. 7 shows a plan view of a flexural mode, quartz crystal tuning fork resonator constructing a quartz crystal oscillator, which constructs an electronic apparatus of the second embodiment of the present invention.

FIG. 7 shows a plan view of a flexural mode, quartz crystal tuning fork resonator 45 which is one of a contour mode quartz crystal resonator, constructing a quartz crystal oscillator, which constructs an electronic apparatus of the second embodiment of the present invention. The resonator 45 comprises tuning fork tines 46, 47 and a tuning fork base 48. The tines 46, 47 and the base 48 are formed integrally by a chemical etching process. In this embodiment, the base 48 has cut portions 53 and 54. Also, a groove 49 is constructed to include a portion of the central line 51 of the tine 46, and a groove 50 is similarly constructed to include a portion of the central line 52 of the tine 47. In this embodiment, the grooves 49 and 50 are constructed at a part of the tines 46 and 47, and have groove width $W_2$ and groove length $l_1$. In more detail, a groove area $S (=W_2 \times l_1)$ has a value of 0.01 mm² to 0.12 mm², preferably, greater than 0.01 mm² and less than 0.043 mm² because it is very easy to form the grooves by a chemical etching process and the quartz crystal tuning fork resonator can be provided with good electromechanical transformation efficiency by the formation of the grooves.

Namely, the quartz crystal tuning fork resonator, capable of vibrating in a fundamental mode and having a high frequency stability can be provided with a small series resistance $R_1$ and a high quality factor $Q_1$. Therefore, a quartz crystal oscillator having the high frequency stability can be realized with an output signal of a frequency of the fundamental mode vibration. In this embodiment, though electrodes are not shown in FIG. 7, the electrodes are disposed inside the grooves 49, 50 and on sides of the tines 46 and 47, similar to the resonator of FIG. 4. In detail, the electrodes are disposed opposite each other inside the grooves and on the sides of the tines so that the electrodes disposed opposite each other are of opposite electrical polarity. In more detail, a groove is provided on both of an obverse face and a reverse face of tuning fork tines having a first tuning fork tine and a second tuning fork tine, and also, a first electrode is disposed inside the groove and a second electrode is disposed on both sides of the tuning fork tines. In addition, a quartz crystal tuning fork resonator has two electrode terminals, the one of the electrode terminals comprises a first electrode disposed inside a groove provided on both of the obverse face and the reverse face of the first tuning fork tine and a second electrode disposed on the both sides of the second tuning fork tine, such that the first and second electrodes are connected, and the other of the electrode terminals comprises a second electrode disposed on the both sides of the first tuning fork tine and a first electrode disposed inside a groove provided on both of the obverse face and the reverse face of the second tuning fork tine, such that the second and first electrodes are connected. In this embodiment, a groove is provided on both of an obverse face and a reverse face of tuning fork tines, but the present invention in not limited to this, for example, a groove may be provided on at least one of an obverse face and a reverse face of tuning fork tines.

Figure 15:
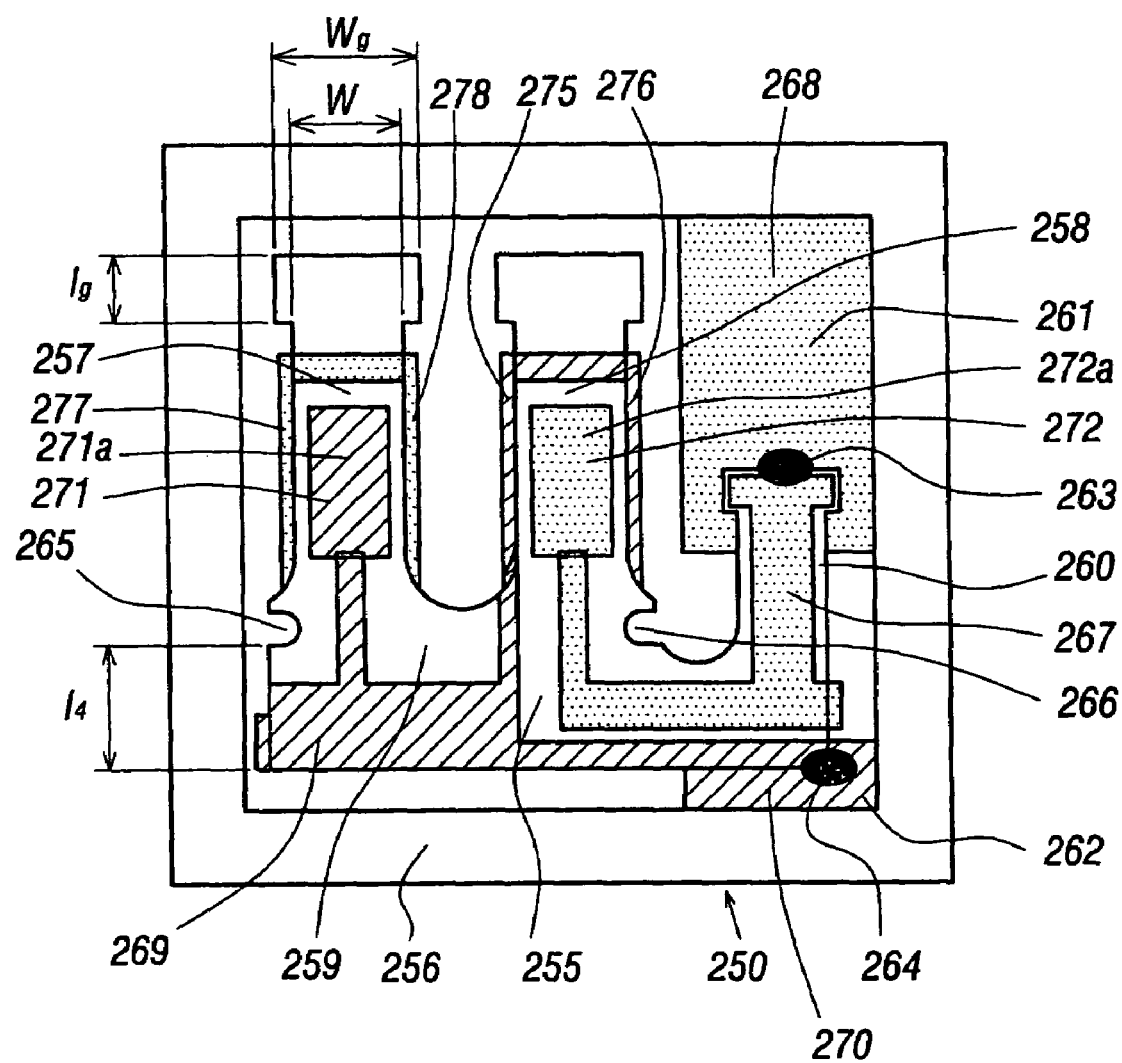
FIG. 15 shows a plan view of a quartz crystal unit of the present invention and omitting a lid, and constructing a quartz crystal oscillator and an electronic apparatus of the present invention.
Figure 16:
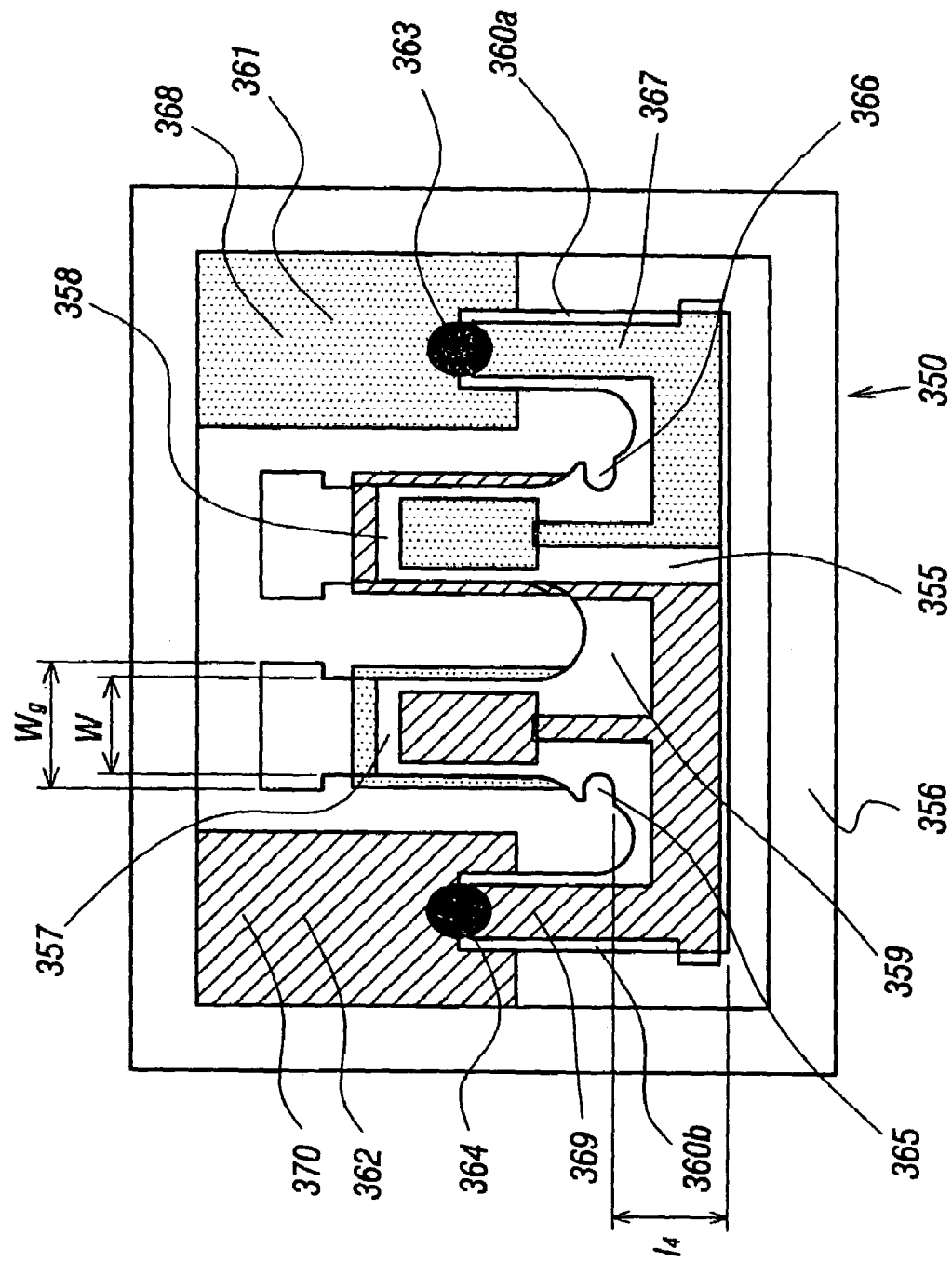
FIG. 16 shows a plan view of a quartz crystal unit of the present invention and omitting a lid, and constructing a quartz crystal oscillator and an electronic apparatus of the present invention.
Figure 17:
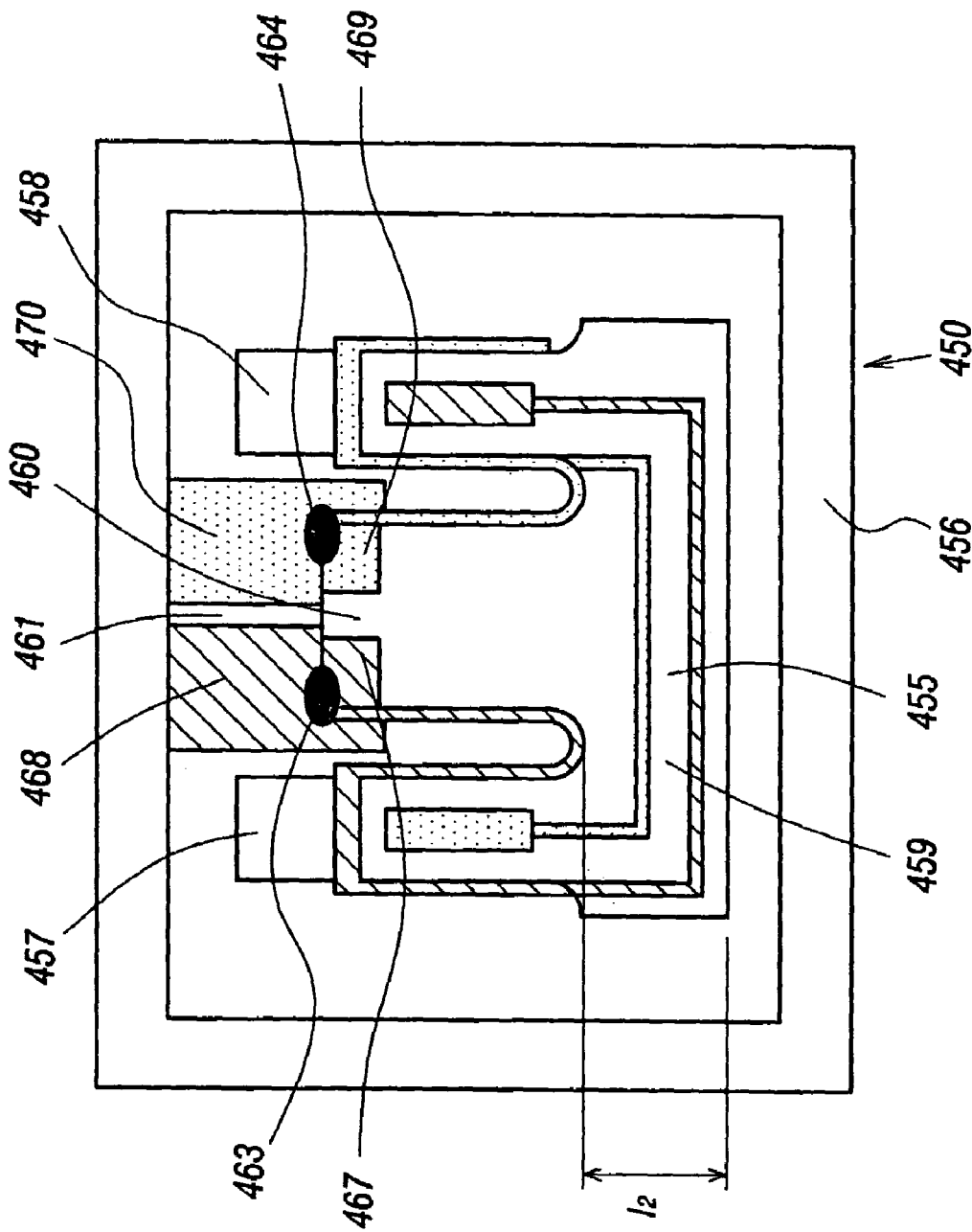
FIG. 17 shows a plan view of a quartz crystal unit of the present invention and omitting a lid, and constructing a quartz crystal oscillator and an electronic apparatus of the present invention.
Figure 26:
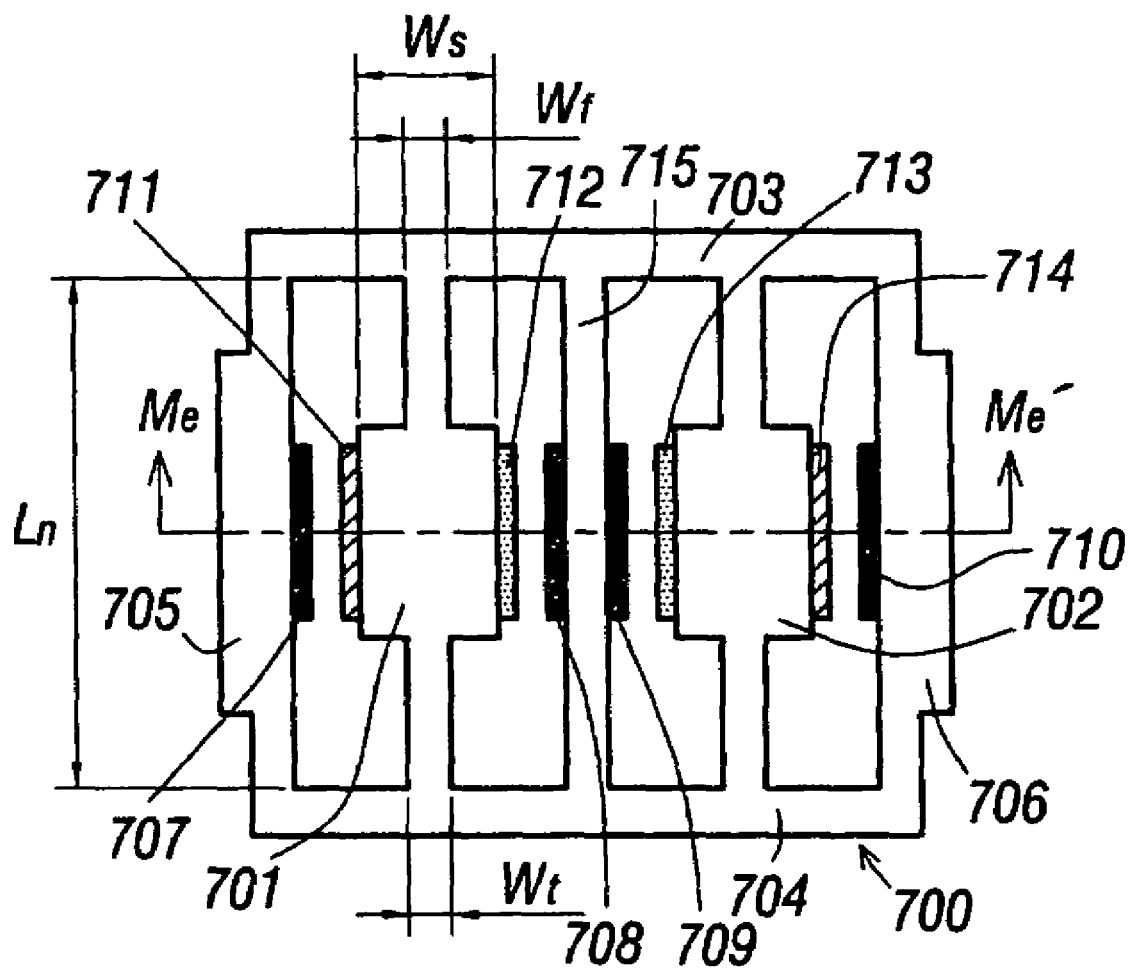
FIG. 26 shows a plan view of a flexural mode resonator of an embodiment of the present invention to construct a unit, an oscillator and an electronic apparatus of the present invention.
Figure 27:
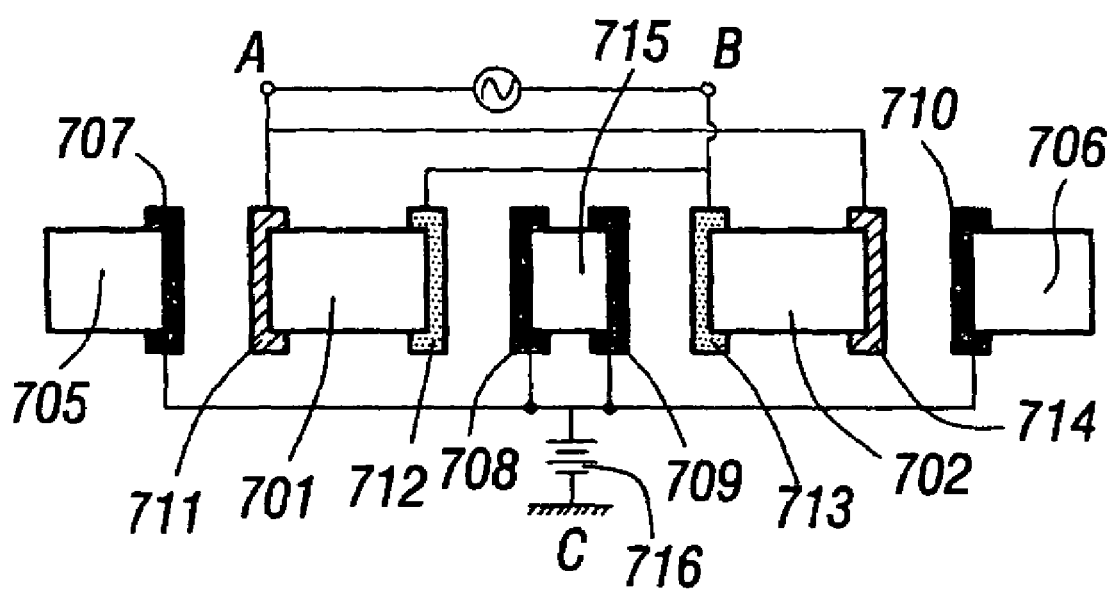
FIG. 27 shows a Me-Me' cross-sectional view of the flexural mode resonator of FIG. 26.
Figure 28:
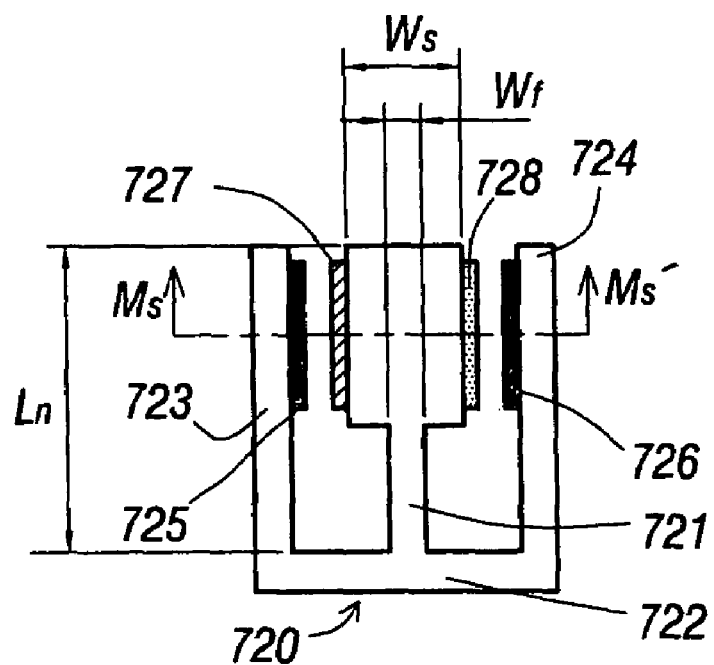
FIG. 28 shows a plan view of a flexural mode resonator of another embodiment of the present invention to construct a unit, an oscillator and an electronic apparatus of the present invention.
Figure 29:
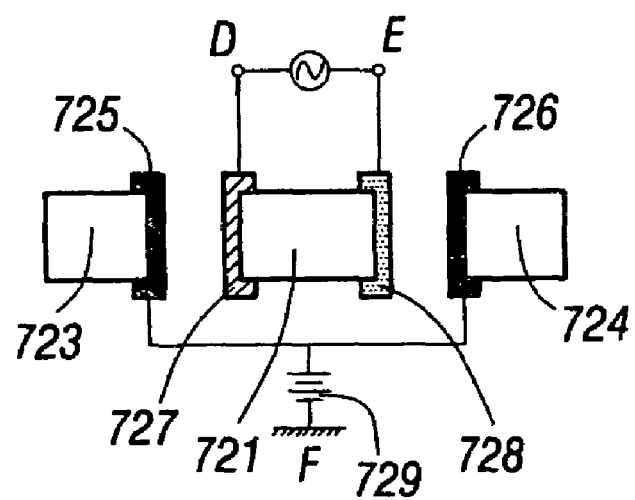
FIG. 29 shows a Ms-Ms' cross-sectional view of the flexural mode resonator of FIG. 28.
Figure 30:
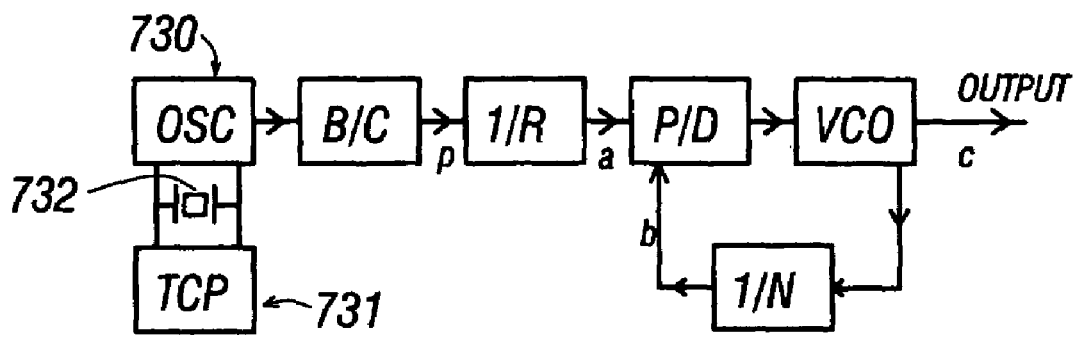
FIG. 30 shows a block diagram comprising a plurality of circuits of a first embodiment of the present invention to get an output signal, and comprising a phase locked loop circuit.
Figure 31:
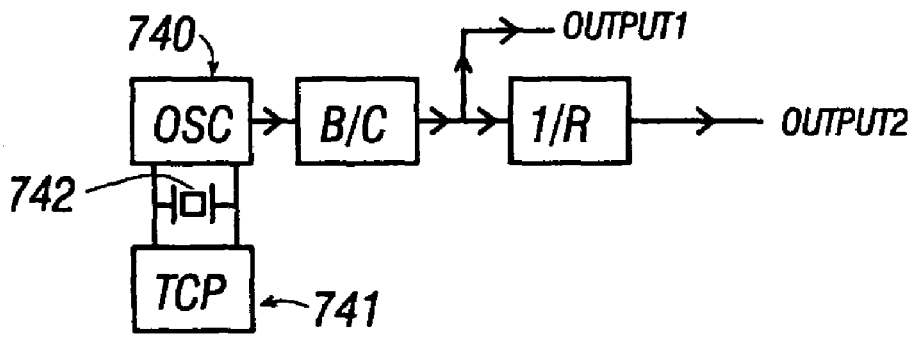
FIG. 31 shows a block diagram comprising a plurality of circuits of a second embodiment of the present invention to get two output signals.
Figure 32:
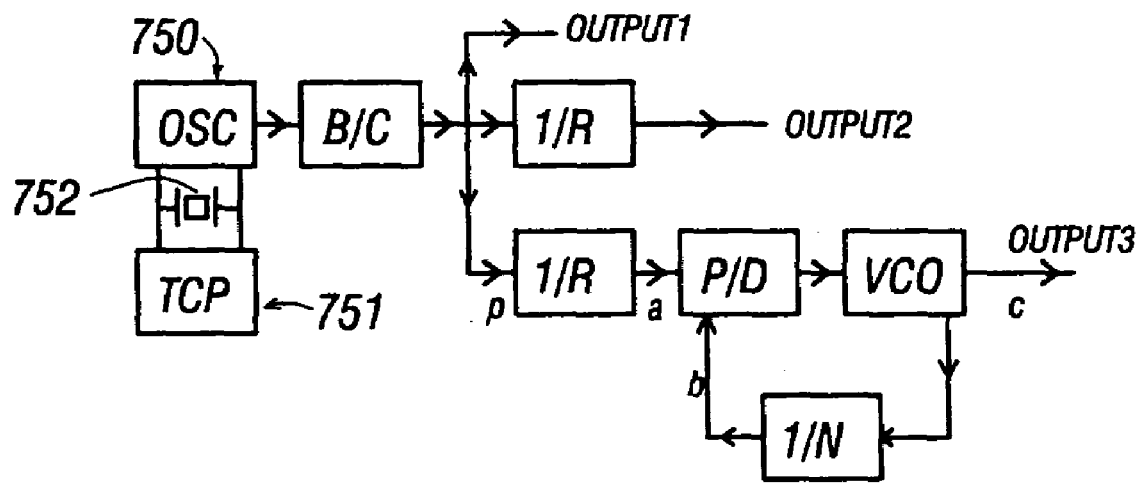
FIG. 32 shows a block diagram comprising a plurality of circuits of a third embodiment of the present invention to get three output signals.

In addition, the base 48 has cut portions 53 and 54, and the cut base 48 has a dimension of width $W_5$ (tines side) and width $W_6$ (opposite side to the tines side). Also, the cut base 48 has a length $l_4$ between one of the cut portions and the side opposite to the tines side, and the length $l_4$ is greater than 0.03 mm and less than 0.48 mm, preferably, within a range of 0.05 mm to 0.3 mm, more preferably, 0.12 mm to 0.25 mm to reduce energy losses which are caused by vibration. In addition, when a length $l_5$ is defined by $l_5=l_2-l_4$, $l_4$ is less than or equal to $l_5$ to achieve the decreased energy losses. When the base 48 is mounted at a mounting portion (e.g. on two lead wires for a package of a tubular type) of a case or a lid of a surface mounting type or a tubular type by solder or conductive adhesives, it is necessary to satisfy $W_6 \geqq W_5$ to decrease energy losses by vibration. The cut portions 53 and 54 are very effective to decrease the energy losses. Therefore, the flexural mode, quartz crystal tuning fork resonator, capable of vibrating in the fundamental mode and having the high frequency stability (high time accuracy) can be provided with a small series resistance $R_1$ and a high quality factor $Q_1$. Also, the width dimensions $W=W_1+W_2+W_3$ and $W_4$, and the length dimensions $l_1$, $l_2$ and $l$ are as already described in relation to FIG. 6. In addition, a shape of the tuning fork base according to the present invention is not limited to that of this embodiment, for example, a tuning fork base may have a frame portion protruding from the tuning fork base, and the frame portion is mounted at a mounting portion of a case or a lid of a package. The matter described above implies that, for example, when the tuning fork tines have a first tuning fork tine and a second tuning fork tine, the first tuning fork tine is between the second tuning fork tine and the frame portion protruding from the tuning fork base as shown in FIG. 15 which shows a plan view of a quartz crystal unit and omitting a lid. In more detail, the quartz crystal unit 250 comprises a quartz crystal tuning fork resonator 255 capable of vibrating in a flexural mode of an inverse phase, a case 256 for housing the resonator and a lid for covering an open end of the case (not shown here). Namely, the resonator 255 comprises tuning fork tines 257, 258 and a tuning fork base 259 connected to the tuning fork tines, and the tuning fork base 259 has a frame portion 260 protruding from the tuning fork base. Also, the case 256 has mounting portions 261 and 262, and the frame portion 260 is mounted on the mounting portion 261 of the case 256. In detail, an electrode 267 disposed at the frame portion 260 is connected to an electrode 268 disposed on the mounting portion 261 by adhesives 263 or a metal such as solder, and similarly, an electrode 269 disposed on the tuning fork base 259 is connected to an electrode 270 disposed on the mounting portion 262 by adhesives 264 or a metal such as solder. In addition, the tuning fork tines 257, 258 have grooves 271, 273 (not shown here), 272 and 274 (not shown here), the grooves 271 and 272 are formed opposite to the grooves 273 and 274 in the thickness direction, respectively. The electrodes 271a and 273a disposed inside the grooves 271 and 273 of the tine 257 are connected to the electrodes 275 and 276 disposed on side surfaces of the tine 258 to define a first electrode terminal, while the electrodes 272a and 274a disposed inside the grooves 272 and 274 of the tine 258 are connected to the electrodes 277 and 278 disposed on side surfaces of the tine 257 to define a second electrode terminal. Moreover, each of the tines 257, 258 has a width W which is a first width of a first vibrational portion and a width $W_g$ which is a second width of a second vibrational portion, greater than the width W, preferably, the width $W_g$ is less than three times of the width W to get a small motional inductance $L_1$. As a result of which the tuning fork resonator can be provided with a smaller size because the width $W_g$ operates as mass and a short length of the tuning fork tines can be obtained for a frequency of oscillation, e.g. 32.768 kHz. For example, when the width W is larger than 0.03 mm and less than 0.075 mm, the width $W_g$ is larger than 0.04 mm and less than 0.23 mm. For example, a difference ($W_g$−W) is within a range of 0.008 mm to 0.1 mm, preferably, 0.01 mm to 0.05 mm to get enough mass effect. Also, each of the tines 257, 258 has a length $l_g$ less than about 80% of a length of each of the tines measured from the free end of each of the tines. This is the reason why when each of the tines has the width W with a frequency, e.g. 32.8 kHz with the length $l_g$=0, about the same frequency can be obtained as the frequency of 32.8 kHz for the width W by forming the length $l_g$ of about 80%. Namely, the tuning fork resonator can be obtained with a small motional inductance $L_1$ because the width of the tines becomes larger actually and the electromechanical transformation efficiency gets larger. In order to get a large mass effect by the length $l_g$, each of the tines, preferably, has the length $l_g$ less than a half of the length of each of the tines measured from the free end of each of the tines. For example, the length $l_g$ is larger than 0.15 mm and less than 1.1 mm, preferably, larger than 0.2 mm and less than 0.7 mm. In general, metal films for adjusting an oscillation frequency of the resonator are formed on main surfaces having the width $W_g$, and the oscillation frequency is adjusted by trimming at least one of the metal films. In addition, the tuning fork base has cut portions 265, 266 and the length $l_4$, and the frame portion is connected to the tuning fork base having the length $l_4$. In addition, another example is shown in FIG. 16 which shows a plan view of a quartz crystal unit and omitting a lid. In more detail, the quartz crystal unit 350 comprises a quartz crystal tuning fork resonator 355 capable of vibrating in a flexural mode of an inverse phase, a case 356 for housing the resonator and a lid for covering an open end of the case (not shown here). Namely, the resonator 355 comprises tuning fork tines 357, 358 and a tuning fork base 359 connected to the tuning fork tines, and the tuning fork base 359 has two frame portions 360a, 360b protruding from the tuning fork base. Also, the case 356 has mounting portions 361 and 362, and the frame portions 360a and 360b is, respectively, mounted on the mounting portion 361 and 362 of the case 356. In detail, an electrode 367 disposed at the frame portion 360a is connected to an electrode 368 disposed on the mounting portion 361 by adhesives 363 or a metal such as solder, and similarly, an electrode 369 disposed at the frame portion 360b is connected to an electrode 370 disposed on the mounting portion 362 by adhesives 364 or a metal such as solder. In addition, the tuning fork base has two cut portions 365 and 366, the tuning fork tines 357, 358 have the same as the grooves, the electrodes and the shape of the tuning fork tines shown in FIG. 15. When the quartz crystal tuning fork resonator 355 in this embodiment is formed in a quartz crystal wafer, an end portion of the frame portion 360a is not connected to an end portion of the frame portion 360b, as is shown in FIG. 16, but the present invention is not limited to this, namely, the end portion of the frame portion 360a may be connected to the end portion of the frame portion 360b to get a connected (closed) frame portion. In detail, the connected (closed) frame portion comprises one end portion and the other end portion each connected to the tuning fork base. Also, each of the connected frame portion and the tuning fork base has an obverse face and a reverse face, namely, a first surface and a second surface opposite the first surface. In this case, a quartz crystal unit comprises a case and a lid, and each of the case and the lid has an interior space and an open end. Also, the reverse face (the second surface) of each of the connected frame portion and the tuning fork base is mounted on a mounting portion of the case and the obverse face (the first surface) of each of the connected frame portion and the tuning fork base is mounted on a mounting portion of the lid, namely, the reverse face (the second surface) of each of the connected frame portion and the tuning fork base is connected to the open end of the case and the obverse face (the first surface) of each of the connected frame portion and the tuning fork base is connected to the open end of the lid to cover the open end of each of the case and the lid. A width of the open end of each of the lid and the case is less, preferably, equal to, more preferably, greater than a width of the connected frame portion or the tuning fork base to get a big connected power. When each of the case and the lid has no through hole, at least one of the open end of the case and open end of the lid is connected to the corresponding one of the obverse and reverse faces of each of the connected frame portion and the tuning fork base so that the quartz crystal tuning fork resonator is maintained in a vacuum, and when one of the case and the lid has a through hole including a first diameter and a second diameter greater than the first diameter, a metal or a glass is disposed into the through hole of the second diameter to close the through hole of one of the case and the lid in a vacuum after the open end of each of the case and the lid is connected to the corresponding one of the obverse and reverse faces of each of the connected frame portion and the tuning fork base. As above-described, the tuning fork base is located between the open end of the case and the open end of the lid, for example, in FIG. 7, a part having an area of $W_6 \text{xl}_4$ of the tuning fork base is located between the open end of the case and the open end of the lid. It is needless to say that the quartz crystal tuning fork tines are located between the interior space of the case and the interior space of the lid. Also, the connection of the open end of the case is performed simultaneously with the connection of the open end of the lid, but, according to the present invention, the connection of the open end of the case may be performed in a step different from the connection of the open end of the lid, namely, the connection of the open end of the case is performed after or before the connection of the open end of the lid is performed. Also, a first electrode (metal film) is disposed on each of a surface of the open end of the lid and the obverse face of each of the connected frame portion and the tuning fork base and a second electrode (metal film) is disposed on each of a surface of the open end of the case and the reverse face of each of the connected frame portion and the tuning fork base. The lid is connected to the connected frame portion and the tuning fork base through the first electrode disposed on the surface of the open end and the first electrode disposed on the obverse face, while the case is connected to the connected frame portion and the tuning fork base through the second electrode disposed on the surface of the open end and the second electrode disposed on the reverse face. Namely, each of the connection of the lid and the connected frame portion and the tuning fork base and the connection of the case and the connected frame portion and the tuning fork base is performed by an anode connection method. In addition, the first electrode disposed on each of the surface of the open end and the obverse face has an electrical polarity opposite to an electrical polarity of the second electrode disposed on each of the surface of the open end and the reverse face. Also, the case and the lid are made of a piezoelectric material such as quartz crystal or a glass or ceramics and have a thermal expansion coefficient less than that of the quartz crystal tuning fork resonator. In addition, a further example is shown in FIG. 17 which shows a plan view of a quartz crystal unit and omitting a lid. In more detail, the quartz crystal unit 450 comprises a quartz crystal tuning fork resonator 455 capable of vibrating in a flexural mode of an inverse phase, a case 456 for housing the resonator and a lid for covering an open end of the case (not shown here). Namely, the resonator 455 comprises tuning fork tines 457, 458 and a tuning fork base 459 connected to the tuning fork tines, and the tuning fork base 459 has a frame portion 460 protruding from the tuning fork base. Also, the case 456 has mounting portions 461, and the frame portion 460 is mounted on the mounting portion 461 of the case 456. In detail, an electrode 467 disposed at the frame portion 460 is connected to an electrode 468 disposed on the mounting portion 461 by adhesives 463 or a metal such as solder, and similarly, an electrode 469 disposed at the frame portion 460 is connected to an electrode 470 disposed on the mounting portion 461 by adhesives 464 or a metal such as solder. In addition, the tuning fork tines 457, 458 have the same as the grooves and the electrodes shown in FIG. 14. Namely, the frame portion protruding from the tuning fork base is between the first tuning fork tine and the second tuning fork tine, and is mounted on the mounting portion of the case. In addition, when each of the first and second tuning fork tines has a mass $M_t$ and the frame portion has a mass $M_f$, a summation of $(2M_t+M_f)$ is greater than a mass $M_b$ of the tuning fork base having a length $l_2$ to get good shock-proof, preferably, a summation of $(2M_t+M_f/2)$ is greater than a mass $M_b$ of the tuning fork base to get further good shock-proof. In addition, an example of a flexural mode resonator 700 capable of vibrating in a flexural mode is shown in FIG. 26, and which shows a plan view of the flexural mode resonator 700 of an embodiment of the present invention to construct a unit, an oscillator and an electronic apparatus of the present invention. Namely, the unit comprises the flexural mode resonator housed in a case and a lid to cover an open end of the case. In detail, the flexural mode resonator is formed integrally with the case (not shown here). Also, the oscillator comprises the unit and the electronic apparatus comprises the oscillator. In detail, the resonator 700 comprises vibrational arms 701, 702, connecting frames 703, 704, 705, 706 and a frame 715. Each of the vibrational arms 701, 702 has a length $L_n$ and a width $W_s$ greater than a width $W_f$ and a width $W_t$, in general, there is a relationship of $W_f = W_t$. Also, one end portion of each of the vibrational arms 701, 702 is connected to the connecting frame 703 and the other end portion of each of the vibrational arms 701, 702 is connected to the connecting frame 704. Namely, the resonator 700 comprises a boundary condition of "clamped-clamped", so called a clamped-clamped type resonator and vibrates in a flexural mode, e.g. in the width direction in this embodiment. By taking the width $W_s$ greater than the width $W_f$ and the width $W_t$, the resonator vibrates in a flexural mode with a high stability of frequency because it has the maximum amplitude in the vicinity of half a length $(L_n/2)$ and has a large moment of inertia. In addition, each of the connecting frames 703, 704 is connected to the connecting frames 705, 706, the connecting frames 705, 706 have electrodes 707, 710 and the frame 715 has electrodes 708, 709, while the vibrational arm 701 has electrodes 711, 712 and the vibrational arm 702 has electrodes 713, 714. Also, though the width $W_s$ is greater than the width $W_f$ and the width $W_t$ in this embodiment, the width $W_s$ may be equal to the width $W_f$ and the width $W_t$, where $W_f = W_t$. In addition, FIG. 27 shows a Me-Me' cross-sectional view of the flexural mode resonator of FIG. 26. Each of the vibrational arms 701, 702 has a first side surface and a second side surface opposite the first side surface. The electrodes 711, 712 are disposed on the first and second side surfaces of the vibrational arm 701 and the electrodes 713, 714 are disposed on the first and second side surfaces of the vibrational arm 702. The first side surface of the vibrational arm 701 is formed opposite to a side surface of the connecting frame 705 so that a spaced-apart distance between the first side surface and the side surface is less than 1.5 μm, preferably, in the range of 0.25 μm to 0.8 μm, and the electrode 707 is disposed on the side surface of the connecting frame 705, while the second side surface of the vibrational arm 701 is formed opposite to a side surface of the frame 715 and the electrode 708 is disposed on the side surface of the frame 715. Similar to this, the first side surface of the vibrational arm 702 is formed opposite to a side surface of the connecting frame 706 and the electrode 710 is disposed on the side surface of the connecting frame 706, while the second side surface of the vibrational arm 702 is formed opposite to a side surface of the frame 715 and the electrode 709 is disposed on the side surface of the frame 715. The electrodes 711, 714 have the same electrical polarity to define a first electrode terminal A and the electrodes 712, 713 have the same electrical polarity to define a second electrode terminal B. In addition, the electrodes 707, 708, 709, and 710 have the same electrical polarity and are connected to an electrode terminal of a bias voltage 716 (a plus voltage in this embodiment), where an electrode terminal of a minus voltage is connected to an earth electrode (ground) C in this embodiment. Each of the electrodes 707, 708, 709, 710 is disposed extending to an obverse face and a reverse face of each of the connecting frames 705, 706 and the frame 715 and each of the electrodes 711, 712, 713, 714 is disposed extending to an obverse face and a reverse face of each of the vibrational arms 701, 702. But, according to this invention, the electrodes 707, 708, 709, and 710 may be connected to the electrode terminal of the bias voltage having either the plus voltage or the minus voltage. When an alternating current voltage is applied between the first electrode terminal A and the second electrode terminal B, an electrostatic force, so called "Coulomb's force" occurs between the bias voltage and the electrode disposed on each of the first and second side surfaces of the vibrational arms. As a result, each of the vibrational arms 701, 702 vibrates in a flexural mode. Namely, the resonator 700 can vibrate in a flexural mode of an inverse phase in this embodiment. In order to decrease a shunt capacitance in an electrical equivalent circuit which generates between the electrodes, a method for connecting the electrodes shown in FIG. 27 and the polarity of the electrodes may be changed. In more detail, the electrodes 711, 712, 713, and 714 are electrically connected to an electrode terminal of a bias voltage having either a plus voltage or a minus voltage, the electrodes 707 is electrically connected to the electrode 710 to define a first electrode terminal and the electrodes 708 is electrically connected to the electrode 709 to define a second electrode terminal. An alternating current voltage is applied between the first and second electrode terminals to drive the vibrational arms in a flexural mode of an inverse phase in this embodiment. As a result, the resonator can be achieved with a decreased shunt capacitance. As is apparent from FIG. 27, when the electrode with the bias voltage is disposed opposite to the electrode disposed on each of the first and second side surfaces of each of the vibrational arms, an alternating current voltage is applied between the electrodes disposed on the first and second side surfaces of each of the vibrational arms. On the contrary, when the electrode with the bias voltage is disposed on each of the first and second side surfaces of each of the vibrational arms, an alternating current voltage is applied between the electrode disposed opposite to each of the first side surfaces of the vibrational arms and the electrode disposed opposite to each of the second side surfaces of the vibrational arms. In other words, when the electrode disposed opposite to the electrode of the first side surface of the vibrational arm and the electrode of the first side surface of the vibrational arm are disposed so that an attractive force occurs between them, the electrode disposed opposite to the electrode of the second side surface of the vibrational arm and the electrode of the second side surface of the vibrational arm are disposed so that a repulsive force occurs between them, inversely, when the electrode disposed opposite to the electrode of the first side surface of the vibrational arm and the electrode of the first side surface of the vibrational arm are disposed so that the repulsive force occurs between them, the electrode disposed opposite to the electrode of the second side surface of the vibrational arm and the electrode of the second side surface of the vibrational arm are disposed so that the attractive force occurs between them. As a result, the vibrational arm can vibrate in a flexural mode. In the electrode disposition of this embodiment shown in FIG. 26, the resonator can vibrate in a fundamental mode of a flexural mode. In order that the resonator vibrates in an overtone mode easily, a plurality of electrodes are disposed on at least one, preferably, each of the first and second side surfaces of the vibrational arms, e.g. when the resonator vibrates in a second overtone mode, two electrodes are disposed on at least one, preferably, each of the first and second side surfaces of the vibrational arms, and each of the two electrodes has an electrode opposite to each of the two electrodes. Similar to this, when the resonator vibrates in a third overtone mode, three electrodes are disposed on at least one, preferably, each of the first and second side surfaces of the vibrational arms, and each of the three electrodes has an electrode opposite to each of the three electrodes. As is apparent from this relation, when the resonator vibrates in an n-order overtone mode, n-electrodes are disposed on at lest one, preferably, each of the first and second side surfaces of the vibrational arms, and each of the n-electrodes has an electrode opposite to each of the n-electrodes, where n has a value of 2, 3, 4, 5, 6, 7, etc. In detail, when the plurality of electrodes are disposed on at least one, preferably, each of the first and second side surfaces of the vibrational arms, the electrodes adjoining each other, disposed on the first and second side surfaces of the vibrational arms have a different electrical polarity. Namely, the plurality of electrodes and the electrode opposite to each of the plurality of electrodes are disposed so that the attractive force and the repulsive force occurs alternately to the vibrational arms to drive the n-order overtone mode. In this embodiment, though the plurality of electrodes are disposed on the first and second side surfaces of the vibrational arms, the plurality of electrodes are disposed opposite to the electrode of each of the first and second side surfaces of the vibrational arms, when a bias voltage is applied to the electrode of each of the first and second side surfaces of the vibrational arms. In addition, FIG. 28 shows a plan view of a flexural mode resonator of another embodiment of the present invention to construct a unit, an oscillator and an electronic apparatus of the present invention. Namely, the unit comprises the flexural mode resonator housed in a case and a lid to cover an open end of the case. In detail, the flexural mode resonator is formed integrally with the case (not shown here). Also, the oscillator comprises the unit and the electronic apparatus comprises the oscillator. In detail, the resonator 720 comprises a vibrational arm 721, a base portion 722 and connecting frames 723, 724. The vibrational arm 721 has a length $L_n$ and a width $W_s$ greater than a width $W_f$. Also, one end portion of the vibrational arm 721 is connected to the base portion 722 and the other end portion is free in vibration. Namely, the resonator 720 comprises a boundary condition of "clamped-free", so called a clamped-free type resonator and vibrates in a flexural mode, e.g. in the width direction in this embodiment. The base portion 722 of the resonator 720 is connected to the case in which the resonator is housed. Namely, the resonator comprising the vibrational arm, the base portion and the connecting frames is formed integrally with the case. Likewise, according to the present invention, the vibrational arm may be directly connected to the case. By taking the width $W_s$ greater than the width $W_f$, the resonator vibrates in a flexural mode with a high stability of frequency because it has the maximum amplitude at the free end portion and has a large moment of inertia. In addition, each of the connecting frames 723, 724 is connected to the base portion 722, and the connecting frames 723, 724 have electrodes 725, 726, while the vibrational arm 721 has electrodes 727, 728. Also, though the width $W_s$ is greater than the width $W_f$ in this embodiment, the width $W_s$ may be equal to or less than the width $W_f$ to get an enough shock-proof. In addition, FIG. 29 shows a Ms-Ms' cross-sectional view of the flexural mode resonator of FIG. 28. The vibrational arm 721 has a first side surface and a second side surface opposite the first side surface. The electrode 727 is disposed on the first side surface of the vibrational arm 721 to define a first electrode terminal D and the electrode 728 is disposed on the second side surface of the vibrational arm 721 to define a second electrode terminal E. The first side surface of the vibrational arm 721 is formed opposite to a side surface of the connecting frame 723 and the electrode 725 is disposed on the side surface of the connecting frame 723, while the second side surface of the vibrational arm 721 is formed opposite to a side surface of the connecting frame 724 and the electrode 728 is disposed on the side surface of the connecting frame 724. Each of the electrodes 725, 726 is disposed extending to an obverse face and a reverse face of each of the connecting frames 723, 724 and each of the electrodes 727, 728 is disposed extending to an obverse face and a reverse face of the vibrational arm 721. In addition, the electrodes 725, 726 have the same electrical polarity and are connected to an electrode terminal of a bias voltage 729 (a plus voltage in this embodiment), where an electrode terminal of a minus voltage is connected to an earth electrode (ground) F in this embodiment. But, according to this invention, the electrodes 725, 726 may be connected to the electrode terminal of either the plus voltage or the minus voltage. When an alternating current voltage is applied between the first electrode terminal D and the second electrode terminal E, an electrostatic force occurs between the bias voltage and the electrode disposed on each of the first and second side surfaces of the vibrational arm. As a result of which the vibrational arm 721 vibrates in a flexural mode. In order to decrease a shunt capacitance in an electrical equivalent circuit which generates between the electrodes, according to the present invention, a method for connecting the electrodes shown in FIG. 29 and the polarity of the electrodes may be changed. In more detail, the electrodes 727, 728 are electrically connected to an electrode terminal of a bias voltage of either a plus voltage or a minus voltage, the electrode 725 is disposed on the side surface of the connecting frame 723 to define a first electrode terminal and the electrode 726 is disposed on the side surface of the connecting frame 724 to define a second electrode terminal. An alternating current voltage is applied between the first and second electrode terminals to drive the vibrational arm in a flexural mode. As a result of which the resonator can be achieved with a decreased shunt capacitance. As is apparent from FIG. 29, when the electrode with the bias voltage is disposed opposite to the electrode disposed on each of the first and second side surfaces of the vibrational arm, an alternating current voltage is applied between the electrodes disposed on the first and second side surfaces of the vibrational arm. On the contrary, when the electrode with the bias voltage is disposed on each of the first and second side surfaces of the vibrational arm, an alternating current voltage is applied between the electrode disposed opposite to the first side surface of the vibrational arm and the electrode disposed opposite to the second side surface of the vibrational arm. In other words, when the electrode disposed opposite to the electrode of the first side surface of the vibrational arm and the electrode of the first side surface of the vibrational arm are disposed so that an attractive force occurs between them, the electrode disposed opposite to the electrode of the second side surface of the vibrational arm and the electrode of the second side surface of the vibrational arm are disposed so that a repulsive force occurs between them, inversely, when the electrode disposed opposite to the electrode of the first side surface of the vibrational arm and the electrode of the first side surface of the vibrational arm are disposed so that the repulsive force occurs between them, the electrode disposed opposite to the electrode of the second side surface of the vibrational arm and the electrode of the second side surface of the vibrational arm are disposed so that the attractive force occurs between them. As a result, the vibrational arm can vibrate in a flexural mode. In the electrode disposition of this embodiment shown in FIG. 28, the resonator can vibrate in a fundamental mode of a flexural mode. In this embodiment, the resonator comprises a vibrational arm, but the resonator of the present invention may comprise a plurality of vibrational arms, e.g. a tuning fork shape comprising a tuning fork base and first and second tuning fork arms connected to the tuning fork base, and the tuning fork base may have cut portions. In this case, a resonator of the tuning fork shape vibrates in a flexural mode, preferably, in the flexural mode of an inverse phase, and the electrodes to drive the flexural mode of the inverse phase are disposed similar to the electrodes shown in FIG. 26 and FIG. 27 and similar to the matters described in FIG. 26 and FIG. 27. Moreover, the resonator of the tuning fork shape comprises a plurality of mounting frames having a first frame and a second frame which protrude from opposite side surfaces of the tuning fork base, respectively, and preferably, an end portion of the first frame is connected to an end portion of the second frame and the first and second frames are mounted on a mounting portion of a case or the first and second frames are formed with the case integratedly. In addition, an oscillation frequency f of the flexural mode resonator is generally defined by $f=KW/L^2$, where W and L is a width and a length of a vibrational arm, respectively, and K is basically determined by a boundary condition, an order of vibration and a material constant of the flexural mode resonator. According to the present invention, the width W has a value of 0.001 mm to 0.045 mm, preferably, 0.003 mm to 0.035 mm, more preferably, 0.005 mm to 0.025 mm and a ratio W/L is within a range of $2\times10^{-3}$ to $2.5\times10^{-1}$ to get an enough shock-proof and to achieve a small-sized flexural mode resonator with a high quality factor. In order to achieve a further small-sized flexural mode resonator with an enough high quality factor, the width W has a value of less than 1 μm, preferably, greater than 0.35 μm because an oscillation frequency of the flexural mode resonator is proportional to the width W. In addition, when an output signal of an oscillating circuit comprising the flexural mode resonator of one of the embodiments described above is used as a clock signal for use in operation of the electronic apparatus to display time information, the flexural mode resonator, preferably, comprises a clamped-free type resonator or a tuning fork type resonator and an oscillation frequency of the output signal is about 32.768 kHz with a frequency deviation within a range of −950 ppm to +950 ppm, preferably, −100 ppm to +100 ppm, more preferably, −50 ppm to +50 ppm. In more detail, when the resonator has a nominal frequency of 32.768 kHz, the smaller the frequency deviation to the nominal frequency becomes, the smaller the time error of the output signal becomes, e.g. when the frequency deviation has 10 ppm, the time error of the output signal becomes about 26 seconds per a month in the calculation. According to the present invention, the flexural mode resonator may comprise a boundary condition of "free-free". In addition, the flexural mode resonator having the boundary condition of "clamped-clamped" or "clamped-free" or "free-free" described above is formed by an epitaxial growth method. Though a metal film is formed on neither an obverse face or a reverse face opposite the obverse face of the flexural mode resonator shown in FIG. 26 or FIG. 28 to adjust an oscillation frequency thereof, the metal film is actually formed on at least one of the obverse and reverse faces of each of the vibrational arms or at least one of the obverse and reverse faces of the vibrational arm of the flexural mode resonator to adjust the oscillation frequency thereof. In detail, the oscillation frequency is adjusted by forming the metal film on at least one of the obverse and reverse faces of each of the vibrational arms or by forming the metal film on at least one of the obverse and reverse faces of the vibrational arm or by trimming the metal film formed on at least one of the obverse and reverse faces of each of the vibrational arms or by trimming the metal film formed on at least one of the obverse and reverse faces of the vibrational arm. As a result of which, e.g. when the flexural mode resonator comprises the clamped-free type resonator, the clamped-free resonator has the oscillation frequency of about 32.768 kHz with the frequency deviation in the range of −950 ppm to +950 ppm or −100 ppm to +100 ppm or −50 ppm to +50 ppm. In addition, the flexural mode resonators shown in FIG. 26 and FIG. 28 may be used as a sensor for sensing angular velocity or pressure or temperature. As a further another example, when the flexural mode resonator comprises the clamped-clamped type resonator or the free-free type resonator, the resonator has the oscillation frequency higher than 65 kHz to get the resonator small-sized. As a result of which it is very easy to get an output signal with the oscillation frequency in the range of 500 kHz to 150 MHz by construction of circuits shown in FIG. 30 and FIG. 32 each of which will describe in detail below. A block diagram comprised of a plurality of circuits is shown in FIG. 30 to get an output signal according to the present invention. The block diagram comprises an oscillating circuit (OSC) 730, a buffer circuit (B/C), dividing circuits of frequency (frequency dividers) (1/R, 1/N), a phase detector (P/D) and a voltage controlled oscillator (VCO). The OSC 730 comprises a resonator 732 and a temperature compensated circuit 731 having a varactor (varicap) diode, a capacitor and a resistor. Also, the resonator 732 comprises the clamped-clamped type resonator capable of vibrating in a flexural mode shown in FIG. 26 or the clamped-free type resonator capable of vibrating in a flexural mode shown in FIG. 28 or the free-free type resonator capable of vibrating in a flexural mode. In more detail, an output signal of the OSC 730 having an oscillation frequency is output through the buffer circuit (B/C), namely, the oscillation frequency of the OSC 730 is the same as an oscillation frequency defined by $p_f$ which is at a point p shown by an arrow and there is a relationship of $a_f = p_f/R$ and $b_f = c_f/N$, where $a_f$, $b_f$ and $c_f$ show an oscillation frequency which is at points a, b and c shown by arrows, respectively. Furthermore, there is a relationship of $c_f = N \times p_f/R$ by using the relation of $a_f = b_f$. In detail, a voltage of the VCO changes so that $a_f$ is equal to $b_f$ from information of the P/D. A block diagram comprising the dividing circuits of frequency (frequency dividers) (1/R, 1/N), the phase detector (P/D) and the voltage controlled oscillator (VCO) is defined by a phase locked loop (PLL) circuit here (in this invention). Thus, an output signal having the oscillation frequency $c_f$ can be obtained with a high stability of frequency by comprising the PLL circuit of this embodiment. For example, when $p_f$ is 1 MHz, R is 10 and N is 1000, $c_f$ has 100 MHz. As is apparent from this result, the output signal having an arbitrary oscillation frequency can be obtained by selecting N, R and $p_f$ of the PLL circuit. Furthermore, the OSC comprises an amplification circuit having an amplifier (CMOS inverter) and a feedback resistor, and a feedback circuit having the flexural mode resonator, a drain resistor, a plurality of capacitors and the temperature compensated circuit. Therefore, when the flexural mode resonator has a comparatively large first order temperature coefficient $\alpha_t$ e.g. $1.5 \times 10^{-5}$ to $3.2 \times 10^{-5}$ in the absolute value, the first order temperature coefficient at reaches approximately zero by compensating the $\alpha_t$ using the temperature compensated circuit. As the result, the flexural mode resonator can be obtained with good frequency temperature behaviour e.g. frequency deviation of −30 ppm to +30 ppm in a wide temperature range of −30° C. to +80° C. because the second and third order temperature coefficients $\beta_t$, $\gamma_t$ get small in the absolute value, e.g. $\beta_t$ is less than $1 \times 10^{-7}$ in the absolute value and $\gamma_t$ is less than $8 \times 10^{-11}$ in the absolute value, when the at is large comparatively. In addition, another block diagram comprised of a plurality of circuits is shown in FIG. 31 to get a plurality of output signals according to the present invention. The block diagram comprises an oscillating circuit (OSC) 740, a buffer circuit (B/C) and a dividing circuit of frequency (frequency divider) (1/R). The oscillating circuit (OSC) 740 comprises a resonator 742 and a temperature compensated circuit 741. Also, the resonator 742 comprises the flexural mode resonator already described in FIG. 30 and the OSC 740 comprises the amplification circuit and the feedback circuit of the OSC 730 already described in FIG. 30. In this embodiment, output 1 which is a first output signal is output from the OSC 740 through the buffer circuit and output 2 which is a second output signal is output from the OSC 740 through the buffer circuit and the dividing circuit. Like this, the first and second output signals each having an oscillation frequency can be obtained and the oscillation frequency of the first output signal is naturally different from that of the second output signal. In addition, a still another block diagram comprised of a plurality of circuits is shown in FIG. 32 to get a plurality of output signals according to the present invention. The block diagram comprises an oscillating circuit (OSC) 750, a buffer circuit (B/C), a plurality of dividing circuits of frequency (a plurality of frequency dividers) (1/R, 1/N), a phase detector (P/D) and a voltage controlled oscillator (VCO). The OSC 750 comprises a resonator 752 and a temperature compensated circuit 751. In other words, the block diagram comprises the OSC 750, the B/C, the dividing circuit of frequency (frequency divider) (1/R) and a PLL circuit. Also, the resonator 752 comprises the flexural mode resonator already described in FIG. 30 and the OSC 750 comprises the amplification circuit and the feedback circuit of the OSC 730 already described in FIG. 30. Namely, each of the OSC 740 in FIG. 31 and the OSC 750 in FIG. 32 is the same as the OSC 730 in FIG. 30. In this embodiment, output 1 which is a first output signal is output from the OSC 750 through the B/C, output 2 which is a second output signal is output from the OSC 750 through the buffer circuit and the dividing circuit, and output 3 which is a third output signal is output from the OSC 750 through the buffer circuit and the PLL circuit. Thus, the first, second and third output signals can be obtained with an oscillation frequency different, respectively, by construction of the circuits of FIG. 32. In the embodiments, the electrostatic force is used to get the attractive force and the repulsive force between the opposite side surfaces, but according to the present invention, a magnetic force may be used instead of the electrostatic force. Namely, the attractive force can be obtained by two different magnetic poles, e.g. N-S poles or S-N poles, while the repulsive force can be obtained by two same magnetic poles, e.g. N-N poles or S-S poles. In addition, it is needless to say that the present invention includes the flexural mode resonator capable of vibrating in a flexural mode by a combination of the electrostatic force and the magnetic force. Also, the clamped-clamped type resonator, the clamped-free type resonator and the free-free type resonator shown in the embodiments of the present invention may be called a clamped-clamped beam resonator, a clamped-free beam resonator and a free-free beam resonator, respectively.

FIG. 8a and FIG. 8b are a top view and a side view for a length-extensional mode quartz crystal resonator which is one of a contour mode resonator, constructing a quartz crystal oscillator, which constructs an electronic apparatus of the third embodiment of the present invention. The resonator 62 comprises a vibrational portion 63, connecting portions 66, 69 and supporting portions 67, 80 including respective mounting portions 68, 81. In addition, the supporting portions 67 and 80 have respective holes 67a and 80a. Also, electrodes 64 and 65 are disposed opposite each other on upper and lower faces of the vibrational portion 63, and the electrodes have opposite electrical polarities. Namely, a pair of electrodes is disposed on the vibrational portion. In this case, a fundamental mode vibration can be excited easily. In more detail of this embodiment, the resonator 62 has the vibrational portion 63, first and second supporting portions 67, 80, and first and second connecting portion 66, 69. Namely, the first supporting portion is connected to the vibrational portion through the first connecting portion, and the second supporting portion is connected to the vibrational portion through the second connecting portion, so that two supporting portions are constructed. Therefore, the two supporting portions may have the first supporting portion and the second supporting portion connected each other, namely, it is needless to say that the supporting portions of the present invention include the supporting portions connected each other.

In addition, the electrode 64 extends to the mounting portion 81 through the one connecting portion 69 and the electrode 65 extends to the mounting portion 68 through the other connecting portion 66. In this embodiment, the electrodes 64 and 65 disposed on the vibrational portion 63 extend to the mounting portions of the different direction each other. But, the electrodes may be constructed in the same direction. The resonator in this embodiment is mounted on fixing portions of a case or a lid at the mounting portions 68 and 81 by conductive adhesives or solder.

Here, a cutting angle of the length-extensional mode quartz crystal resonator is shown. First, a quartz crystal plate perpendicular to x axis, so called, X plate quartz crystal is taken. Length $L_0$, width $W_0$ and thickness $T_0$ which are each dimension of the X plate quartz crystal correspond to the respective directions of y, z and x axes.

Next, this X plate quartz crystal is, first, rotated with an angle $\theta_x$ of $-30°$ to $+30°$ about the x axis, and second, rotated with an angle $\theta_y$ of $-40°$ to $+40°$ about y' axis which is the new axis of the y axis. In this case, the new axis of the x axis changes to x' axis and the new axis of the z axis changes to z" axis because the z axis is rotated twice about two axes. The length-extensional mode quartz crystal resonator of the present invention is formed from the quartz crystal plate with the rotation angles.

In other words, according to an expression of IEEE notation, a cutting angle of the resonator of the present invention can be expressed by XYtl($-30°$ to $+30°$)/($-40°$ to $+40°$). By choosing a cutting angle of the resonator, a turn over temperature point $T_p$ can be taken at an arbitrary temperature. In this embodiment, length $L_0$, width $W_0$ and thickness $T_0$ correspond to y', z" and x' axes, respectively. But, when the X plate is rotated once about the x axis, the z" axis corresponds to the z' axis. In addition, the vibrational portion 63 has a dimension of length $L_0$ greater than width $W_0$ and thickness $T_0$ smaller than the width $W_0$. Namely, a coupling between length-extensional mode and width-extensional mode gets so small as it can be ignored, as a result of which, the quartz crystal resonator can vibrate in a single length-extensional mode.

Figure 18:
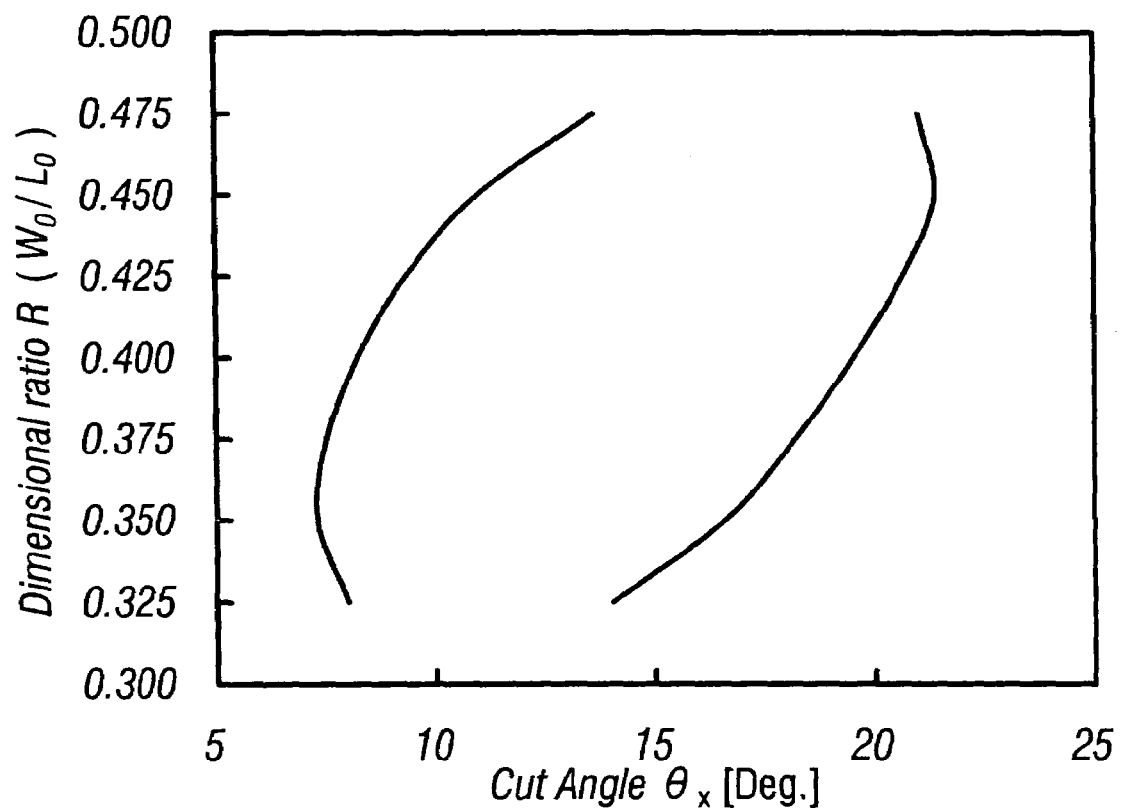
FIG. 18 shows a relationship between a dimensional ratio $R=W_0/L_0$ and a cut angle $\theta_x$ of a length extensional mode quartz crystal resonator to give a zero temperature coefficient.

In more detail, resonance frequency of the length-extensional mode resonator is inversely proportional to length $L_0$, and it is almost independent on such an other dimension as width $W_0$, thickness $T_0$, connecting portions and supporting portions. Also, in order to obtain a length-extensional mode quartz crystal resonator capable of vibrating in a fundamental mode with a frequency of 1 MHz to 10 MHz, the length $L_0$ is within a range of about 0.26 mm to about 2.7 mm. In addition, when a length-extensional mode resonator vibrates in an overtone mode, an odd number (n) pair of electrodes are disposed on a vibrational portion of the resonator, where n has a value of 1, 3, 5, . . . . In this case, the length $L_0$ is within a range of about (0.26 to 2.7) x n mm. Thus, the miniature length-extensional mode resonator can be provided with the frequency of 1 MHz to 10 MHz. In addition, FIG. 18 shows a relationship between a dimensional ratio $R=W_0/L_0$ and a cut angle $\theta_x$ of the length-extensional mode quartz crystal resonator to give a zero temperature coefficient, namely, when the ratio R is in the range of 0.325 to 0.475 and the cut angle $\theta_x$ is in the range of about 7° to about 22°, there are many zero temperature coefficients, where the cut angle $\theta_x$ is defined by XYt($\theta_x$) according to an expression of the IEEE notation. In addition, when the ratio R is in the range of 0.3 to 0.325 and 0.475 to 0.5, and the cut angle $\theta_x$ is in the range of 6° to 7° and 22° to 23°, there is a small first order temperature coefficient. Therefore, in order to get a turn over temperature point over a wide temperature range, the ratio R is in the range of 0.3 to 0.5, the cut angle of the resonator is within a range of XYt(6° to 23°).

Next, a value of a piezoelectric constant $e_{12}$ ($=e'_{12}$) is described, which is of great importance and necessary to excite a flexural mode, quartz crystal resonator and a length-extensional mode quartz crystal resonator of the present invention. The larger a value of the piezoelectric constant $e_{12}$ becomes, the higher electromechanical transformation efficiency becomes. The piezoelectric constant $e_{12}$ of the present invention can be calculated using the piezoelectric constants $e_{11}=0.171$ C/m² and $e_{14}=-0.0406$ C/m² of quartz crystal. As a result, the piezoelectric constant $e_{12}$ of the present invention is within a range of 0.095 C/m² to 0.19 C/m² approximately in an absolute value. It is, therefore, easily understood that this value is enough large to obtain a flexural mode, quartz crystal tuning fork resonator and a length-extensional mode quartz crystal resonator with a small series resistance $R_1$ and a high quality factor Q. Especially, in order to obtain a flexural mode, quartz crystal tuning fork resonator with a smaller series resistance $R_1$, the $e_{12}$ is within a range of 0.12 C/m² to 0.19 C/m² in the absolute value, and also, a groove and electrodes are provided on at least one of an obverse face and a reverse face of tuning fork tines so that when each tuning fork tine is divided into two portions (an inner portion located at a fork side and an outer portion located opposite to the fork side) versus a central line portion thereof, a value of $e_{12}$ of each portion of each tuning fork tine has an opposite sign each other. Namely, when the one of the two portions has $e_{12}$ of a plus sign, the other of the two portions has $e_{12}$ of a minus sign. In more detail, a groove and electrodes are provided at tuning fork tines so that a sign of $e_{12}$ of inner portions of each tuning fork tine is opposite to the sign of $e_{12}$ of outer portions of each tuning fork tine.

When an alternating current voltage is applied between the electrodes 64 and 65 shown in FIG. 8b, an electric field $E_x$ occurs alternately in the thickness direction, as shown by the arrow direction of the solid and broken lines in FIG. 8b. Consequently, the vibrational portion 63 is capable of extending and contracting in the length direction.

Figure 9:
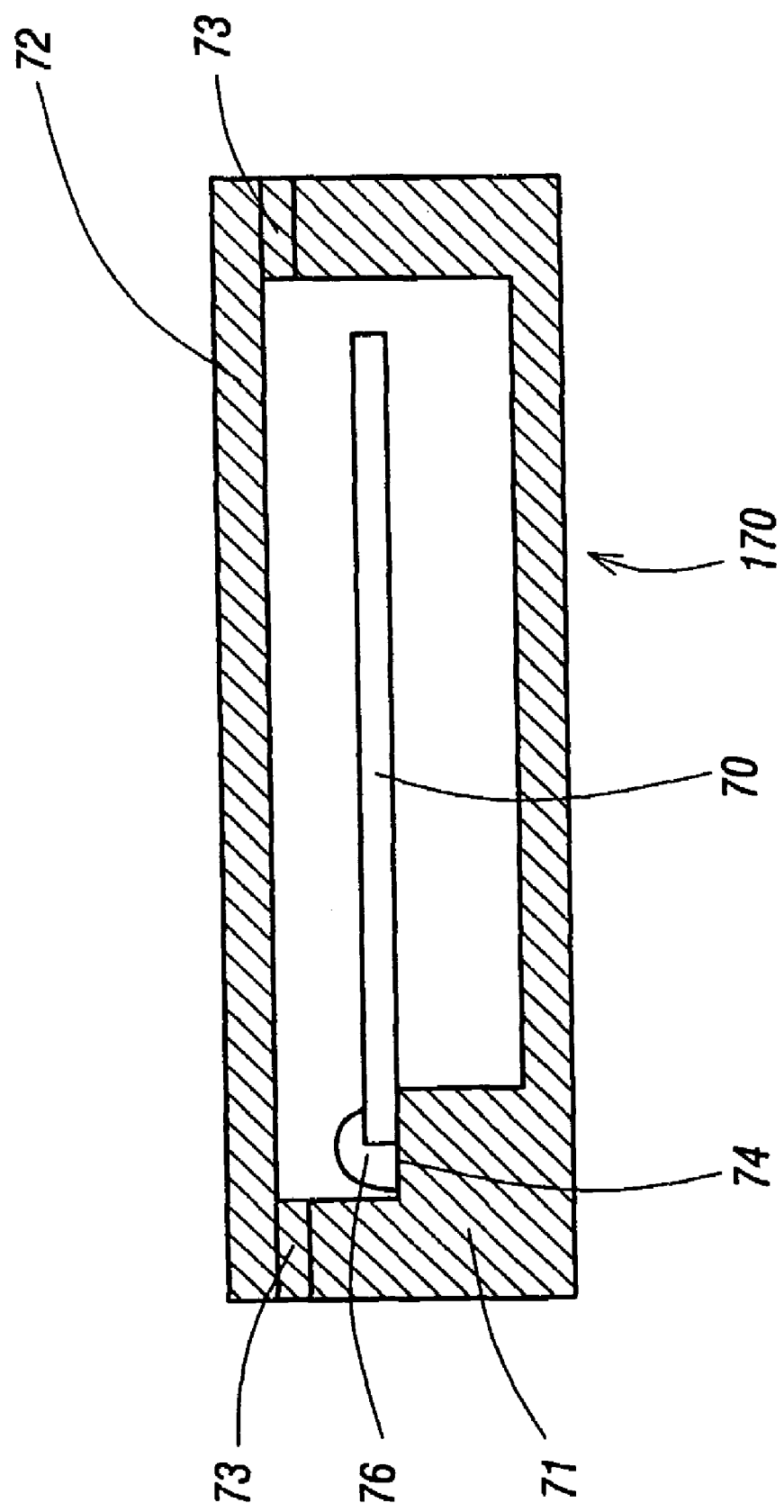
FIG. 9 shows a cross-sectional view of a quartz crystal unit constructing a quartz crystal oscillator, which constructs an electronic apparatus of the fourth embodiment of the present invention.

FIG. 9 shows a cross-sectional view of a quartz crystal unit constructing a quartz crystal oscillator, which constructs an electronic apparatus of the fourth embodiment of the present invention. The quartz crystal unit 170 comprises a contour mode quartz crystal resonator 70 or a thickness shear mode quartz crystal resonator 70, a case 71 and a lid 72. In more detail, the resonator 70 is mounted at a mounting portion 74 of the case 71 by conductive adhesives 76 or solder. Also, the case 71 and the lid 72 are connected through a connecting member 73. For example, the contour mode resonator 70 in this embodiment is the same resonator as one of the flexural mode, quartz crystal tuning fork resonators 10 and 45 described in detail in FIG. 4-FIG. 7. Also, in this embodiment, circuit elements are connected at outside of the quartz crystal unit to get a quartz crystal oscillator. Namely, only the quartz crystal tuning fork resonator is housed in the unit and also, it is housed in the unit in vacuum. In this embodiment, the quartz crystal unit of a surface mounting type is shown, but the quartz crystal tuning fork resonator may be housed in a unit of a tubular type, namely a quartz crystal unit of the tubular type. In other words, the quartz crystal unit of the tubular-type has a case having two lead wires which are a mounting portion of the case to mount the quartz crystal tuning fork resonator, and an open end of the case is connected to a lid to cover the open end of the case. Also, instead of the flexural mode, quartz crystal tuning fork resonator and the thickness shear mode quartz crystal resonator, one of a length-extensional mode quartz crystal resonator, a width-extensional mode quartz crystal resonator and a Lame mode quartz crystal resonator which are a contour mode resonator, respectively, or a SAW (Surface Acoustic Wave) resonator may be housed in the unit. For example, FIG. 19 shows a top view (a) and a C-C' cross-sectional view (b) of a vibrational portion 555 of a thickness shear mode quartz crystal resonator 550. The resonator 550 has a dimension of a length $L_0$, a width $W_0$ and a thickness $T_0$, and the length $L_0$ and the width $W_0$ is less than 2.4 mm and 1.6 mm, respectively, to achieve a smaller quartz crystal unit and to get a small series resistance $R_1$. Also, electrodes 556 and 557 are disposed on upper and lower surfaces so that the electrodes are opposite each other. In order to get a good frequency temperature behaviour at a room temperature at least, the resonator 550 has a cut angle within a range of YXl(34° to 36°) according to an expression of the IEEE notation. In addition, the present invention is not limited to the quartz crystal unit having the contour mode quartz crystal resonator or the thickness shear mode quartz crystal resonator in this embodiment, for example, the present invention also includes a quartz crystal unit having a piezoelectric filter, e.g. a SAW piezoelectric filter or a piezoelectric sensor, e.g. an angular velocity piezoelectric sensor. Namely, the piezoelectric material comprises one of $LiTaO_3$, $LiNbO_3$, $GaPO_4$, and so on which belong to a trigonal system in crystallographic classification.

In addition, a member of the case and the lid is ceramics or glass and a metal or glass, respectively, and a connecting member is a metal or glass with low melting point. Also, a relationship of the resonator, the case and the lid described in this embodiment is applied to a quartz crystal oscillator of the present invention which will be described in FIG. 10.

Figure 10:
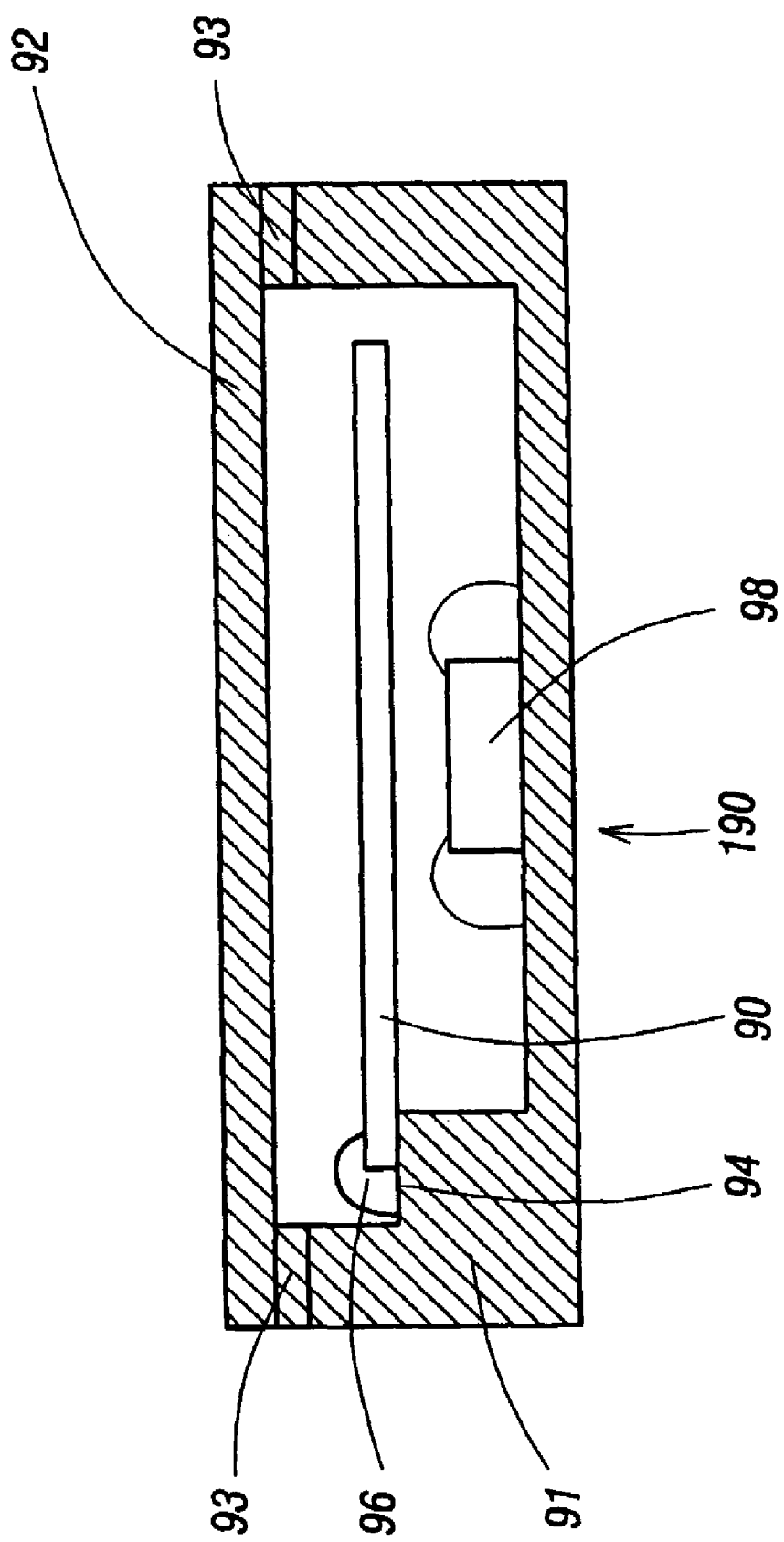
FIG. 10 shows a cross-sectional view of a quartz crystal oscillator, which constructs an electronic apparatus of the fifth embodiment of the present invention.

FIG. 10 shows a cross-sectional view of a quartz crystal oscillator, which constructs an electronic apparatus of the fifth embodiment of the present invention. The quartz crystal oscillator 190 comprises a quartz crystal oscillating circuit, a case 91 and a lid 92. In this embodiment, circuit elements constructing the oscillating circuit are housed in a quartz crystal unit comprising a contour mode quartz crystal resonator 90 or a thickness shear mode quartz crystal resonator 90, the case 91 and the lid 92. Also, the oscillating circuit of this embodiment comprises an amplifier 98 including a feedback resistor, the resonator 90, capacitors (not shown here) and a drain resistor (not shown here), and a CMOS inverter is used as the amplifier 98.

In addition, in this embodiment, the resonator 90 is mounted at a mounting portion 94 of the case 91 by conductive adhesives 96 or solder. As described above, the amplifier 98 is housed in the quartz crystal unit and mounted at the case 91. Also, the case 91 and the lid 92 are connected through a connecting member 93. For example, the contour mode resonator 90 of this embodiment is the same as one of the flexural mode, quartz crystal tuning fork resonators 10 and 45 described in detail in FIG. 4-FIG. 7. Also, instead of the flexural mode, quartz crystal tuning fork resonator and the thickness shear mode quartz crystal resonator, one of a length-extensional mode quartz crystal resonator, a width-extensional mode quartz crystal resonator and a Lame mode quartz crystal resonator which are a contour mode resonator, respectively, or a SAW (Surface Acoustic Wave) resonator, or a torsional mode quartz crystal resonator may be housed in the unit. In addition, the torsional mode resonator has a tuning fork shape with a tuning fork base having cut portions and tuning fork tines connected to the tuning fork base. The tuning fork tines vibrate in a torsional mode of an inverse. In addition, a length of each of the tuning fork tines is within a range of 0.6 mm to 2.1 mm, preferably, 0.65 mm to 1.85 mm, so that the torsional resonator capable of vibrating in a fundamental mode can be obtained with a frequency higher than 150 kHz and less than 750 kHz.

Likewise, in this embodiment, a piece of flexural mode, quartz crystal tuning fork resonator is housed in the unit, but the present invention also includes a quartz crystal unit having a plurality of flexural mode, quartz crystal tuning fork resonators, each of which has tuning fork tines and a tuning fork base, and at least two of the plurality of resonators are connected electrically in parallel. In addition, the at least two resonators may be an individual resonator or may be individual resonators that are formed integrally at each tuning fork base through a connecting portion. For example, the at least two resonators comprises two individual resonators, and the two individual resonators are formed so that one of the two individual resonators has a groove in at least one of upper and lower faces of the tuning fork tines, and the other has no groove in at least one of upper and lower faces of the tuning fork tines to get a different turn over temperature point each other. In addition, a shape and a dimension of the groove and the tuning fork tines may be changed to get the different turn over temperature point each other.

Next, a method for manufacturing a quartz crystal oscillator, which constructs an electronic apparatus of the present invention, is described in detail, according to the manufacturing steps.

Figure 11:
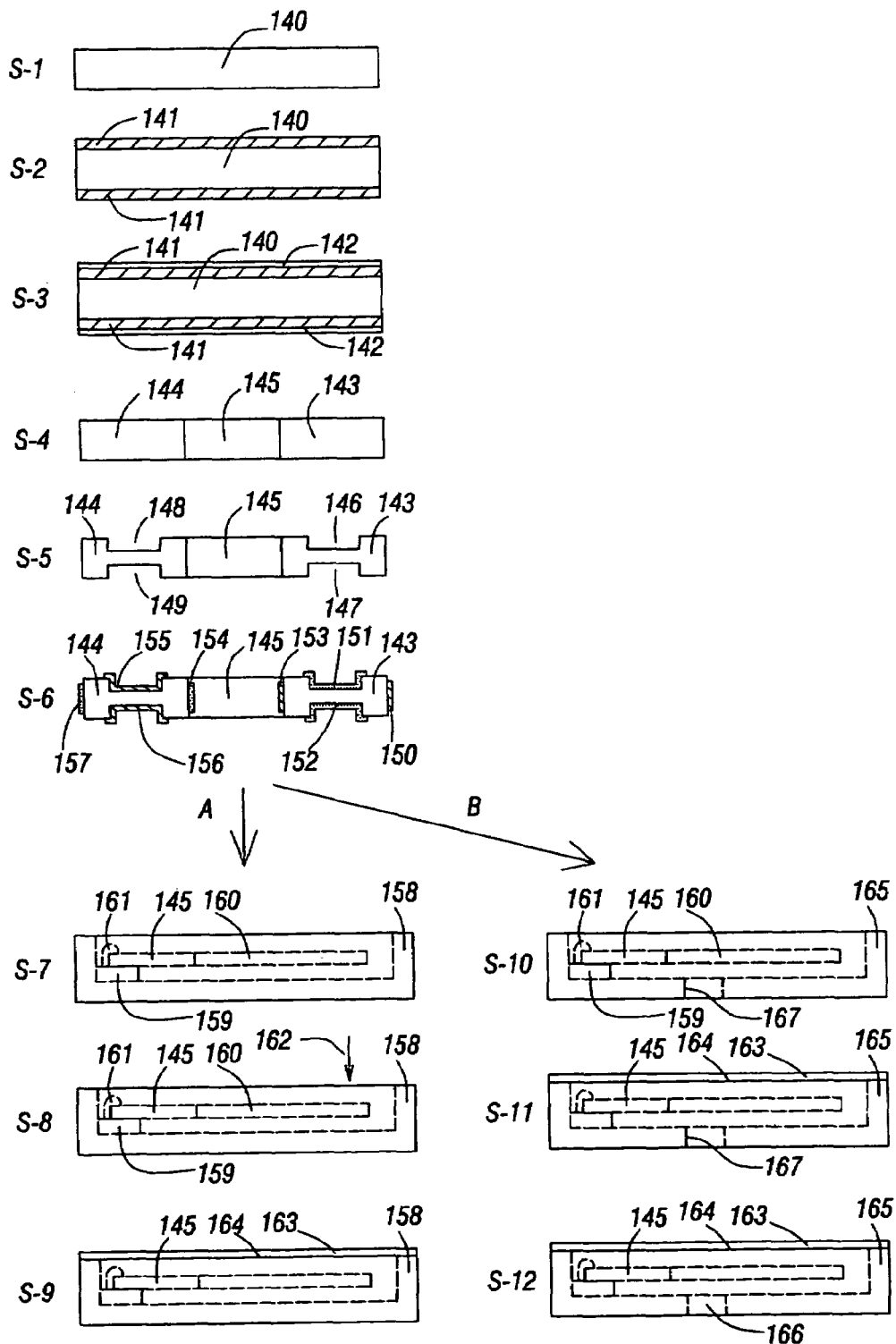
FIG. 11 shows a step diagram of a method for manufacturing a quartz crystal unit constructing a quartz crystal oscillator, which constructs an electronic apparatus of the present invention.
Figure 12:
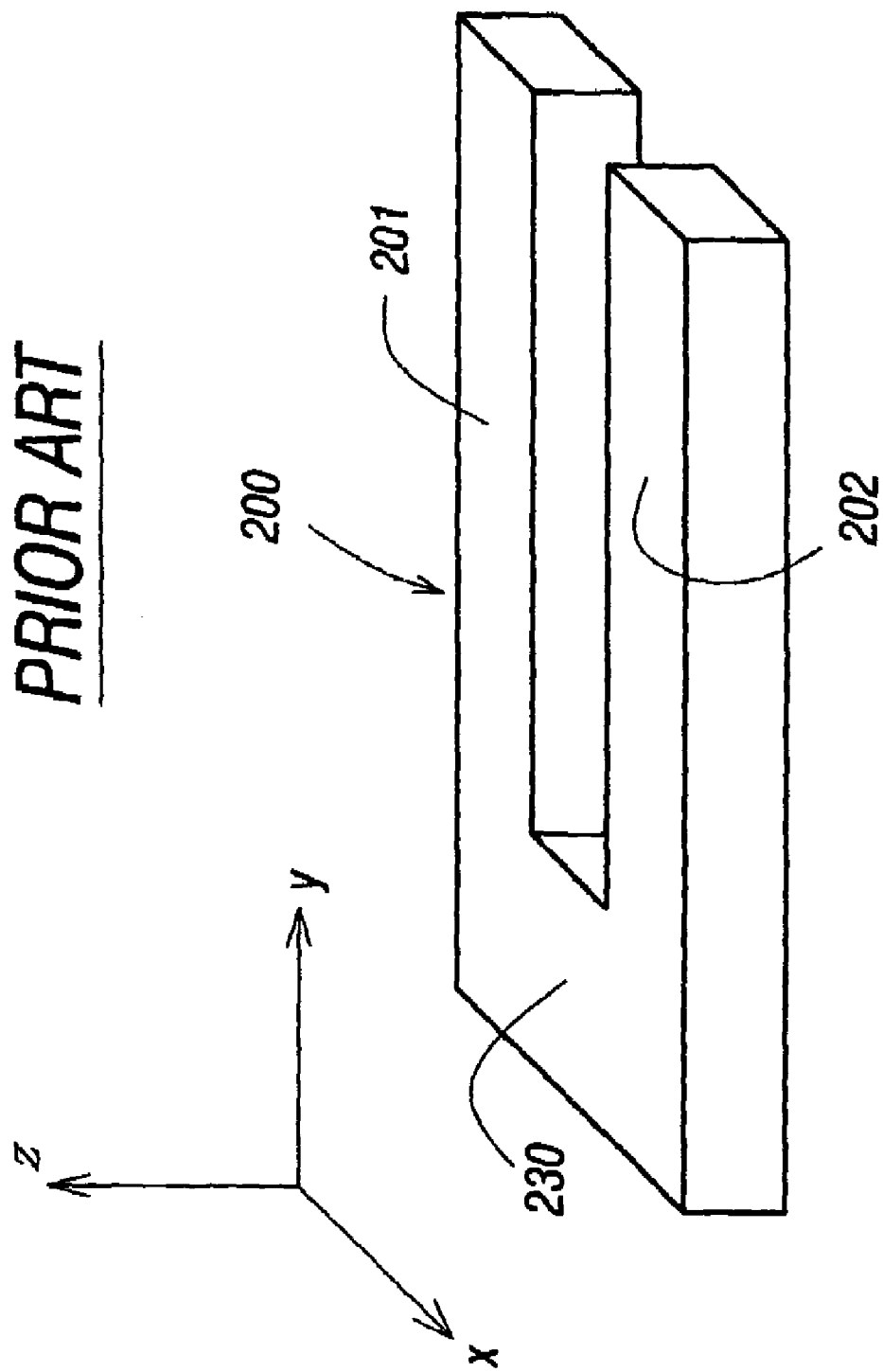
FIG. 12 is a general view of the conventional flexural mode, quartz crystal tuning fork resonator constructing a quartz crystal oscillator of the prior art, which constructs the conventional electronic apparatus.
Figure 13:
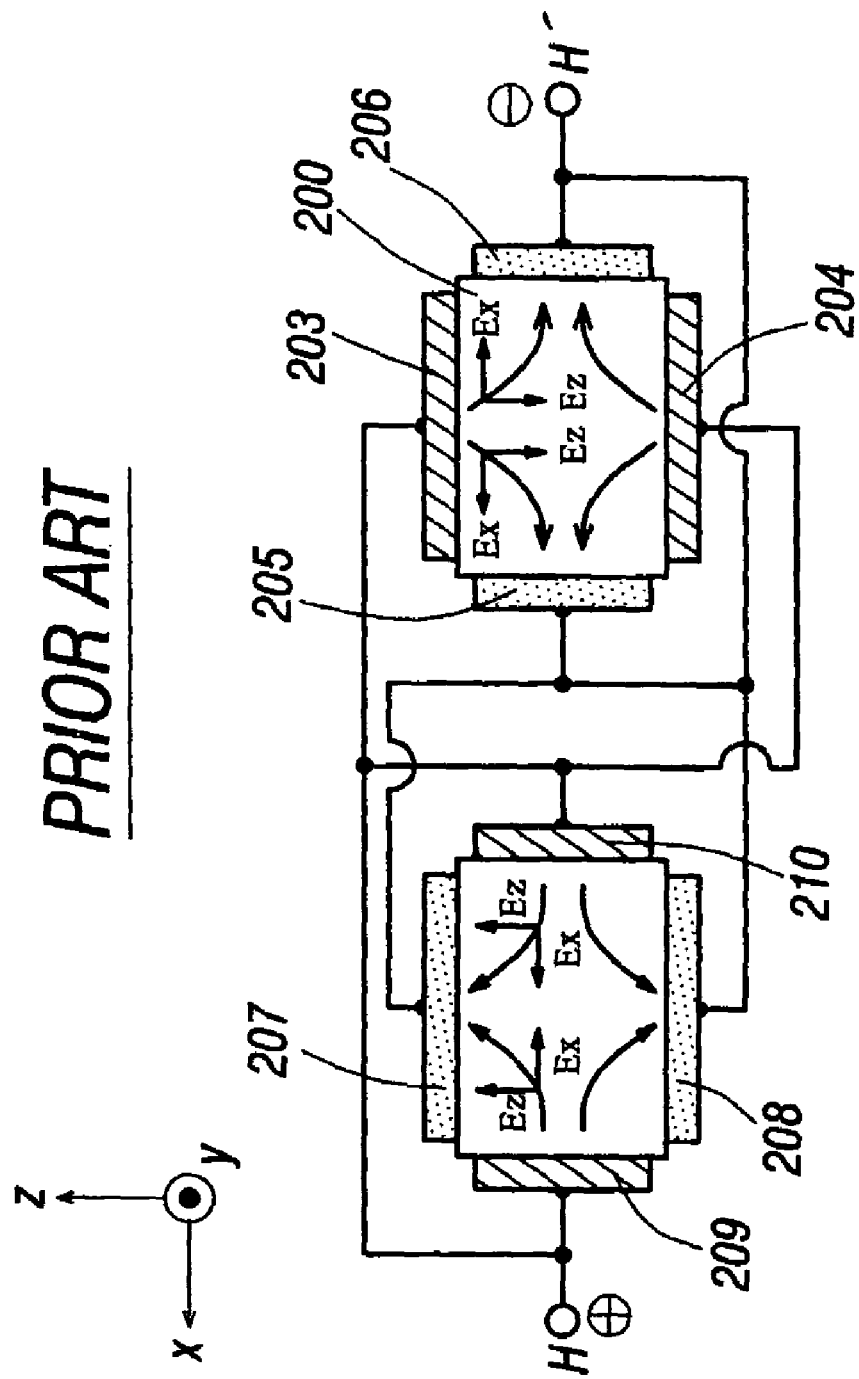
FIG. 13 is a cross-sectional view of the tuning fork tines of FIG. 12, and illustrating electrode construction.

FIG. 11 shows an embodiment of a method for manufacturing a quartz crystal oscillator, which constructs an electronic apparatus of the present invention and a step diagram embodying the present invention. The signs of S-1 to S-12 are the step numbers. First, S-1 shows a cross-sectional view of a quartz crystal wafer 140. Next, in S-2 a metal film 141, for example, chromium and gold on the chromium are, respectively, disposed on upper and lower faces of the quartz crystal wafer 140 by an evaporation method or a spattering method. In addition, a resist 142 is spread on said metal film 141 in S-3, and after the metal film 141 and the resist 142 are removed except those of tuning fork shape by a photo-lithographic process and an etching process, the tuning fork shape with tuning fork tines 143, 144 and a tuning fork base 145, as be shown in S-4, is integrally formed by a chemical etching process, namely, in a first etching process so that an oscillation frequency of a quartz crystal resonator of the tuning fork shape which is a first oscillation frequency, is in the range of 33.8 kHz to 40 kHz, preferably, 34.1 kHz to 38.7 kHz, more preferably, 34.1 kHz to 36.9 kHz. When the tuning fork shape is formed, cut portions may be formed at the tuning fork base. In other words, the tuning fork shape and the cut portions are formed simultaneously. In FIG. 11, the formation of a piece of tuning fork shape is shown, but, a number of tuning fork shapes are actually formed in a piece of quartz crystal wafer.

Similar to the steps of S-2 and S-3, a metal film and a resist are spread again on the tuning fork shape of S-4 and grooves 146, 147, 148 and 149 each of which has two stepped portions including a first stepped portion and a second stepped portion opposite the first stepped portion in the width direction along the length direction of the tuning fork tines, are formed at the tuning fork tines 143, 144 by the photo-lithographic process and the etching process, namely, in a second etching process different from the first etching process so that the oscillation frequency of the quartz crystal resonator of the tuning fork shape having the grooves which is a second (or first) oscillation frequency, is in the range of 32.78 kHz to 34.9 kHz, preferably, 32.78 kHz to 34.4 kHz, more preferably, 32.78 kHz to 33.85 kHz and a turn over temperature point (turning point) of the quartz crystal resonator thereof is in the range of 15° C. to 35° C., preferably, 18° C. to 30° C. to get a small frequency deviation in the vicinity of room temperature because the quartz crystal resonator of the tuning fork shape has a parabolic curve in frequency temperature behaviour, and the shape of S-5 is obtained after all of the resist and the metal film are removed. In order to obtain the small motional inductance $L_1$ of the fundamental mode vibration, it is needless to say that the grooves 146, 147, 148 and 149 have the depth $t_1$ and the depth $t_2$ larger than 0.021 mm, preferably, larger than 0.025 mm and less than 0.075 mm, more preferably, larger than 0.03 mm and less than 0.055 mm as above-described. In addition, a metal film and a resist are spread again on the shape of S-5 and electrodes which are of opposite electrical polarity, are disposed on sides of the tines and inside the grooves thereof, as be shown in S-6.

Namely, electrodes 150, 153 disposed on the sides of the tuning fork tine 143 and electrodes 155, 156 disposed inside the grooves 148, 149 of the tuning fork tine 144 have the same electrical polarity. Similarly, electrodes 151, 152 disposed inside the grooves 146, 147 of the tuning fork tine 143 and electrodes 154, 157 disposed on the sides of the tuning fork tine 144 have the same electrical polarity. Two electrode terminals are, therefore, constructed. In more detail, when an alternating current (AC) voltage is applied between the terminals, the tuning fork tines vibrate in a flexural mode of an inverse phase because said electrodes disposed on the stepped portions of the grooves and the electrodes disposed opposite to the said electrodes have opposite electrical polarity. In the step of S-6, a piece of quartz crystal tuning fork resonator, capable of vibrating in a flexural mode is shown in the quartz crystal wafer, but a number of quartz crystal tuning fork resonators are actually formed in the quartz crystal wafer. When the grooves are formed at the tuning fork tines, the oscillation frequency of the resonator of the tuning fork shape becomes lower than that of the resonator with no groove, and the quantity of a change of the oscillation frequency is dependent on a number of the grooves, a groove width, a groove length and a groove depth. In this embodiment, the oscillation frequency of the resonator of the tuning fork shape is adjusted in the quartz crystal wafer by forming a metal film on each of at least two of the upper and lower faces of each of the tuning fork tines so that the oscillation frequency which is a third (or second) oscillation frequency is lower than 32.73 kHz, preferably, less than 32.69 kHz, more preferably, greater than 31.6 kHz and less than 32.69 kHz and the metal film is formed after or before the step of S-6, namely, after or before the two electrode terminals are formed to drive the resonator of the tuning fork shape. In more detail, the metal film on each of at least two of the upper and lower faces of each of the tuning fork tines to adjust the oscillation frequency is formed after the tuning fork shape is formed (after the step of S-4) and before the grooves are formed (before the step of S-5) or is formed after the grooves are formed (after the step of S-5) and before the electrodes are disposed (before the step of S-6) or is formed after the electrodes are disposed (after the step of S-6) and before the resonator of the tuning fork shape is mounted on a mounting portion of a case (before the step of S-7 or S-8). Also, when the resonator of the tuning fork shape housed in a unit having a case and a lid has no groove at the tuning fork tines, an oscillation frequency of the resonator of the tuning fork shape formed in a quartz wafer by etching is in the range of 32.78 kHz to 34.9 kHz, preferably, 32.78 kHz to 34.4 kHz, more preferably, 32.78 kHz to 33.85 kHz. In addition, a metal film on each of at least two of the upper and lower faces of each of the tuning fork tines is formed to adjust the oscillation frequency of the resonator so that the oscillation frequency is lower than 32.73 kHz, preferably, less than 32.69 kHz, more preferably, greater than 31.6 kHz and less than 32.69 kHz, and the metal film is formed after or before the electrodes (two electrode terminals) are formed to drive the resonator of the tuning fork shape. In more detail, the metal film on each of at least two of the upper and lower faces of each of the tuning fork tines is formed after the tuning fork shape is formed and before the electrodes are disposed or is formed after the electrodes are disposed and before the tuning fork shape is mounted on a mounting portion of a case. According to the present invention, the metal film on each of at least two of the upper and lower faces of each of the tuning fork tines may be formed before the tuning fork shape is formed.

In addition, the oscillation frequency of the resonator of the tuning fork shape is adjusted to get a fourth (or third) oscillation frequency and a fifth (or fourth) oscillation frequency by separate steps of at least twice and a first adjustment of the oscillation frequency of the resonator is performed in the quartz crystal wafer to get the fourth (or third) oscillation frequency by a laser method or an evaporation method or an ion etching method so that a frequency deviation of the resonator is within a range of −9000 PPM to +5000 PPM (Parts Per Million), preferably, within a range of −9000 PPM to +100 PPM, more preferably, within a range of −2300 PPM to +100 PPM to a nominal frequency of 10 kHz to 200 kHz, e.g. 32.768 kHz. The first adjustment of the oscillation frequency by the laser method or the ion etching method is performed by trimming mass (e.g. the metal films) disposed on tuning fork tines and the first adjustment of the oscillation frequency by the evaporation method is performed by adding mass (e.g. a metal) on tuning fork tines. Namely, those methods can change the oscillation frequency of said resonator. Also, the resonators formed in the quartz crystal wafer are inspected therein and when there is a failure (damaged) resonator, it is removed from the wafer or something is marked on it or it is remembered by a computer.

In this embodiment, the tuning fork shape is formed from the step of S-3 and after that, the grooves are formed at the tuning fork tines, namely, the tuning fork tines are formed before the grooves are formed, but this invention is not limited to said embodiment, for example, the grooves are first formed from the step of S-3 and after that, the tuning fork shape may be formed, namely, the grooves are formed before the tuning fork tines are formed. Also, the tuning fork shape and the grooves may be formed simultaneously, namely, the tuning fork tines and the grooves are formed simultaneously. When the tuning fork tines and the grooves are formed simultaneously, for example, a portion between the tuning fork tines is first etched so that the portion has a groove and a thickness of the portion is less than seven tenths, preferably, one half of a thickness of the quartz crystal wafer to get a required oscillation frequency and a required turn over temperature point, and after that, both of the portion and the groove are formed simultaneously by etching the quartz crystal wafer. For example, when the thickness of the quartz crystal wafer is in the range of 0.07 mm to 0.12 mm, the thickness of the base portion is less than 0.05 mm, preferably, 0.035 mm, more preferably, 0.005 mm. Namely, the portion has the groove as deep as possible to get the required oscillation frequency and the required turn over temperature point. Moreover, when the tuning fork base has cut portions, the portion between the tuning fork tines and the cut portions are formed simultaneously. In addition, when the tuning fork base has a frame portion, the tuning fork shape and the frame portion are formed simultaneously. According to the present invention, when the tuning fork base has at least one of cut portions and a frame portion, the at least one is formed simultaneously with the tuning fork shape. Moreover, for example, when a groove having a plurality of stepped portions is formed in each of upper and lower faces of the tuning fork tines, the groove may be formed simultaneously with at least one of the cut portions and the frame portion. In addition, at least one of the cut portions may be formed in a step different from at least one of the steps of forming the tuning fork tines and forming the grooves at the tuning fork tines. Namely, the at least one of the cut portions is formed before or after at least one of the tuning fork tines and the grooves is formed. Similar to this, the frame portion may be formed in a step different from at least one of the steps of forming the tuning fork tines and forming the grooves at the tuning fork tines. Namely, the frame portion is formed before or after at least one of the tuning fork tines and the grooves is formed. In addition, at least one of the metal films on the upper and lower faces of each of the tuning fork tines to adjust the oscillation frequency of the resonator of the tuning fork shape may be formed before the step of forming the tuning fork tines. Also, the grooves are formed before the tuning fork tines are formed and after that, when the tuning fork tines are formed, the quartz crystal resonator of the tuning fork shape has an oscillation frequency in the range of 32.78 kHz to 34.9 kHz, preferably, 32.78 kHz to 34.4 kHz, more preferably, 32.78 kHz to 33.85 kHz and a turn over temperature point (turning point) of the quartz crystal resonator thereof is in the range of 15° C. to 35° C., preferably, 18° C. to 30° C. In addition, when the tuning fork tines and the grooves are formed simultaneously, the quartz crystal resonator of the tuning fork shape has an oscillation frequency in the range of 32.78 kHz to 34.9 kHz, preferably, 32.78 kHz to 34.4 kHz, more preferably, 32.78 kHz to 33.85 kHz and a turn over temperature point (turning point) of the quartz crystal resonator thereof is in the range of 15° C. to 35° C., preferably, 18° C. to 30° C.

There are two methods of A and B in the following step, as be shown by arrow signs. For the step of A, the tuning fork base 145 of the formed flexural mode, quartz crystal tuning fork resonator 160 is first mounted on a mounting portion 159 of a case 158 by conductive adhesives 161 or solder, as be shown in S-7. Next, a second adjustment of the oscillation frequency for the resonator 160 is performed to get the fifth (or fourth) oscillation frequency by a laser method 162 or an evaporation method or an ion etching method in S-8 so that a frequency deviation is within a range of −100 PPM to +100 PPM to the nominal frequency of 10 kHz to 200 kHz, e.g. 32.768 kHz. Finally, the case 158 and a lid 163 are connected via glass 164 with the low melting point or a metal in S-9. In this case, the connection of the case and the lid is performed in vacuum because the case 158 has no hole to close it in vacuum.

In addition, though it is not visible in FIG. 11, a third adjustment of the oscillation frequency may be performed by the laser method after the step of the connection of S-9 to get a small frequency deviation to the nominal frequency when a material of the lid is glass. As a result of which it is possible to get the resonator with the frequency deviation which is within a range of −50 PPM to +50 PPM to the nominal frequency of 10 kHz to 200 kHz, e.g. 32.768 kHz. Namely, the nominal frequency of the resonator capable of vibrating in a fundamental mode is less than 200 kHz. In this step, when the third adjustment of the oscillation frequency is performed, the oscillation frequency of the resonator is adjusted so that the frequency deviation of the resonator adjusted by the second adjustment of the oscillation frequency is within a range of −1500 PPM to +1500 PPM, preferably, −950 PPM to +950 PPM to the nominal frequency, e.g. 32.768 kHz.

For the step of B, the tuning fork base 145 of the formed resonator 160 is first mounted on a mounting portion 159 of a case 165 by conductive adhesives 161 or solder in S-10, in addition, in S-11 the case 165 and a lid 163 are connected by the same way as that of S-9, in more detail, after the resonator is mounted on the mounting portion of the case or after the resonator is mounted at the mounting portion, and the case and the lid are connected, the second adjustment of the oscillation frequency of the resonator is performed to get the fifth (or fourth) oscillation frequency so that a frequency deviation is generally within a range of −100 PPM to +100 PPM to a nominal frequency of 10 kHz to 200 kHz, e.g. 32.768 kHz in vacuum, but, it may be within a wider range, for example, −950 PPM to +950 PPM when the third adjustment of the oscillation frequency as will be shown as follows, is performed. Finally, a hole 167 constructed at the case 165 is closed in vacuum using such a metal 166 as solder or glass with the low melting point in S-12.

Also, similar to the step of A, the third adjustment of the oscillation frequency may be performed by the laser method after the step of S-12 to get a small frequency deviation to the nominal frequency. As a result of which it is possible to get the resonator with the frequency deviation which is within a range of −50 PPM to +50 PPM to the nominal frequency, e.g. 32.768 kHz. Thus, the frequency deviation of each of the resonators in the case of the steps of A and B is finally within a range of −100 PPM to +100 PPM at most. Also, the second adjustment of the oscillation frequency may be performed after the case and the lid are connected and the hole is closed in vacuum. In addition, the hole is constructed at the case, but may be constructed at the lid. Also, the adjustment of the oscillation frequency of the present invention is performed in vacuum or inert gas such as nitrogen gas or atmosphere, and the values described above are values in vacuum. Furthermore, the oscillation frequency of the quartz crystal resonator of the tuning fork shape comprises the first, second, third, fourth and fifth (or the first, second, third and fourth) oscillation frequencies different each other.

Therefore, the flexural mode, quartz crystal tuning fork resonators and the quartz crystal units manufactured by the above-described method are miniaturized and realized with a small series resistance $R_1$, a high quality factor $Q_1$ and low price.

Moreover, in the above-described embodiment, though the first frequency adjustment of the resonators is performed in the quartz crystal wafer and at the same time, when there is a failure resonator, something is marked on it or it is removed from the quartz crystal wafer, but the present invention is not limited to this, namely, the present invention may include the step to inspect the flexural mode, quartz crystal tuning fork resonators formed in the quartz crystal wafer therein, in other words, the step to inspect whether there is a failure resonator or not in the quartz crystal wafer. When there is a failure resonator in the wafer, something is marked on it or it is removed from the wafer or it is remembered by a computer. By including the step, it can increase the yield because it is possible to find out the failure resonator in an early step and the failure resonator does not go to the next step. As a result of which low priced flexural mode, quartz crystal tuning fork resonators can be provided with excellent electrical characteristics.

In this embodiment, the frequency adjustment is performed three times in separate steps, but may be performed at least twice in separate steps. For example, the third adjustment of the oscillation frequency may be omitted. In addition, in order to construct a quartz crystal oscillator, two electrode terminals of the resonators are connected electrically to an amplifier, capacitors and resistors. In other words, a quartz crystal oscillating circuit is constructed and connected electrically so that an amplification circuit comprises a CMOS inverter and a feedback resistor and a feedback circuit comprises a flexural mode, quartz crystal tuning fork resonator, a drain resistor, a capacitor of a gate side and a capacitor of a drain side. Also, the third adjustment of the oscillation frequency may be performed after the quartz crystal oscillating circuit is constructed in a quartz crystal unit.

Likewise, the flexural mode quartz crystal resonator of the tuning fork type has two tuning fork tines in the present embodiments, but embodiments of the present invention include tuning fork tines more than two. In addition, the quartz crystal tuning fork resonators of the present embodiments are housed in a package (unit) of a surface mounting type comprising a case and a lid, but may be housed in a package of a tubular type.

In addition, for the tuning fork resonators constructing the quartz crystal oscillators of the first embodiment to the fourth embodiment of the present invention, the resonators are provided so that a capacitance ratio $r_1$ of a fundamental mode vibration gets smaller than a capacitance ratio $r_2$ of a second overtone mode vibration, in order to obtain a frequency change of the fundamental mode vibration larger than that of the second overtone mode vibration, versus the same change of a value of load capacitance $C_L$. Namely, a variable range of a frequency of the fundamental mode vibration gets wider than that of the second overtone mode vibration.

In more detail, for example, when $C_L=18$ pF and the $C_L$ changes in 1 pF, the frequency change of the fundamental mode vibration becomes larger than that of the second overtone mode vibration because the capacitance ratio $r_1$ is smaller than the capacitance ratio $r_2$. Therefore, there is a remarkable effect for the fundamental mode vibration, such that the resonators can be provided with the frequency variable in the wide range, even when the value of load capacitance $C_L$ changes slightly. Accordingly, when a variation of the same frequency is required, the number of capacitors which are used in the quartz crystal oscillators decreases because the frequency change versus load capacitance 1 pF becomes large, as compared with that of the second overtone mode vibration. As a result, the low priced oscillators can be provided.

Moreover, capacitance ratios $r_1$ and $r_2$ of a flexural mode, quartz crystal tuning fork resonator are given by $r_1=C_0/C_1$ and $r_2=C_0/C_2$, respectively, where $C_0$ is shunt capacitance in an electrical equivalent circuit of the resonator, and $C_1$ and $C_2$ are, respectively, a motional capacitance of a fundamental mode vibration and a second overtone mode vibration in the electrical equivalent circuit of the resonator. Namely, the relationship of $r_1$ less than $r_2$ implies that the motional capacitance $C_1$ of the fundamental mode of vibration is greater than the motional capacitance $C_2$ of the second overtone mode of vibration. In addition, the flexural mode, quartz crystal tuning fork resonator has a quality factor $Q_1$ for the fundamental mode vibration and a quality factor $Q_2$ for the second overtone mode vibration.

In detail, the tuning fork resonator of this embodiment is provided so that the influence on resonance frequency of the fundamental mode vibration by the shunt capacitance becomes smaller than that of the second overtone mode vibration by the shunt capacitance, namely, so that it satisfies a relationship of $S_1=r_1/2Q_1^2<S_2=r_2/2Q_2^2$, preferably, $S_1<S_2/2$. As a result, the tuning fork resonator, capable of vibrating in the fundamental mode and having a high frequency stability can be provided because the influence on the resonance frequency of the fundamental mode vibration by the shunt capacitance becomes so extremely small as it can be ignored. Also, the present invention replaces $r_1/2Q_1^2$ with $S_1$ and $r_2/2Q_2^2$ with $S_2$, respectively, and here, $S_1$ and $S_2$ are called "a stable factor of frequency" of the fundamental mode vibration and the second overtone mode vibration.

In addition, when a power source is applied to the quartz crystal oscillating circuit, at least one oscillation which satisfies an amplitude condition and a phase condition of vibration starts in the circuit, and a spent time to get to about ninety percent of the steady amplitude of the vibration is called "rise time". Namely, the shorter the rise time becomes, the easier the oscillation becomes. When rise time $t_{r1}$ of the fundamental mode vibration and rise time $t_{r2}$ of the second overtone mode vibration in the circuit are taken, $t_{r1}$ and $t_{r2}$ are given by $t_{r1}=kQ_1/(\omega_1(-1+|-RL_1|/R_1))$ and $t_{r2}=kQ_2/(\omega_2(-1+|-RL_2|/R_2))$, respectively, where k is constant and $\omega_1$ and $\omega_2$ are an angular frequency for the fundamental mode vibration and the second overtone mode vibration, respectively. In addition, $t_{r1}$ and $t_{r2}$ can be expressed so that $t_{r1}=kL_1/(|-RL_1|-R_1)$ and $t_{r2}=kL_2/(|-RL_2|-R_2)$ using the relationships of $Q_1/\omega_1=L_1/R_1$ and $Q_2/\omega_2=L_2/R_2$, where $L_1$ and $L_2$ show a motional inductance of the fundamental mode vibration and the second overtone mode vibration, respectively, in the electrical equivalent circuit of the resonator. Also, when first rise time $Tr_1$ and second rise time $Tr_2$ are, respectively, defined by $Tr_1=L_1/(|-RL_1|-R_1)$ and $Tr_2=L_2/(|-RL_2|-R_2)$, $t_{r1}$ and $t_{r2}$ are, respectively, given by $t_{r1}=kTr_1$ and $t_{r2}=kTr_2$.

From the above-described relation, it is possible to obtain the rise time $t_{r1}$ of the fundamental mode vibration less than the rise time $t_{r2}$ of the second overtone mode vibration. As a result, the tuning fork resonator can vibrate in the fundamental mode very easily in the oscillating circuit because the rise time $t_{r1}$ of the fundamental mode vibration becomes shorter than the rise time $t_{r2}$ of the second overtone mode vibration. Also, it is needless to say that the first rise time $Tr_1$ is less than the second rise time $Tr_2$ from the relation of the rise time $t_{r1}$ less than the rise time $t_{r2}$. As an example, when resonance (oscillation) frequency of a flexural mode, quartz crystal tuning fork resonator is about 32.768 kHz for a fundamental mode vibration and the resonator has a value of $W_2/W=0.5$, $t_1/t=0.34$ and $l_1/l=0.48$, though there is a distribution in production, as an example, the resonator has a value of $Q_1=62,000$ and $Q_2=192,000$, respectively. In this embodiment, $Q_2$ has a value of about three times of $Q_1$. Accordingly, to obtain the $t_{r1}$ less than the $t_{r2}$, it is necessary to satisfy a relationship of $|-RL_1|/R_1>2|-RL_2|/R_2-1$ by using a relation of $\omega_2=6\omega_1$ approximately. Also, according to this invention, the relationship is not limited to the quartz crystal oscillating circuit comprising the resonator in this embodiment, but this invention also includes all quartz crystal oscillating circuits to satisfy the relationship. By constructing the oscillating circuit like this, a quartz crystal oscillator with the flexural mode, quartz crystal tuning fork resonator can be provided with a short rise time. In other words, an output signal of the oscillator has an oscillation frequency of the fundamental mode vibration of the resonator and is outputted through a buffer circuit. Namely, the second overtone mode vibration can be suppressed in the oscillating circuit. In this embodiment, the resonator has also a value of $r_1=320$ and $r_2=10,600$ as an example. According to this invention, $r_1$ has a value of 210 to 520. In addition, the capacitance ratios $r_1$ and $r_2$ can be rewritten so that $r_1=C_0\omega_1^2L_1$ and $r_2=C_0\omega_2^2L_2$ using the motional inductance $L_1$ of the fundamental mode vibration and the motional inductance $L_2$ of the second overtone mode vibration. Therefore, a ratio $(L_1/L_2)$ of the motional inductance $L_1$ of the fundamental mode vibration and the motional inductance $L_2$ of the second overtone mode vibration is less than 36 approximately from the relations of $r_1$ less than $r_2$ and $\omega_2=6\omega_1$ approximately. Also, the ratio $(L_1/L_2)$ is less than $6((Q_1/Q_2)$ from the relation of $R_1<R_2$, preferably, less than $5.16((Q_1/Q_2)$ from the relation of $R_1<0.86R_2$ because $R_1$ and $R_2$ are defined by $R_1=\omega_1L_1/Q_1$ and $R_2=\omega_2L_2/Q_2$, respectively. In addition, $r_2$ is greater than 1,500, preferably, 2,000.

The above-described quartz crystal resonators are formed by at least one method of chemical, mechanical and physical methods. The mechanical method, for example, uses a particle such as GC#1000 and the physical method, for example, uses atom or molecule. Therefore, these methods are called "a particle method" here. In addition, the present invention is not limited to the resonators described above, but includes such a piezoelectric resonator for sensing pressure as a flexural mode, tuning fork resonator, a torsional mode resonator, a thickness shear mode resonator, SAW resonator and so on. In detail, there is a relationship between the pressure and an oscillation frequency of the resonators or a series resistance $R_1$ thereof. In more detail, the higher the pressure becomes, the lower the oscillation frequency becomes or the higher the series resistance $R_1$ becomes. Namely, since the oscillation frequency of the resonators or the series resistance thereof changes by a change of the pressure, the pressure is measured from the relationship.

Thus, the electronic apparatus of this invention comprising a display portion and a quartz crystal oscillator at least may operate normally because the quartz crystal oscillator comprises the quartz crystal oscillating circuit with a high frequency stability, namely, a high frequency reliability.

As described above, it will be easily understood that the electronic apparatus comprising the quartz crystal oscillator comprising the quartz crystal oscillating circuit having the flexural mode, quartz crystal tuning fork resonator with novel shapes, the novel electrode construction and excellent electrical characteristics, according to the present invention, may have the outstanding effects. Similar to this, it will be easily understood that the electronic apparatus comprising the quartz crystal oscillator comprising the quartz crystal oscillating circuit having the length-extensional mode quartz crystal resonator with the novel cutting angle and the novel shape, according to the present invention, may have also the outstanding effect. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

1. A method for manufacturing a quartz crystal unit, comprising the steps of:
    providing a quartz crystal wafer;
    providing a case having an interior space and a lid;
    forming a quartz crystal tuning fork resonator having an overall length capable of vibrating in a flexural mode of an inverse phase by etching the quartz crystal wafer to form a quartz crystal tuning fork base, first and second quartz crystal tuning fork tines connected to the quartz crystal tuning fork base, each of the first and second quartz crystal tuning fork tines having opposite main surfaces and opposite side surfaces, and at least one groove having a length formed in at least one of the opposite main surfaces of each of the first and second quartz crystal tuning fork tines, the quartz crystal tuning fork resonator having a fundamental mode of vibration and a second overtone mode of vibration;
    determining the length of the at least one groove formed in the at least one of the opposite main surfaces of each of the first and second quartz crystal tuning fork tines and the overall length of the quartz crystal tuning fork resonator so that a series resistance $R_1$ of the fundamental mode of vibration of the quartz crystal tuning fork resonator is less than a series resistance $R_2$ of the second overtone mode of vibration thereof;
    disposing an electrode on at least one of the opposite side surfaces of each of the first and second quartz crystal tuning fork tines so that the electrode disposed on the at least one of the opposite side surfaces of the first quartz crystal tuning fork tine has an electrical polarity opposite to an electrical polarity of the electrode disposed on the at least one of the opposite side surfaces of the second quartz crystal tuning fork tine;
    housing the quartz crystal tuning fork resonator in the interior space of the case; and
    connecting the lid to the case after the housing step.

2. A method according to claim 1; wherein the opposite main surfaces have a first main surface and a second main surface and the opposite side surfaces have an inner side surface and an outer side surface, the inner side surface of the first quartz crystal tuning fork tine confronting the inner side surface of the second quartz crystal tuning fork tine; wherein the quartz crystal wafer has a first surface and a second surface opposite the first surface; wherein the case has a mounting portion in the interior space; and further comprising the steps of disposing at least one first metal film on each of the first and second surfaces of the quartz crystal wafer; disposing a first resist on the at least one first metal film disposed on each of the first and second surfaces of the quartz crystal wafer; removing the first resist on the at least one first metal film disposed on each of the first and second surfaces of the quartz crystal wafer and the at least one first metal film on each of the first and second surfaces of the quartz crystal wafer to form a pattern of a tuning fork shape on each of the first and second surfaces of the quartz crystal wafer; forming the quartz crystal tuning fork base, and the first and second quartz crystal tuning fork tines in a first etching process; forming at least one groove in at least one of the first and second main surfaces of each of the first and second quartz crystal tuning fork tines in a second etching process different from the first etching process so that a width $W_2$ of the at least one groove formed in the at least one of the first and second main surfaces of each of the first and second quartz crystal tuning fork tines is greater than a distance $W_1$ in the width direction of the at least one groove measured from a first outer edge of the at least one groove to a first outer edge of the corresponding one of the first and second quartz crystal tuning fork tines and a distance $W_2$ in the width direction of the at least one groove measured from a second outer edge opposite the first outer edge of the at least one groove to a second outer edge opposite the first outer edge of the corresponding one of the first and second quartz crystal tuning fork tines; disposing at least one second metal film on each of the first and second main surfaces and the inner and outer side surfaces of each of the first and second quartz crystal tuning fork tines, and a surface of the at least one groove formed in the at least one of the first and second main surfaces of each of the first and second quartz crystal tuning fork tines; disposing a second resist on the at least one second metal film disposed on each of the first and second main surfaces and the inner and outer side surfaces of each of the first and second quartz crystal tuning fork tines, and the surface of the at least one groove formed in the at least one of the first and second main surfaces of each of the first and second quartz crystal tuning fork tines; forming a first electrode on the surface of the at least one groove formed in the at least one of the first and second main surfaces of each of the first and second quartz crystal tuning fork tines and a second electrode on each of the inner and outer side surfaces of each of the first and second quartz crystal tuning fork tines so that the first electrode formed on the surface of the at least one groove formed in the at least one of the first and second main surfaces of the first quartz crystal tuning fork tine is connected to the second electrode formed on each of the inner and outer side surfaces of the second quartz crystal tuning fork tine, and the first electrode formed on the surface of the at least one groove formed in the at least one of the first and second main surfaces of the second quartz crystal tuning fork tine is connected to the second electrode formed on each of the inner and outer side surfaces of the first quartz crystal tuning fork tine; removing the second resist on the at least one second metal film disposed on each of the first and second main surfaces of each of the first and second quartz crystal tuning fork tines; mounting the quartz crystal tuning fork resonator on the mounting portion in the interior space of the case; adjusting an oscillation frequency of the quartz crystal tuning fork resonator; and connecting the lid to the case after the mounting step.

3. A method according to claim 2; wherein the forming step of the at least one groove includes the step of forming a groove having a first stepped portion and a second stepped portion opposite the first stepped portion in the width direction, and a third stepped portion connecting the first stepped portion to the second stepped portion in each of the first and second main surfaces of each of the first and second quartz crystal tuning fork tines in the second etching process different from the first etching process; and further comprising the sequential steps of forming the quartz crystal tuning fork base, and the first and second quartz crystal tuning fork tines in the first etching process; and forming the groove having the first, second and third stepped portions in each of the first and second main surfaces of each of the first and second quartz crystal tuning fork tines in the second etching process different from the first etching process so that a width of the groove formed in each of the first and second main surfaces of each of the first and second quartz crystal tuning fork tines is greater than a distance in the width direction of the groove measured from an outer edge of the groove to an outer edge of the corresponding one of the first and second quartz crystal tuning fork tines.

4. A method according to claim 3; wherein the step of forming the quartz crystal tuning fork base, and the first and second quartz crystal tuning fork tines includes the steps of forming in the quartz crystal wafer having a thickness in the range of 0.05 mm to 0.18 mm a quartz crystal tuning fork shape having the quartz crystal tuning fork base, and the first and second quartz crystal tuning fork tines in the first etching process and forming the quartz crystal tuning fork base having a first base portion including a first width $W_5$ and a second base portion including a second width $W_6$ and a length $l_4$ greater than 0.03 mm and less than 0.48 mm so that two cut portions are formed between the first and second base portions of the quartz crystal tuning fork base, each of the first and second quartz crystal tuning fork tines being connected to the first base portion of the quartz crystal tuning fork base; and wherein the step of forming the groove having the first, second and third stepped portions so that the width of the groove is greater than the distance includes the step of forming the groove having the first, second and third stepped portions in each of the first and second main surfaces of each of the first and second quartz crystal tuning fork tines in the second etching process different from the first etching process so that a spaced-apart distance between the first and second quartz crystal tuning fork tines is greater than the width of the groove formed in each of the first and second main surfaces of each of the first and second quartz crystal tuning fork tines and is within a range of 0.05 mm to 0.35 mm, and the width $W_2$ of the groove formed in each of the first and second main surfaces of each of the first and second quartz crystal tuning fork tines is within a range of 0.03 mm to 0.12 mm and a length of the groove formed in each of the first and second main surfaces of each of the first and second quartz crystal tuning fork tines is within a range of 0.32 mm to 1.1 mm.

5. A method according to claim 2; wherein the step of forming the quartz crystal tuning fork base, and the first and second quartz crystal tuning fork tines is performed before the step of forming the at least one groove in the at least one of the first and second main surfaces of each of the first and second quartz crystal tuning fork tines; wherein the forming step of the at least one groove includes the steps of forming a groove in each of the first and second main surfaces of each of the first and second quartz crystal tuning fork tines in the second etching process different from the first etching process so that a depth of the groove formed in each of the first and second main surfaces of each of the first and second quartz crystal tuning fork tines is greater than 0.025 mm and the oscillation frequency of the quartz crystal tuning fork resonator is in the range of 32.78 kHz to 34.9 kHz; and further comprising the steps of forming a metal film on at least one of the first and second main surfaces of each of the first and second quartz crystal tuning fork tines after the forming step of the first and second electrodes and before the mounting step so that the oscillation frequency of the quartz crystal tuning fork resonator is lower than 32.73 kHz; and adjusting the oscillation frequency of the quartz crystal tuning fork resonator after the mounting step so that the oscillation frequency of the quartz crystal tuning fork resonator is about 32.768 kHz with a frequency deviation within a range of −100 ppm to +100 ppm.

6. A method according to claim 2; further comprising the sequential steps of removing the first resist on the at least one first metal film disposed on each of the first and second surfaces of the quartz crystal wafer and the at least one first metal film on each of the first and second surfaces of the quartz crystal wafer to form the pattern of the tuning fork shape having a tuning fork base, and first and second tuning fork tines each not having a through-hole on each of the first and second surfaces of the quartz crystal wafer; forming the first and second quartz crystal tuning fork tines each not having a through-hole; and forming a groove having a first side surface opposite the inner side surface and a second side surface opposite the outer side surface, and a third side surface connecting the first side surface to the second side surface in each of the first and second main surfaces of each of the first and second quartz crystal tuning fork tines so that a width of the groove formed in each of the first and second main surfaces of each of the first and second quartz crystal tuning fork tines is greater than a distance in the width direction of the groove measured from an outer edge of the groove to an outer edge of the corresponding one of the first and second quartz crystal tuning fork tines; wherein the case has an open end; and further comprising the steps of removing the first resist on the at least one first metal film disposed on each of the first and second surfaces of the quartz crystal wafer before the disposing step of the at least one second metal film; removing the second resist on the at least one second metal film disposed on each of the first and second main surfaces of each of the first and second quartz crystal tuning fork tines before the mounting step; and connecting the lid to the case to cover the open end thereof after the mounting step.

7. A method according to claim 6; further comprising the step of forming the quartz crystal tuning fork base having a first base portion including a first width $W_5$ and a second base portion including a second width $W_6$ greater than or equal to the first width $W_5$, and a length $l_4$ greater than 0.03 mm and less than 0.48 mm so that two cut portions are formed between the first and second base portions of the quartz crystal tuning fork base, each of the first and second quartz crystal tuning fork tines being connected to the first base portion of the quartz crystal tuning fork base.

8. A method according to claim 2; wherein the quartz crystal tuning fork resonator has a parabolic curve in frequency-temperature behavior; and further comprising the sequential steps of forming the at least one groove in each of the first and second main surfaces of each of the first and second quartz crystal tuning fork tines in the second etching process different from the first etching process so that the oscillation frequency of the quartz crystal tuning fork resonator has a first oscillation frequency and the quartz crystal tuning fork resonator has a turning point in the frequency-temperature behavior; forming a metal film on at least one of the first and second main surfaces of each of the first and second quartz crystal tuning fork tines after the forming step of the first and second electrodes and before the mounting step so that the oscillation frequency of the quartz crystal tuning fork resonator has a second oscillation frequency; trimming the metal film formed on the at least one of the first and second main surfaces of each of the first and second quartz crystal tuning fork tines before the mounting step so that the oscillation frequency of the quartz crystal tuning fork resonator has a third oscillation frequency; and trimming the metal film formed on the at least one of the first and second main surfaces of each of the first and second quartz crystal tuning fork tines after the mounting step so that the oscillation frequency of the quartz crystal tuning fork resonator has a fourth oscillation frequency.

9. A method according to claim 8; wherein the forming step of the at least one groove includes the step of forming the at least one groove in each of the first and second main surfaces of each of the first and second quartz crystal tuning fork tines in the second etching process different from the first etching process so that a depth of the at least one groove formed in each of the first and second main surfaces of each of the first and second quartz crystal tuning fork tines is greater than 0.025 mm; wherein the first oscillation frequency is in the range of 32.78 kHz to 34.9 kHz; wherein the turning point of the quartz crystal tuning fork resonator is in the range of 15° C. to 35° C.; wherein the second oscillation frequency is lower than 32.73 kHz; wherein the third oscillation frequency is about 32.768 kHz with a frequency deviation within a range of −9000 ppm to +100 ppm; and wherein the fourth oscillation frequency is about 32.768 kHz with a frequency deviation within a range of −100 ppm to +100 ppm.

10. A method according to claim 1; wherein the opposite main surfaces have a first main surface and a second main surface and the opposite side surfaces have an inner side surface and an outer side surface, the inner side surface of the first quartz crystal tuning fork tine confronting the inner side surface of the second quartz crystal tuning fork tine; wherein the quartz crystal wafer has a first surface and a second surface opposite the first surface; wherein the case has a mounting portion in the interior space; and further comprising the sequential steps of disposing at least one first metal film on each of the first and second surfaces of the quartz crystal wafer; disposing a first resist on the at least one first metal film disposed on each of the first and second surfaces of the quartz crystal wafer; removing the first resist on the at least one first metal film disposed on each of the first and second surfaces of the quartz crystal wafer and the at least one first metal film on each of the first and second surfaces of the quartz crystal wafer to form a pattern of a tuning fork shape on each of the first and second surfaces of the quartz crystal wafer; forming in the quartz crystal wafer the quartz crystal tuning fork base, and the first and second quartz crystal tuning fork tines; forming at least one groove having a first side surface opposite the inner side surface and a second side surface opposite the outer side surface, and a third side surface connecting the first side surface to the second side surface in each of the first and second main surfaces of each of the first and second quartz crystal tuning fork tines so that a width of the at least one groove formed in each of the first and second main surfaces of each of the first and second quartz crystal tuning fork tines is greater than a distance in the width direction of the at least one groove measured from an outer edge of the at least one groove to an outer edge of the corresponding one of the first and second quartz crystal tuning fork tines; disposing at least one second metal film on each of the first and second main surfaces and the inner and outer side surfaces of each of the first and second quartz crystal tuning fork tines, and each of the first and second side surfaces of the at least one groove formed in each of the first and second main surfaces of each of the first and second quartz crystal tuning fork tines; disposing a second resist on the at least one second metal film disposed on each of the first and second main surfaces and the inner and outer side surfaces of each of the first and second quartz crystal tuning fork tines, and each of the first and second side surfaces of the at least one groove formed in each of the first and second main surfaces of each of the first and second quartz crystal tuning fork tines; forming a first electrode on each of the first and second side surfaces of the at least one groove formed in each of the first and second main surfaces of each of the first and second quartz crystal tuning fork tines and a second electrode on each of the inner and outer side surfaces of each of the first and second quartz crystal tuning fork tines so that the first electrode formed on each of the first and second side surfaces of the at least one groove formed in each of the first and second main surfaces of the first quartz crystal tuning fork tine is connected to the second electrode formed on each of the inner and outer side surfaces of the second quartz crystal tuning fork tine, and the first electrode formed on each of the first and second side surfaces of the at least one groove formed in each of the first and second main surfaces of the second quartz crystal tuning fork tine is connected to the second electrode formed on each of the inner and outer side surfaces of the first quartz crystal tuning fork tine; mounting the quartz crystal tuning fork resonator on the mounting portion in the interior space of the case; and connecting the lid to the case after the mounting step.

11. A method according to claim 10; wherein the quartz crystal tuning fork resonator has an oscillation frequency; and further comprising the step of forming the at least one groove in each of the first and second main surfaces of each of the first and second quartz crystal tuning fork tines so that a depth of the at least one groove formed in each of the first and second main surfaces of each of the first and second quartz crystal tuning fork tines is greater than 0.025 mm and the oscillation frequency of the quartz crystal tuning fork resonator is in the range of 32.78 kHz to 34.9 kHz.

12. A method according to claim 10; wherein the quartz crystal tuning fork resonator has an oscillation frequency; and further comprising the step of forming a metal film on at least one of the first and second main surfaces of each of the first and second quartz crystal tuning fork tines after the forming step of the first and second electrodes and before the mounting step so that the oscillation frequency of the quartz crystal tuning fork resonator is lower than 32.73 kHz.

13. A method according to claim 10; wherein the quartz crystal tuning fork resonator has an oscillation frequency; wherein the case has a through-hole; and further comprising the steps of removing the second resists disposed on the second metal films before the mounting step; disposing a metal or a glass into the through-hole of the case to close the through-hole in a vacuum; and adjusting in a vacuum the oscillation frequency of the quartz crystal tuning fork resonator after the connecting step of the lid and the case and before the disposing step of the metal or the glass.

14. A method according to claim 10; wherein the quartz crystal tuning fork resonator has an oscillation frequency; wherein the case has a through-hole; and further comprising the steps of removing the second resists disposed on the second metal films before the mounting step; disposing a metal or a glass into the through-hole of the case to close the through-hole in a vacuum after the connecting step of the lid and the case; and adjusting the oscillation frequency of the quartz crystal tuning fork resonator after the disposing step of the metal or the glass so that the oscillation frequency is about 32.768 kHz with a frequency deviation within a range of −50 ppm to +50 ppm.

15. A method according to claim 10; wherein the quartz crystal tuning fork resonator has an oscillation frequency; wherein the case has no through-hole and an open end; wherein the connecting step of the lid and the case includes the step of connecting the lid to the case to cover the open end of the case in a vacuum; and further comprising the steps of removing the second resists disposed on the second metal films before the mounting step; adjusting the oscillation frequency of the quartz crystal tuning fork resonator after the mounting step and before the connecting step of the lid and the case so that the oscillation frequency of the quartz crystal tuning fork resonator is about 32.768 kHz with a frequency deviation within a range of −100 ppm to +100 ppm.

16. A method according to claim 10; further comprising the steps of forming the at least one groove in each of the first and second main surfaces of each of the first and second quartz crystal tuning fork tines so that a spaced-apart distance between the first and second quartz crystal tuning fork tines is greater than the width of the at least one groove formed in each of the first and second main surfaces of each of the first and second quartz crystal tuning fork tines and is within a range of 0.05 mm to 0.35 mm, and the width of the at least one groove formed in each of the first and second main surfaces of each of the first and second quartz crystal tuning fork tines is within a range of 0.03 mm to 0.12 mm; and forming the quartz crystal tuning fork base having a first base portion including a first width $W_5$ and a second base portion including a second width $W_6$ greater than or equal to the first width $W_5$ and a length $l_4$ greater than 0.03 mm and less than 0.48 mm so that two cut portions are formed between the first and second base portions of the quartz crystal tuning fork base, each of the first and second quartz crystal tuning fork tines being connected to the first base portion of the quartz crystal tuning fork base.

17. A method according to claim 10; wherein the quartz crystal tuning fork resonator has an oscillation frequency; and further comprising the steps of forming a metal film on at least one of the first and second main surfaces of each of the first and second quartz crystal tuning fork tines after the forming step of the first and second electrodes and before the mounting step so that the oscillation frequency of the quartz crystal tuning fork resonator has a first oscillation frequency; adjusting the oscillation frequency of the quartz crystal tuning fork resonator by trimming the metal film formed on the at least one of the first and second main surfaces of each of the first and second quartz crystal tuning fork tines before the mounting step so that the oscillation frequency of the quartz crystal tuning fork resonator has a second oscillation frequency; and adjusting the oscillation frequency of the quartz crystal tuning fork resonator after the mounting step so that the oscillation frequency of the quartz crystal tuning fork resonator has a third oscillation frequency.

18. A method according to claim 17; wherein the first oscillation frequency is lower than 32.73 kHz; wherein the second oscillation frequency is about 32.768 kHz with a frequency deviation within a range of −9000 ppm to +100 ppm; and wherein the third oscillation frequency is about 32.768 kHz with a frequency deviation within a range of −100 ppm to +100 ppm.

19. A method according to claim 10; wherein the forming step of the at least one groove includes the step of forming a plurality of grooves divided in the length direction in at least one of the first and second main surfaces of each of the first and second quartz crystal tuning fork tines in the second etching process different from the first etching process so that a spaced-apart distance between the first and second quartz crystal tuning fork tines is greater than a width of at least one of the grooves formed in the at least one of the first and second main surfaces of each of the first and second quartz crystal tuning fork tines and the width of the at least one of the grooves formed in the at least one of the first and second main surfaces of each of the first and second quartz crystal tuning fork tines is within a range of 0.03 mm to 0.12 mm.

20. A method according to claim 10; wherein the quartz crystal tuning fork resonator has an oscillation frequency and a parabolic curve in frequency-temperature behaviour; and further comprising the steps of forming the at least one groove in each of the first and second main surfaces of each of the first and second quartz crystal tuning fork tines so that the oscillation frequency of the quartz crystal tuning fork resonator has a first oscillation frequency and the quartz crystal tuning fork resonator has a turning point; forming a metal film on at least one of the first and second main surfaces of each of the first and second quartz crystal tuning fork tines after the forming step of the first and second electrodes and before the mounting step so that the oscillation frequency of the quartz crystal tuning fork resonator has a second oscillation frequency; adjusting the oscillation frequency of the quartz crystal tuning fork resonator by trimming the metal film formed on the at least one of the first and second main surfaces of each of the first and second quartz crystal tuning fork tines before the mounting step so that the oscillation frequency of the quartz crystal tuning fork resonator has a third oscillation frequency; and adjusting the oscillation frequency of the quartz crystal tuning fork resonator after the mounting step so that the oscillation frequency of the quartz crystal tuning fork resonator has a fourth oscillation frequency.

21. A method according to claim 20; wherein the first oscillation frequency is in the range of 32.78 kHz to 34.9 kHz and the turning point is in the range of 15° C. to 35° C.; wherein the second oscillation frequency is lower than 32.73 kHz; wherein the third oscillation frequency is about 32.768 kHz with a frequency deviation within a range of −9000 ppm to +100 ppm; and wherein the fourth oscillation frequency is about 32.768 kHz with a frequency deviation within a range of −100 ppm to +100 ppm.

22. A method according to claim 10; further comprising the step of forming the quartz crystal tuning fork base having a length $l_2$, and a first base portion including a first width $W_5$ and a second base portion including a second width $W_6$ and a length $l_4$ so that two cut portions are formed between the first and second base portions of the quartz crystal tuning fork base and the length $l_4$ is less than or equal to a length $l_5$, the length $l_5$ being defined by $l_5=l_2-l_4$; wherein each of the first and second quartz crystal tuning fork tines is connected to the first base portion of the quartz crystal tuning fork base; wherein the second base portion of the quartz crystal tuning fork base has a first side surface and a second side surface opposite the first side surface; wherein a first frame portion protrudes from the first side surface of the second base portion of the quartz crystal tuning fork base and a second frame portion protrudes from the second side surface of the second base portion of the quartz crystal tuning fork base, each of the first and second frame portions extending in a common direction with the first and second quartz crystal tuning fork tines outside the first and second quartz crystal tuning fork tines; and wherein the length $l_4$ is greater than 0.03 mm and less than 0.48 mm.

23. A method according to claim 1; wherein the disposing step of the electrode includes the step of disposing an electrode on a surface of the at least one groove formed in the at least one of the opposite main surfaces of each of the first and second quartz crystal tuning fork tines so that the electrode disposed on the surface of the at least one groove formed in the at least one of the opposite main surfaces of the first quartz crystal tuning fork tine has an electrical polarity opposite to an electrical polarity of the electrode disposed on the surface of the at least one groove formed in the at least one of the opposite main surfaces of the second quartz crystal tuning fork tine; wherein the quartz crystal tuning fork resonator has a piezoelectric constant $e'_{12}$ to drive the quartz crystal tuning fork resonator; wherein the quartz crystal wafer has a cutting angle; and further comprising the step of determining the cutting angle of the quartz crystal wafer, a dimension of the at least one groove formed in the at least one of the opposite main surfaces of each of the first and second quartz crystal tuning fork tines, and a dimension of the electrode disposed on the surface of the at least one groove formed in the at least one of the opposite main surfaces of each of the first and second quartz crystal tuning fork tines so that the piezoelectric constant $e'_{12}$ of the quartz crystal tuning fork resonator is within a range of 0.12 C/m$^2$ to 0.19 C/m$^2$ in the absolute value.

24. A method according to claim 1; wherein the quartz crystal tuning fork resonator has a merit value $M_1$ of the fundamental mode of vibration and a merit value $M_2$ of the second overtone mode of vibration, the merit value $M_1$ being defined by the ratio $(Q_1/r_1)$ and the merit value $M_2$ being defined by the ratio $(Q_2/r_2)$, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator; wherein the opposite main surfaces have a first main surface and a second main surface; and further comprising the steps of forming a quartz crystal tuning fork shape having the quartz crystal tuning fork base, and the first and second quartz crystal tuning fork tines; forming a groove in each of the first and second main surfaces of each of the first and second quartz crystal tuning fork tines; forming an electrode on a surface of the groove formed in each of the first and second main surfaces of each of the first and second quartz crystal tuning fork tines so that the electrode formed on the surface of the groove formed in each of the first and second main surfaces of the first quartz crystal tuning fork tine has an electrical polarity opposite to an electrical polarity of the electrode formed on the surface of the groove formed in each of the first and second main surfaces of the second quartz crystal tuning fork tine, each of the quartz crystal tuning fork shape, the groove formed in each of the first and second main surfaces of each of the first and second quartz crystal tuning fork tines and the electrode formed on the surface of the groove formed in each of the first and second main surfaces of each of the first and second quartz crystal tuning fork tines having a dimension; and determining the dimension of each of the quartz crystal tuning fork shape, the groove formed in each of the first and second main surfaces of each of the first and second quartz crystal tuning fork tines and the electrode formed on the surface of the groove formed in each of the first and second main surfaces of each of the first and second quartz crystal tuning fork tines so that the merit value $M_1$ of the fundamental mode of vibration of the quartz crystal tuning fork resonator is greater than the merit value $M_2$ of the second overtone mode of vibration thereof.

25. A method according to claim 1; wherein the opposite main surfaces have a first main surface and a second main surface and the opposite side surfaces have an inner side surface and an outer side surface, the inner side surface of the first quartz crystal tuning fork tine confronting the inner side surface of the second quartz crystal tuning fork tine; wherein the quartz crystal wafer has a first surface and a second surface opposite the first surface; wherein the case has a mounting portion in the interior space; and further comprising the sequential steps of disposing at least one first metal film on each of the first and second surfaces of the quartz crystal wafer; disposing a first resist on the at least one first metal film disposed on each of the first and second surfaces of the quartz crystal wafer; removing the first resist on the at least one first metal film disposed on each of the first and second surfaces of the quartz crystal wafer and the at least one first metal film on each of the first and second surfaces of the quartz crystal wafer to form a pattern of a tuning fork shape on each of the first and second surfaces of the quartz crystal wafer; forming simultaneously in the quartz crystal wafer the quartz crystal tuning fork base and the first and second quartz crystal tuning fork tines, and at least one groove in each of the first and second main surfaces of each of the first and second quartz crystal tuning fork tines; disposing at least one second metal film on each of the first and second main surfaces and the inner and outer side surfaces of each of the first and second quartz crystal tuning fork tines, and a surface of the at least one groove formed in each of the first and second main surfaces of each of the first and second quartz crystal tuning fork tines; disposing a second resist on the at least one second metal film disposed on each of the first and second main surfaces and the inner and outer side surfaces of each of the first and second quartz crystal tuning fork tines, and the surface of the at least one groove formed in each of the first and second main surfaces of each of the first and second quartz crystal tuning fork tines; forming a first electrode on the surface of the at least one groove formed in each of the first and second main surfaces of each of the first and second quartz crystal tuning fork tines and a second electrode on each of the inner and outer side surfaces of each of the first and second quartz crystal tuning fork tines so that the first electrode formed on the surface of the at least one groove formed in each of the first and second main surfaces of the first quartz crystal tuning fork tine is connected to the second electrode formed on each of the inner and outer side surfaces of the second quartz crystal tuning fork tine, and the first electrode formed on the surface of the at least one groove formed in each of the first and second main surfaces of the second quartz crystal tuning fork tine is connected to the second electrode formed on each of the inner and outer side surfaces of the first quartz crystal tuning fork tine; mounting the quartz crystal tuning fork resonator on the mounting portion in the interior space of the case; and connecting the lid to the case after the mounting step.

26. A method for manufacturing an electronic apparatus, comprising manufacturing a quartz crystal unit according to claim 1; and mounting the quartz crystal unit in an electronic apparatus to drive an element of the electronic apparatus.

27. A method according to claim 26; wherein the opposite main surfaces have a first main surface and a second main surface and the opposite side surfaces have an inner side surface and an outer side surface, the inner side surface of the first quartz crystal tuning fork tine confronting the inner side surface of the second quartz crystal tuning fork tine; wherein the quartz crystal wafer has a first surface and a second surface opposite the first surface; wherein the case has a mounting portion in the interior space; wherein the step of manufacturing the quartz crystal unit includes the sequential steps of disposing at least one first metal film on each of the first and second surfaces of the quartz crystal wafer; disposing a first resist on the at least one first metal film disposed on each of the first and second surfaces of the quartz crystal wafer; removing the first resist on the at least one first metal film disposed on each of the first and second surfaces of the quartz crystal wafer and the at least one first metal film on each of the first and second surfaces of the quartz crystal wafer to form a pattern of a tuning fork shape on each of the first and second surfaces of the quartz crystal wafer; forming in the quartz crystal wafer the quartz crystal tuning fork base, and the first and second quartz crystal tuning fork tines; forming a groove in each of the first and second main surfaces of each of the first and second quartz crystal tuning fork tines so that a width of the groove formed in each of the first and second main surfaces of each of the first and second quartz crystal tuning fork tines is greater than a distance in the width direction of the groove measured from an outer edge of the groove to an outer edge of the corresponding one of the first and second quartz crystal tuning fork tines; disposing at least one second metal film on each of the first and second main surfaces and the inner and outer side surfaces of each of the first and second quartz crystal tuning fork tines, and a surface of the groove formed in each of the first and second main surfaces of each of the first and second quartz crystal tuning fork tines; disposing a second resist on the at least one second metal film disposed on each of the first and second main surfaces and the inner and outer side surfaces of each of the first and second quartz crystal tuning fork tines, and the surface of the groove formed in each of the first and second main surfaces of each of the first and second quartz crystal tuning fork tines; forming a first electrode on the surface of the groove formed in each of the first and second main surfaces of each of the first and second quartz crystal tuning fork tines and a second electrode on each of the inner and outer side surfaces of each of the first and second quartz crystal tuning fork tines so that the first electrode formed on the surface of the groove formed in each of the first and second main surfaces of the first quartz crystal tuning fork tine is connected to the second electrode formed on each of the inner and outer side surfaces of the second quartz crystal tuning fork tine, and the first electrode formed on the surface of the groove formed in each of the first and second main surfaces of the second quartz crystal tuning fork tine is connected to the second electrode formed on each of the inner and outer side surfaces of the first quartz crystal tuning fork tine; removing the second resist on the at least one second metal film disposed on each of the first and second main surfaces and the inner and outer side surfaces of each of the first and second quartz crystal tuning fork tines, and the surface of the groove formed in each of the first and second main surfaces of each of the first and second quartz crystal tuning fork tines; mounting the quartz crystal tuning fork resonator on the mounting portion in the interior space of the case; and connecting the lid to the case after the mounting step.

28. A method according to claim 27; wherein the quartz crystal tuning fork resonator has an oscillation frequency; and wherein the step of manufacturing the quartz crystal unit includes the steps of forming in the quartz crystal wafer having a thickness in the range of 0.05 mm to 0.18 mm the quartz crystal tuning fork base, and the first and second quartz crystal tuning fork tines; forming the groove in each of the first and second main surfaces of each of the first and second quartz crystal tuning fork tines so that a spaced-apart distance between the first and second quartz crystal tuning fork tines is greater than the width of the groove formed in each of the first and second main surfaces of each of the first and second quartz crystal tuning fork tines and is within a range of 0.05 mm to 0.35 mm, and the width of the groove formed in each of the first and second main surfaces of each of the first and second quartz crystal tuning fork tines is within a range of 0.03 mm to 0.12 mm; adjusting the oscillation frequency of the quartz crystal tuning fork resonator after the first and second electrodes and before the mounting step so that the oscillation frequency of the quartz crystal tuning fork resonator is about 32.768 kHz with a frequency deviation within a range of −9000 ppm to +5000 ppm and adjusting the oscillation frequency of the quartz crystal tuning fork resonator after the mounting step so that the oscillation frequency of the quartz crystal tuning fork resonator is about 32.768 kHz with a frequency deviation within a range of −100 ppm to +100 ppm.

29. A method according to claim 26; wherein the electronic apparatus has a display portion and a CPU; and further comprising the steps of providing a first quartz crystal oscillator comprised of a first quartz crystal oscillating circuit and a second quartz crystal oscillator comprised of a second quartz crystal oscillating circuit, each of the first and second quartz crystal oscillating circuits having an amplifier, at least one resistor, and a plurality of capacitors; and arranging the first and second quartz crystal oscillators in the electronic apparatus having the display portion and the CPU so that the first quartz crystal oscillating circuit comprises the quartz crystal unit having the quartz crystal tuning fork resonator electrically connected to the amplifier, the capacitors and the at least one resistor, and an output signal of the first quartz crystal oscillating circuit is a clock signal for use in operation of the electronic apparatus to display time information at the display portion of the electronic apparatus; and so that the second quartz crystal oscillating circuit comprises a length-extensional mode quartz crystal resonator or a thickness shear mode quartz crystal resonator, and an output signal of the second quartz crystal oscillating circuit is a clock signal for use in operation of the electronic apparatus to operate the CPU of the electronic apparatus; wherein the quartz crystal tuning fork resonator has a merit value $M_1$ of the fundamental mode of vibration and a merit value $M_2$ of the second overtone mode of vibration, the merit value $M_1$ being defined by the ratio $(Q_1/r_1)$ and the merit value $M_2$ being defined by the ratio $(Q_2/r_2)$, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator; wherein the opposite main surfaces have a first main surface and a second main surface; and wherein the step of manufacturing the quartz crystal unit includes the steps of forming a quartz crystal tuning fork shape having the quartz crystal tuning fork base, and the first and second quartz crystal tuning fork tines; forming a groove in at least one of the first and second main surfaces of each of the first and second quartz crystal tuning fork tines; forming an electrode on a surface of the groove formed in the at least one of the first and second main surfaces of each of the first and second quartz crystal tuning fork tines so that the electrode formed on the surface of the groove formed in the at least one of the first and second main surfaces of the first quartz crystal tuning fork tine has an electrical polarity opposite to an electrical polarity of the electrode formed on the surface of the groove formed in the at least one of the first and second main surfaces of the second quartz crystal tuning fork tine, each of the quartz crystal tuning fork shape, the groove formed in the at least one of the first and second main surfaces of each of the first and second quartz crystal tuning fork tines and the electrode formed on the surface of the groove formed in the at least one of the first and second main surfaces of each of the first and second quartz crystal tuning fork tines having a dimension; and determining the dimension of each of the quartz crystal tuning fork shape, the groove formed in the at least one of the first and second main surfaces of each of the first and second quartz crystal tuning fork tines and the electrode formed on the surface of the groove formed in the at least one of the first and second main surfaces of each of the first and second quartz crystal tuning fork tines so that the merit value $M_1$ of the fundamental mode of vibration of the quartz crystal tuning fork resonator is greater than the merit value $M_2$ of the second overtone mode of vibration thereof and the merit value $M_2$ of the second overtone mode of vibration is less than 30.

30. A method according to claim 29; wherein the forming step of the quartz crystal tuning fork shape is performed before the forming step of the groove; and further comprising the step of forming the quartz crystal tuning fork base having a first base portion including a first width $W_5$ and a second base portion including a second width $W_6$ greater than or equal to the first width $W_5$, and a length $l_4$ greater than 0.03 mm and less than 0.48 mm so that two cut portions are formed between the first and second base portions of the quartz crystal tuning fork base, each of the first and second quartz crystal tuning fork tines being connected to the first base portion of the quartz crystal tuning fork base; wherein the quartz crystal tuning fork resonator has an oscillation frequency; and further comprising the step of forming the groove in the at least one of the first and second main surfaces of each of the first and second quartz crystal tuning fork tines so that a depth of the groove formed in the at least one of the first and second main surfaces of each of the first and second quartz crystal tuning fork tines is in the range of 0.025 mm to 0.075 mm and the oscillation frequency of the quartz crystal tuning fork resonator is in the range of 32.78 kHz to 34.9 kHz.

31. A method according to claim 26; wherein the electronic apparatus has a display portion and a CPU; and further comprising the steps of providing a first quartz crystal oscillator comprised of a first quartz crystal oscillating circuit and a second quartz crystal oscillator comprised of a second quartz crystal oscillating circuit, each of the first and second quartz crystal oscillating circuits having an amplifier, at least one resistor, and a plurality of capacitors; and arranging the first and second quartz crystal oscillators in the electronic apparatus having the display portion and the CPU so that the first quartz crystal oscillating circuit comprises the quartz crystal unit having the quartz crystal tuning fork resonator electrically connected to the amplifier, the capacitors and the at least one resistor, and an output signal of the first quartz crystal oscillating circuit is a clock signal for use in operation of the electronic apparatus to display time information at the display portion of the electronic apparatus; and so that the second quartz crystal oscillating circuit comprises a length-extensional mode quartz crystal resonator or a thickness shear mode quartz crystal resonator, and an output signal of the second quartz crystal oscillating circuit is a clock signal for use in operation of the electronic apparatus to operate the CPU of the electronic apparatus; wherein the quartz crystal tuning fork resonator has a capacitance ratio $r_1$ of the fundamental mode of vibration and a capacitance ratio $r_2$ of the second overtone mode of vibration, wherein the opposite main surfaces have a first main surface and a second main surface; wherein the case has a mounting portion in the interior space and an open end; and wherein the step of manufacturing the quartz crystal unit includes the steps of forming a quartz crystal tuning fork shape having the quartz crystal tuning fork base, and the first and second quartz crystal tuning fork tines; forming a groove in each of the first and second main surfaces of each of the first and second quartz crystal tuning fork tines; forming an electrode on a surface of the groove formed in each of the first and second main surfaces of each of the first and second quartz crystal tuning fork tines so that the electrode formed on the surface of the groove formed in each of the first and second main surfaces of the first quartz crystal tuning fork tine has an electrical polarity opposite to an electrical polarity of the electrode formed on the surface of the groove formed in each of the first and second main surfaces of the second quartz crystal tuning fork tine; mounting the quartz crystal tuning fork resonator on the mounting portion in the interior space of the case; connecting the lid to the case to cover the open end of the case, each of the quartz crystal tuning fork shape, the groove formed in each of the first and second main surfaces of each of the first and second quartz crystal tuning fork tines and the electrode formed on the surface of the groove formed in each of the first and second main surfaces of each of the first and second quartz crystal tuning fork tines having a dimension; and determining the dimension of each of the quartz crystal tuning fork shape, the groove formed in each of the first and second main surfaces of each of the first and second quartz crystal tuning fork tines and the electrode formed on the surface of the groove formed in each of the first and second main surfaces of each of the first and second quartz crystal tuning fork tines so that the capacitance ratio $r_1$ of the fundamental mode of vibration of the quartz crystal tuning fork resonator is less than the capacitance ratio $r_2$ of the second overtone mode of vibration thereof and the capacitance ratio $r_2$ of the second overtone mode of vibration is greater than 1500.

32. A method according to claim 31; wherein the quartz crystal tuning fork resonator has an oscillation frequency; and further comprising the steps of forming the groove in each of the first and second main surfaces of each of the first and second quartz crystal tuning fork tines so that a depth of the groove formed in each of the first and second main surfaces of each of the first and second quartz crystal tuning fork tines is in the range of 0.03 mm to 0.055 mm and the oscillation frequency of the quartz crystal tuning fork resonator is in the range of 32.78 kHz to 34.9 kHz; forming a metal film on at least one of the first and second main surfaces of each of the first and second quartz crystal tuning fork tines after the forming step of the electrode and before the mounting step so that the oscillation frequency of the quartz crystal tuning fork resonator is lower than 32.73 kHz; and adjusting the oscillation frequency of the quartz crystal tuning fork resonator so that the oscillation frequency of the quartz crystal tuning fork resonator is about 32.768 kHz with a frequency deviation within a range of −100 ppm to +100 ppm by trimming the metal film formed on the at least one of the first and second main surfaces of each of the first and second quartz crystal tuning fork tines after the mounting step.

33. A quartz crystal unit manufactured according to the method of claim 1.

34. A unit according to claim 33; wherein the quartz crystal tuning fork resonator has a merit value $M_1$ of the fundamental mode of vibration and a merit value $M_2$ of the second overtone mode of vibration, the merit value $M_1$ being defined by the ratio $(Q_1/r_1)$ and the merit value $M_2$ being defined by the ratio $(Q_2/r_2)$, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator; wherein the opposite main surfaces have a first main surface and a second main surface; wherein a quartz crystal tuning fork shape has the quartz crystal tuning fork base, and the first and second quartz crystal tuning fork tines and a groove is formed in each of the first and second main surfaces of each of the first and second quartz crystal tuning fork tines; wherein an electrode is formed on a surface of the groove formed in each of the first and second main surfaces of each of the first and second quartz crystal tuning fork tines so that the electrode formed on the surface of the groove formed in each of the first and second main surfaces of the first quartz crystal tuning fork tine has an electrical polarity opposite to an electrical polarity of the electrode formed on the surface of the groove formed in each of the first and second main surfaces of the second quartz crystal tuning fork tine, each of the quartz crystal tuning fork shape, the groove formed in each of the first and second main surfaces of each of the first and second quartz crystal tuning fork tines and the electrode formed on the surface of the groove formed in each of the first and second main surfaces of each of the first and second quartz crystal tuning fork tines having a dimension; and wherein the dimension of each of the quartz crystal tuning fork shape, the groove formed in each of the first and second main surfaces of each of the first and second quartz crystal tuning fork tines and the electrode formed on the surface of the groove formed in each of the first and second main surfaces of each of the first and second quartz crystal tuning fork tines is determined so that the merit value $M_1$ of the fundamental mode of vibration of the quartz crystal tuning fork resonator is greater than the merit value $M_2$ of the second overtone mode of vibration thereof.

35. A unit according to claim 34; wherein the quartz crystal wafer has a thickness in the range of 0.05 mm to 0.18 mm; wherein a spaced-apart distance $W_4$ between the first and second quartz crystal tuning fork tines is greater than a width $W_2$ of the groove formed in each of the first and second main surfaces of each of the first and second quartz crystal tuning fork tines and is within a range of 0.05 mm to 0.35 mm, and the width $W_2$ of the groove formed in each of the first and second main surfaces of each of the first and second quartz crystal tuning fork tines is within a range of 0.03 mm to 0.12 mm and a length of the groove formed in each of the first and second main surfaces of each of the first and second quartz crystal tuning fork tines is within a range of 0.32 mm to 1.1 mm; and wherein the quartz crystal tuning fork base has a first base portion including a first width $W_5$ and a second base portion including a second width $W_6$ greater than or equal to the first width $W_5$, and a length $l_4$ greater than 0.03 mm and less than 0.48 mm so that two cut portions are formed between the first and second base portions of the quartz crystal tuning fork base, each of the first and second quartz crystal tuning fork tines being connected to the first base portion of the quartz crystal tuning fork base.

* * * * *